(12) United States Patent
Sakakura et al.

(10) Patent No.: US 7,781,768 B2
(45) Date of Patent: Aug. 24, 2010

(54) DISPLAY DEVICE, METHOD FOR MANUFACTURING THE SAME, AND ELECTRONIC DEVICE HAVING THE SAME

(75) Inventors: Masayuki Sakakura, Kanagawa (JP); Hiroyuki Miyake, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 55 days.

(21) Appl. No.: 11/819,154

(22) Filed: Jun. 25, 2007

(65) Prior Publication Data

US 2008/0001156 A1 Jan. 3, 2008

(30) Foreign Application Priority Data

Jun. 29, 2006 (JP) .............................. 2006-179165

(51) Int. Cl.
*H01L 33/00* (2006.01)
(52) U.S. Cl. .............................. 257/59; 257/72; 257/88; 257/369; 257/E33.001; 257/E33.053
(58) Field of Classification Search .................. 257/59, 257/72, 88, 369, E33.001, E33.053
See application file for complete search history.

(56) References Cited

U.S. PATENT DOCUMENTS

| 6,255,705 | B1 * | 7/2001 | Zhang et al. ................. 257/412 |
| 6,337,235 | B1 | 1/2002 | Miyanaga et al. |
| 6,433,841 | B1 * | 8/2002 | Murade et al. ................. 349/43 |
| 6,468,844 | B1 * | 10/2002 | Yamazaki et al. ........... 438/156 |
| 6,740,938 | B2 | 5/2004 | Tsunoda et al. |
| 6,777,254 | B1 * | 8/2004 | Yamazaki et al. ............. 438/30 |
| 2009/0179205 | A1 * | 7/2009 | Fujimoto et al. .............. 257/72 |

* cited by examiner

*Primary Examiner*—Victor A Mandala
(74) *Attorney, Agent, or Firm*—Nixon Peabody LLP; Jeffrey L. Costellia

(57) ABSTRACT

In a case where a p-channel thin film transistor is used as a thin film transistor that is electrically connected to a light-emitting element and drives the light-emitting element, a value of cutoff current of the p-channel thin film transistor is made lower than that of a p-channel thin film transistor of a driver circuit. Specifically, channel doping is selectively performed on a semiconductor layer of a thin film transistor included in a pixel.

8 Claims, 29 Drawing Sheets

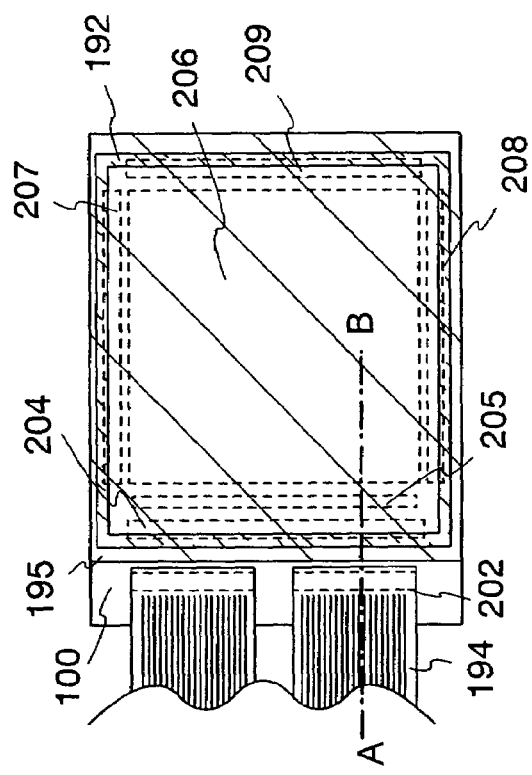
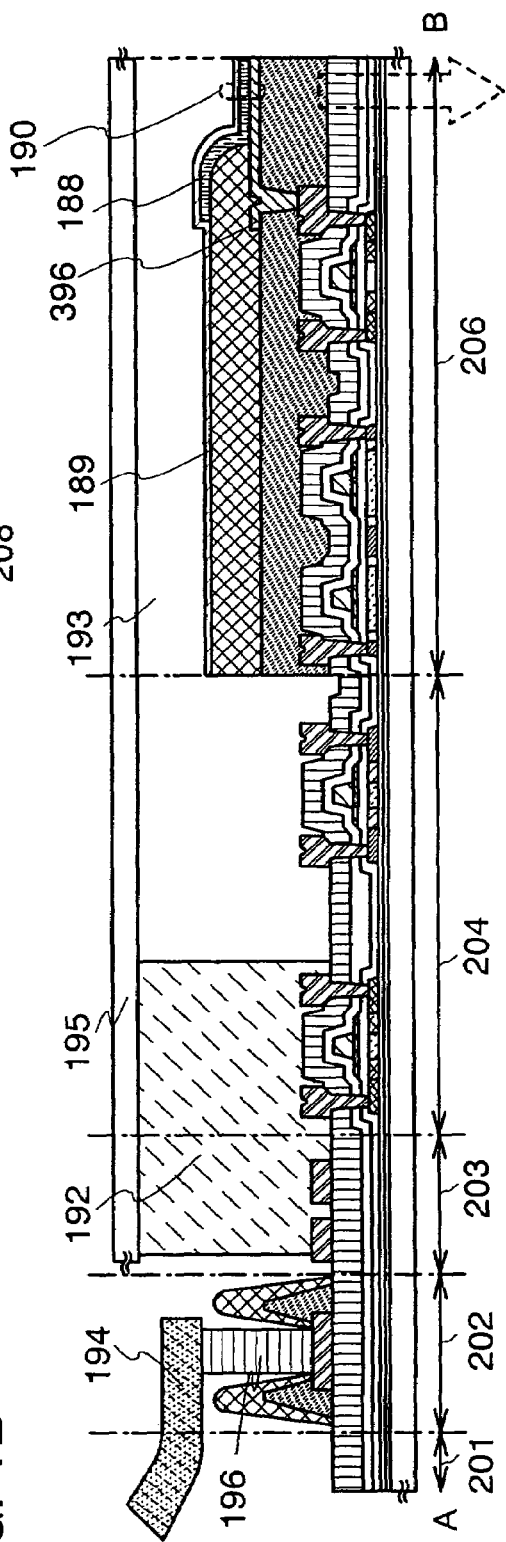
FIG. 1A
FIG. 1B

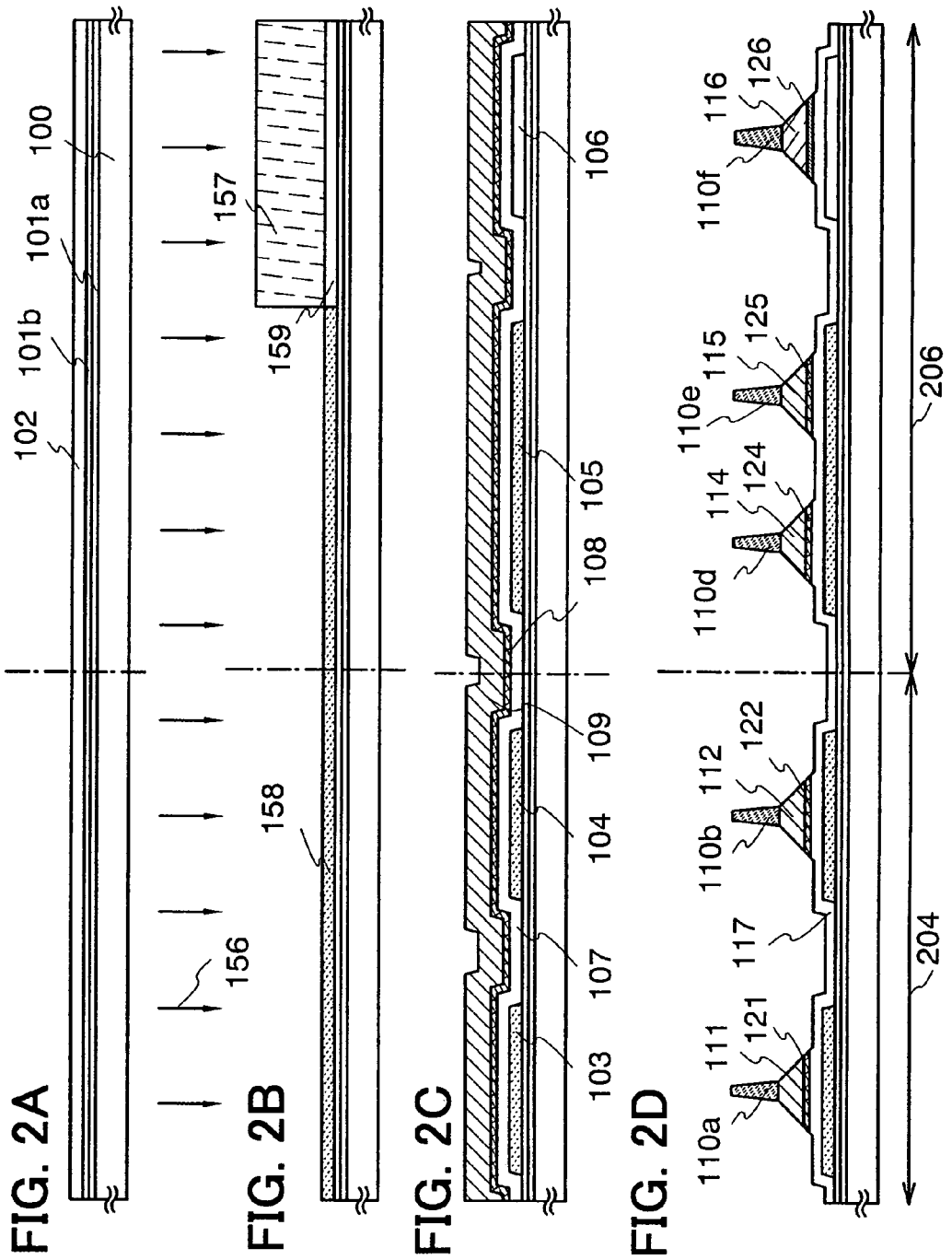

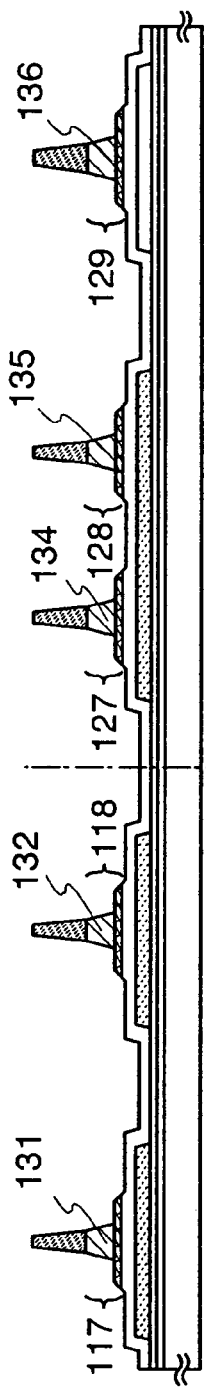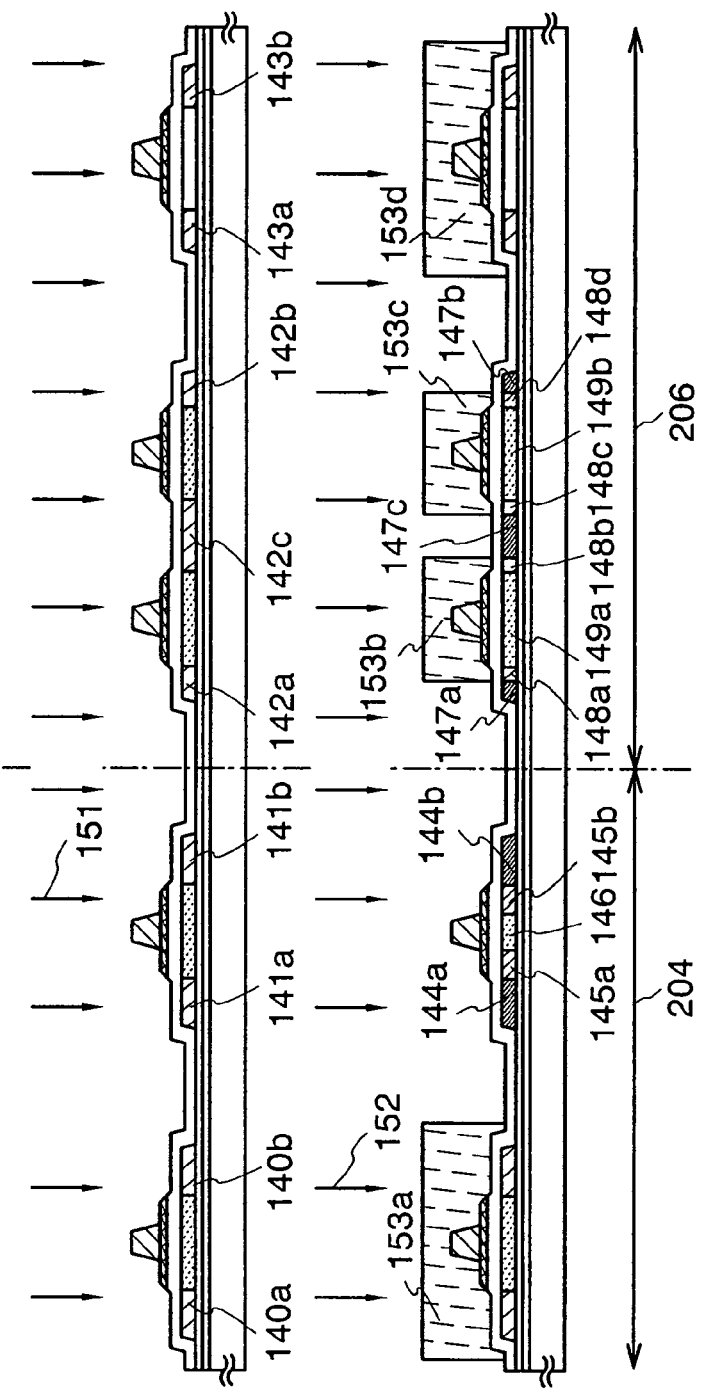
FIG. 3A
FIG. 3B
FIG. 3C

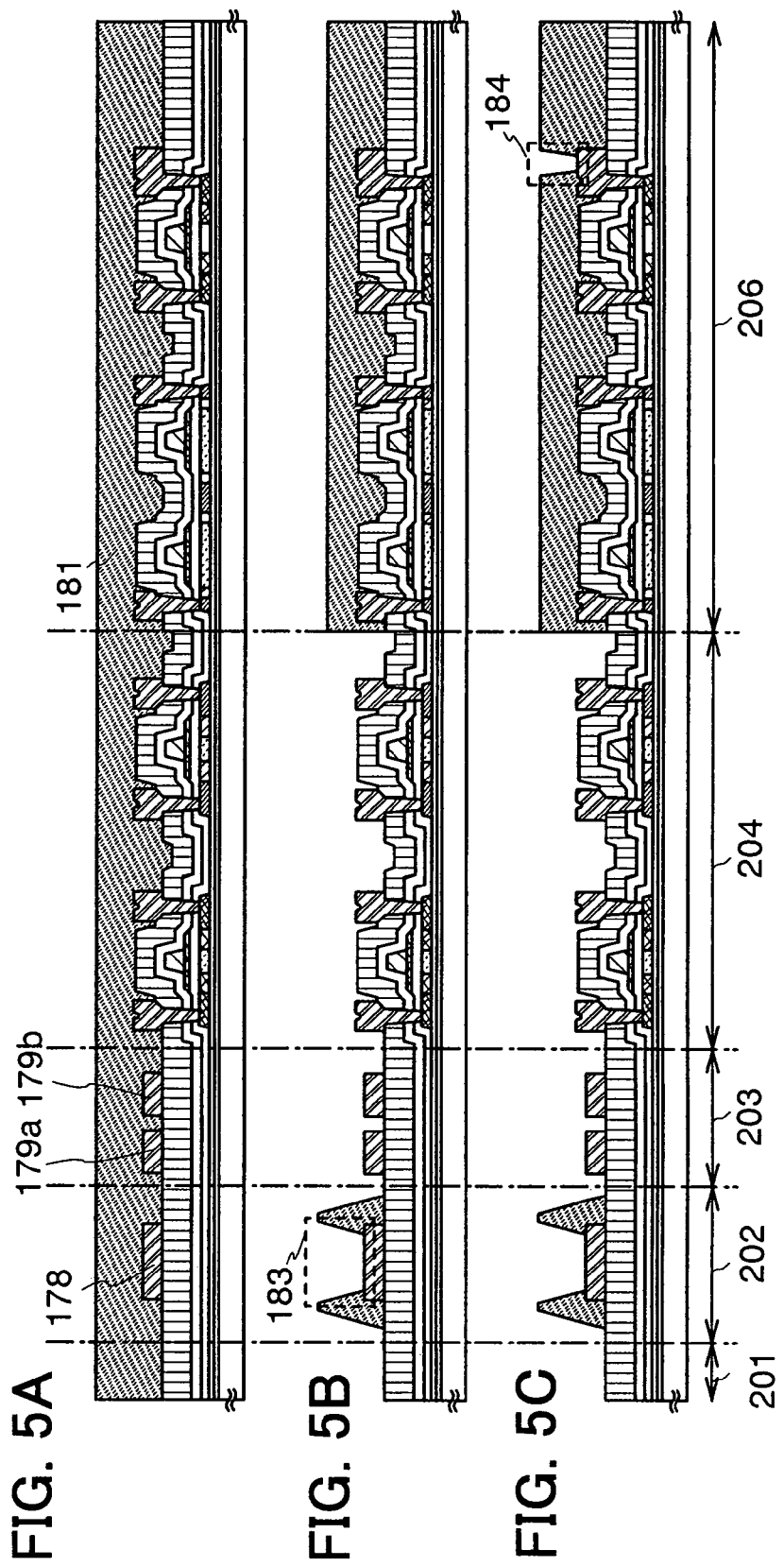

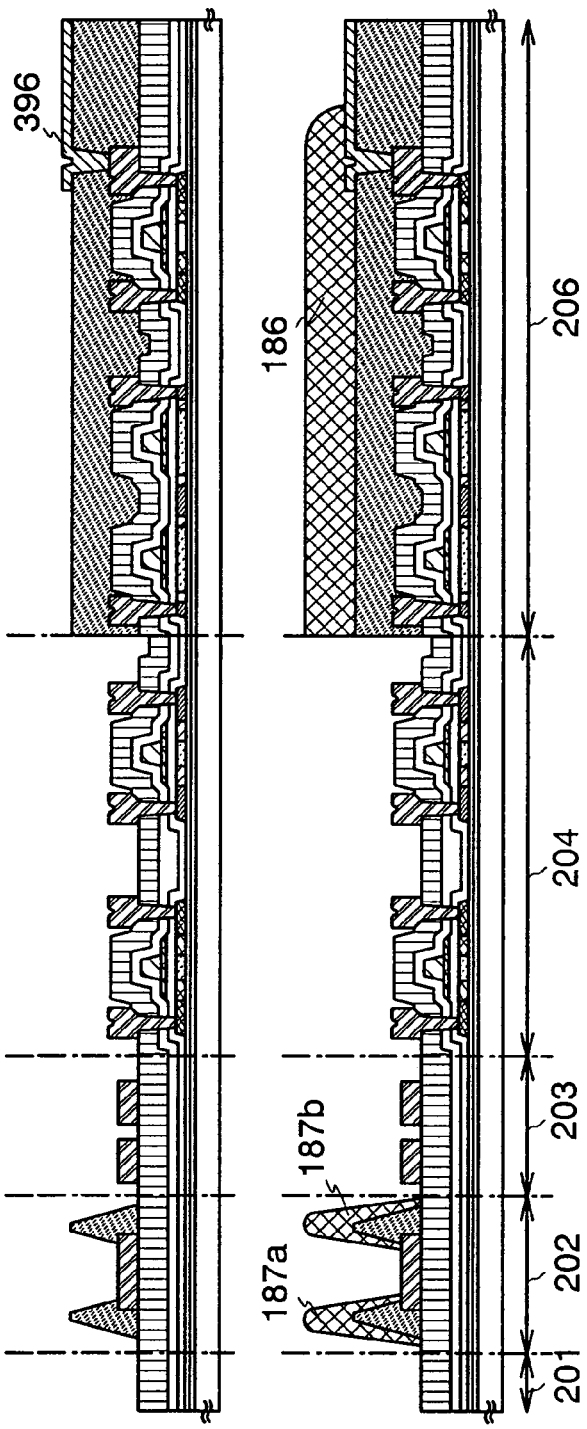

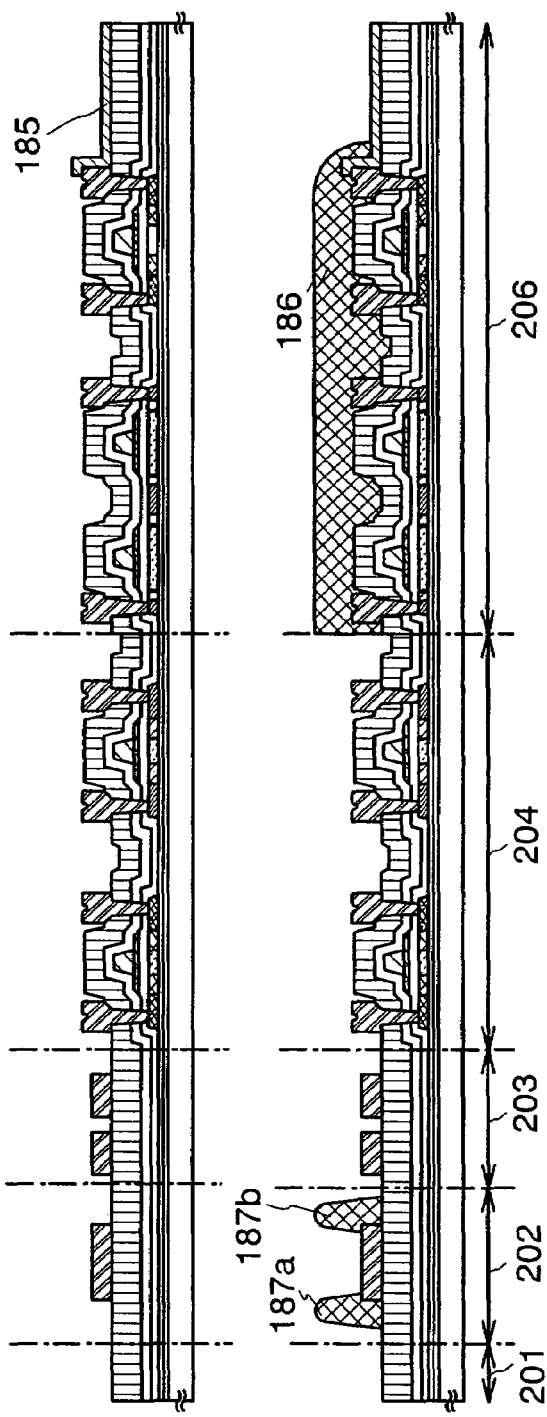

DISPLAY DEVICE, METHOD FOR MANUFACTURING THE SAME, AND ELECTRONIC DEVICE HAVING THE SAME

BACKGROUND OF THE INVENTION

1. Field of the Invention

The present invention relates to a display device and a method for manufacturing the display device.

2. Description of the Related Art

In recent years, a liquid crystal display device and an electroluminescent display device, in each of which thin film transistors (hereinafter also referred to as TFTs) are integrated over a glass substrate, have been developed. In each of these display devices, a thin film transistor is formed over a glass substrate by using a technique for forming a thin film, and a liquid crystal element or a light-emitting element (an electroluminescent (hereinafter, also referred to as an EL) element) is formed as a display element over various circuits composed of the thin film transistors so that the device functions as a display device.

A thin film transistor is a switching element that is turned on when a certain amount of voltage (referred to as a threshold or a threshold voltage) is applied to a gate electrode and is turned off when a voltage less than the amount is applied. Therefore, it is very important to control a threshold voltage precisely in terms of accurate operation of a circuit.

However, a threshold voltage of a TFT is moved (shifted) toward the minus side or the plus side by an indefinite factor such as an effect of a movable ion due to contamination and an effect of difference in work function and an interface charge in the periphery of a gate of the TFT.

As a technique proposed as a means for solving such a phenomenon, a channel doping method is given. The channel doping method is a technique in which an impurity element imparting one conductivity (typically, P, As, B, or the like) is added to at least a channel formation region of a TFT and a threshold voltage is controlled by being shifted intentionally (for example, see Patent Document 1: Japanese Published Patent Application No. 2003-257992).

SUMMARY OF THE INVENTION

However, thin film transistors manufactured for a display device include an n-channel thin film transistor and a p-channel thin film transistor, which have different conductivity types, and electric characteristics or functions to be needed are variously different from each other depending on an intended use. Therefore, it is necessary to control electric characteristics of a thin film transistor in accordance with a function to be needed.

It is an object of the present invention to provide a highly reliable display device having excellent visibility and a display function of high image quality. Moreover, it is another object of the present invention to provide a technique by which such a display device can be manufactured with high reliability, without complicating a step and a device.

In a display device of the present invention, a p-channel thin film transistor and an n-channel thin film transistor are included in each of a pixel and a driver circuit. In particular, in the pixel, the p-channel thin film transistor is used as a driving thin film transistor that is electrically connected to a light-emitting element and drives the light-emitting element.

One feature of the present invention is that a value of cutoff current (Icut), which is a value of drain current ID flowing when gate voltage VG is 0 V, is made different between a p-channel thin film transistor provided in a driver circuit and a driving p-channel thin film transistor in a pixel. Accordingly, a threshold of the p-channel thin film transistor required to operate at high speed and provided in the driver circuit is controlled to be higher (to be more on the plus side), and a threshold of the driving p-channel thin film transistor is controlled to be lower (to be more on the minus side). In a case where the p-channel thin film transistor provided in the driver circuit is turned on at Vgs=0, the driving p-channel thin film transistor is set so that the driving p-channel thin film transistor is not turned on at Vgs=0, but is turned on at a voltage lower than that (for example, Vgs=−3.5 V).

In a p-channel thin film transistor, when the concentration of an impurity element imparting p-type conductivity contained in a channel formation region is high, a threshold of the thin film transistor is shifted to be higher (toward the plus side). Accordingly, in the present invention, the concentration of an impurity element imparting p-type conductivity contained in the channel formation region of the driving p-channel thin film transistor provided in a pixel is made lower than the concentration of the impurity element imparting p-type conductivity contained in a channel region of other thin film transistors (an n-channel thin film transistor or a p-channel thin film transistor) manufactured in a display device, for example, a (n-channel or p-channel) thin film transistor having a switching function and a capacitor element provided in a pixel, a (n-channel or p-channel) thin film transistor provided in a driver circuit for driving a pixel, or the like.

In the present invention, in a case where a p-channel thin film transistor is used as a thin film transistor that is electrically connected to a light-emitting element and drives the light-emitting element, the concentration of an impurity element imparting p-type conductivity intended to correct a threshold may be made low in a channel region of the p-channel thin film transistor. Therefore, the impurity element imparting p-type conductivity may not be introduced aggressively. That is, channel doping is selectively performed on a semiconductor layer of a thin film transistor included in a pixel.

Needless to say, also in the thin film transistor as described above other than the driving p-channel thin film transistor, the concentration of an impurity element imparting p-type conductivity of the channel formation region may be made low. In that case, it is acceptable as long as the element imparting p-type conductivity is not added aggressively. For example, an impurity element imparting p-type conductivity may not be selectively added to a channel region of a thin film transistor or the like used for a scanning line driver circuit (also referred to as a gate driver), a protective circuit provided between a pixel portion and a peripheral driver circuit portion or the like.

Meanwhile, it is preferable that an impurity element imparting p-type conductivity be added to a channel region of a thin film transistor used for a signal line driver circuit (also referred to as a source driver) and required to operate at high speed, or a thin film transistor with low anode voltage, and that a threshold voltage thereof be controlled to be higher (be in the plus direction).

When channel doping is performed, a threshold of a thin film transistor is shifted to be higher (is shifted toward the plus side), thus a threshold of a p-channel thin film transistor in which channel doping is not performed is lower (on the minus side). Accordingly, a value of cutoff current (Icut), which is a value of drain current ID flowing when gate voltage VG is 0 V, becomes low. In a pixel, in a case where the light-emitting element is made in a non-light emission state and black display is performed, faint light emission caused by current flowing in the light-emitting element connected to a driving p-channel thin film transistor can be prevented. Further, as a value of cutoff current (Icut) is low, low power consumption can be realized.

The higher the temperature of usage environment of a thin film transistor, the more a threshold is shifted toward the direction of normally-ON. That is, a threshold is shifted to be lower higher (toward the plus direction) in a p-channel thin film transistor (shifted to be lower (toward the minus direction) in an n-channel thin film transistor). Thus, a value of cutoff current (Icut) becomes high and further, a value of current flowing in a light-emitting element becomes high in black display accompanied with a change in threshold. Accordingly, luminance of light emission from a light-emitting element generated in black display becomes high, and thus a problem of a display defect of a pixel becomes more apparent. However, like the present invention, by using a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and selectivity of usage environment such as indoor or outdoor is increased, leading to high utility value.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

By using the present invention, a highly reliable display device having excellent visibility and a display function of high image quality can be provided. Further, such a display device can be manufactured with high reliability, without requiring a complicated step.

As a display device which can use the present invention, there is a light-emitting display device in which a light-emitting element in which a layer containing an organic material, an inorganic material, or a mixture of an organic material and an inorganic material exhibiting light emission called electroluminescence (hereinafter also referred to as EL) is interposed between electrodes, is connected to a TFT.

According to one aspect of the present invention, a display device includes a pixel including a p-channel thin film transistor, an n-channel thin film transistor, and a light-emitting element, where one of a source and a drain of the p-channel thin film transistor is electrically connected to the light-emitting element, the concentration of an impurity element imparting p-type conductivity contained in a channel region of the p-channel thin film transistor is lower than the concentration of an impurity element imparting p-type conductivity contained in a channel region of the n-channel thin film transistor.

According to one aspect of the present invention, a display device includes a pixel including a p-channel thin film transistor, an n-channel thin film transistor, a capacitor element, and a light-emitting element, where one of a source and a drain of the p-channel thin film transistor is electrically connected to the light-emitting element, the concentration of an impurity element imparting p-type conductivity contained in a channel region of the p-channel thin film transistor is lower than the concentration of an impurity element imparting p-type conductivity contained in a channel region of the n-channel thin film transistor and the capacitor element.

According to one aspect of the present invention, a display device includes a pixel including a first p-channel thin film transistor and a light-emitting element, and a driver circuit including a second p-channel thin film transistor, where one of a source and a drain of the first p-channel thin film transistor is electrically connected to the light-emitting element, the concentration of an impurity element imparting p-type conductivity contained in a channel region of the first p-channel thin film transistor is lower than the concentration of an impurity element imparting p-type conductivity contained in a channel region of the second p-channel thin film transistor.

In the above structure, a threshold voltage of the p-channel thin film transistor or the first p-channel thin film transistor each of which is electrically connected to the light-emitting element is preferably less than or equal to −1.1 V, and a value of cutoff current (Icut) is preferably less than or equal to $2 \times 10^{-11}$ A. Cutoff current (Icut) is defined as drain current ID when gate voltage VG is 0 V, in drain current ID-gate voltage VG characteristics. A value of cutoff current (Icut) is a value of drain current ID when gate voltage VG is 0 V, in drain current ID-gate voltage VG characteristics. As a value of cutoff current (Icut) is low, low power consumption can be realized. When a threshold and a value of cutoff current are as described above, luminance of the light-emitting element in black display can be less than or equal to 0.1 cd/m$^2$, and a display defect due to faint light emission can be prevented from being observed by human eyes. Further, in the present invention, a value of ON current ($I_{on}$) can be greater than or equal to $1 \times 10^{-6}$ A. Thus, luminance of all white display, which is a light-emitting state of the light-emitting element, can be highly secured, and a contrast between black display and white display can be improved.

According to one aspect of the present invention, a method for manufacturing a display device includes the steps of forming a semiconductor film over an insulating surface; selectively forming a mask layer over the semiconductor film; selectively doping the semiconductor film with an impurity element imparting p-type conductivity using the mask layer; forming a first semiconductor layer and a second semiconductor layer including the impurity element imparting p-type conductivity by processing the semiconductor film which is doped with the impurity element imparting p-type conductivity selectively, in which the concentration of the impurity element imparting p-type conductivity included in the first semiconductor layer is lower than the concentration of the impurity element imparting p-type conductivity included in the second semiconductor layer; forming a p-channel thin film transistor using the first semiconductor layer; forming an n-channel thin film transistor using the second semiconductor layer; and forming a light-emitting element to which one of a source and a drain of the p-channel thin film transistor is electrically connected.

According to one aspect of the present invention, a method for manufacturing a display device includes the steps of forming an amorphous semiconductor film over an insulating surface; forming a crystalline semiconductor film by crystallizing the amorphous semiconductor film; selectively forming a mask layer over the crystalline semiconductor film; selectively doping the crystalline semiconductor film with an impurity element imparting p-type conductivity using the mask layer; forming a first semiconductor layer and a second semiconductor layer including the impurity element imparting p-type conductivity by processing the crystalline semiconductor film which is doped with the impurity element imparting p-type conductivity selectively, in which the concentration of the impurity element imparting p-type conductivity included in the first semiconductor layer is lower than the concentration of the impurity element imparting p-type conductivity included in the second semiconductor layer; forming a p-channel thin film transistor using the first semiconductor layer; forming an n-channel thin film transistor using the second semiconductor layer; and forming a light-emitting element to which one of a source and a drain of the p-channel thin film transistor is electrically connected.

According to one aspect of the present invention, a method for manufacturing a display device includes the steps of forming an amorphous semiconductor film over an insulating surface; selectively forming a mask layer over the amorphous semiconductor film; selectively doping the amorphous semiconductor film with an impurity element imparting p-type conductivity using the mask layer; forming a crystalline semiconductor film by crystallizing the amorphous semiconductor film which is doped with the impurity element imparting p-type conductivity selectively; forming a first semiconductor layer and a second semiconductor layer including the impurity element imparting p-type conductivity by processing the crystalline semiconductor film, in which the concentration of the impurity element imparting p-type conductivity contained in the first semiconductor layer is lower than the concentration of the impurity element imparting p-type conductivity contained in the second semiconductor layer; forming a p-channel thin film transistor using the first semiconductor layer; forming an n-channel thin film transistor using the second semiconductor layer; and forming a light-emitting element to which one of a source and a drain of the p-channel thin film transistor is electrically connected.

One feature of the present invention is that a value of cutoff current (Icut), which is a value of drain current ID flowing when gate voltage VG is 0 V, is made different between a p-channel thin film transistor provided in a driver circuit and a driving p-channel thin film transistor in a pixel. Accordingly, a threshold of the p-channel thin film transistor required to operate at high speed and provided in the driver circuit is controlled to be higher (to be more on the plus side), and a threshold of the driving p-channel thin film transistor is controlled to be lower (to be more on the minus side). In a case where the p-channel thin film transistor provided in the driver circuit is turned on at Vgs=0, the driving p-channel thin film transistor is set so that the driving p-channel thin film transistor is not turned on at Vgs=0, but is turned on at a voltage lower than that (for example, Vgs=−3.5 V).

Accordingly, a value of cutoff current (Icut), which is a value of drain current ID flowing when gate voltage VG is 0 V, becomes low. In a pixel, in a case where the light-emitting element is made in a non-light emission state and black display is performed, faint light emission caused by current flowing in a light-emitting element connected to a driving p-channel thin film transistor can be prevented. Further, as a value of cutoff current (Icut) is low, low power consumption can be realized.

The higher the temperature of usage environment of a thin film transistor, the more a threshold is shifted toward the direction of normally-ON. That is, a threshold is shifted to be higher (toward the plus direction) in a p-channel thin film transistor (shifted to be lower (toward the minus direction) in an n-channel thin film transistor). Thus, a value of cutoff current (Icut) becomes high and further, a value of current flowing in a light-emitting element becomes high in black display accompanied with a change in threshold. Accordingly, luminance of light emission from a light-emitting element generated in black display becomes high, and thus a problem of a display defect of a pixel becomes more apparent. However, like the present invention, by using a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and selectivity of usage environment such as indoor or outdoor is increased, leading to high utility value.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

By using the present invention, a highly reliable display device having excellent visibility and a display function of high image quality can be provided. Further, such a display device can be manufactured with high reliability, without requiring a complicated step.

BRIEF DESCRIPTION OF THE DRAWINGS

In the accompanying drawings:

FIGS. 1A and 1B are views each illustrating a display device of the present invention;

FIGS. 2A to 2D are views each illustrating a method for manufacturing a display device of the present invention;

FIGS. 3A to 3C are views each illustrating a method for manufacturing a display device of the present invention;

FIGS. 5A to 5C are views each illustrating a method for manufacturing a display device of the present invention;

FIGS. 6A and 6B are views each illustrating a method for manufacturing a display device of the present invention;

FIGS. 7A and 7B are views each illustrating a method for manufacturing a display device of the present invention;

DETAILED DESCRIPTION OF THE INVENTION

Figure 4A:
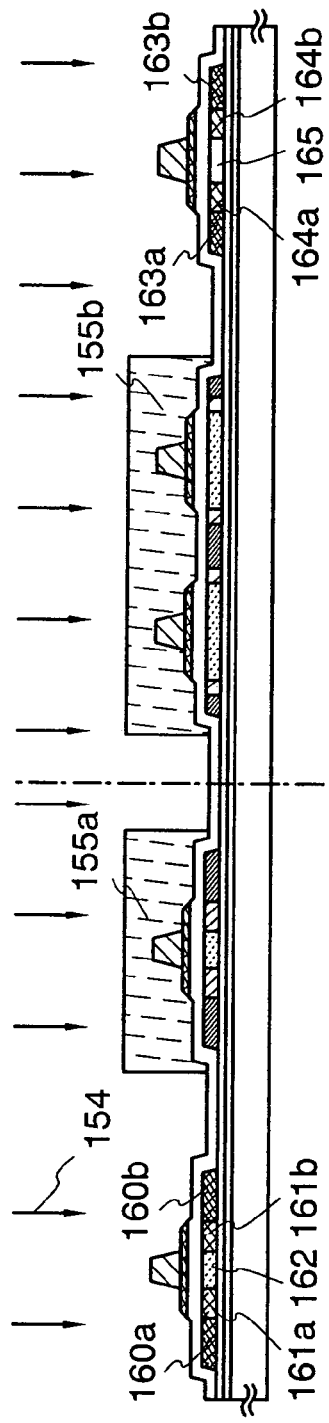
FIGS. 4A to 4C are views each illustrating a method for manufacturing a display device of the present invention.
Figure 4B:
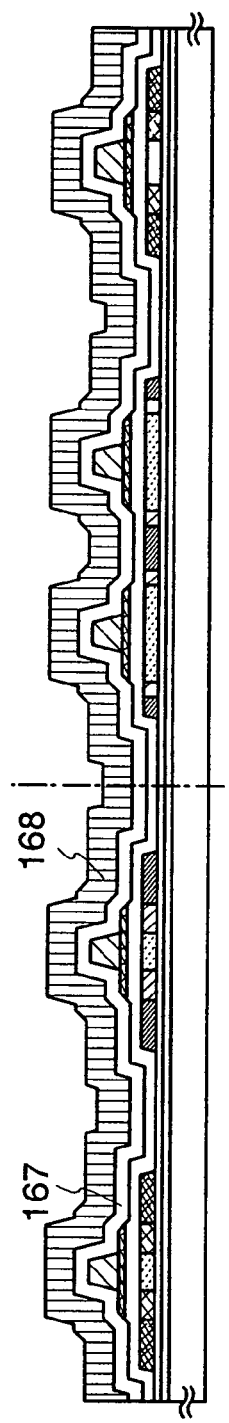

Embodiment Modes of the present invention will be explained below with reference to the accompanied drawings. However, the present invention is not limited to explanation to be given below, and it is to be easily understood that various changes and modifications in modes and details thereof will be apparent to those skilled in the art without departing from the purpose and the scope of the present invention. Therefore, the present invention should not be interpreted as being limited to the description of the embodiment modes to be given below. It is to be noted that, in a structure of the present invention which will be explained below, the same portions are denoted by the same reference numerals through different drawings.

Embodiment Mode 1

In this embodiment mode, a highly reliable display device having excellent visibility and a display function of high image quality at high contrast, and a method for manufacturing the display device are described in detail with reference to FIGS. 1A and 1B to FIGS. 6A and 6B, FIGS. 16A to 16C, and FIGS. 17A and 17B.

Figure 16A:
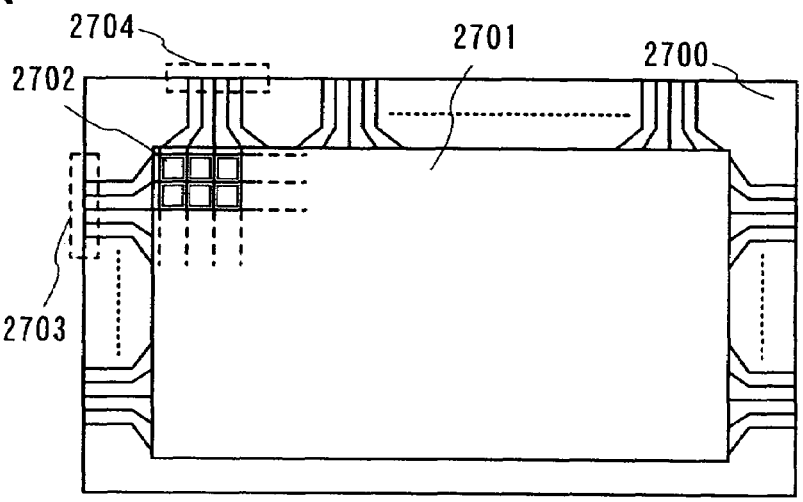
FIGS. 16A to 16C are top views of a display device of the present invention.

FIG. 16A is a top view showing a structure of a display panel in accordance with the present invention, which includes, over a substrate 2700 having an insulating surface, a pixel portion 2701 in which pixels 2702 are arranged in matrix, a scanning line input terminal 2703, and a signal line input terminal 2704. The number of pixels may be set depending on various standards: 1024×768×3 (RGB) in the case of XGA, 1600×1200×3 (RGB) in the case of UXGA, and 1920×1080×3 (RGB) in the case of full spec high vision.

The pixels 2702 are arranged in matrix in such a manner that a scanning line extending from the scanning line input terminal 2703 and a signal line extending from the signal line input terminal 2704 intersect with each other. Each of the pixels 2702 is provided with a switching element and a pixel electrode layer connected thereto. A typical example of the switching element is a TFT. A gate electrode layer side of the TFT is connected to the scanning line, and a source or drain side of the TFT is connected to the signal line; thus, each pixel can be controlled independently by a signal input from an external portion.

As main components of a TFT, a semiconductor layer, a gate insulating layer, and a gate electrode layer are given, and a wiring layer connected to a source region and a drain region which are formed in the semiconductor layer accompanies thereto. In terms of a structure, a top gate type in which a semiconductor layer, a gate insulating layer, and a gate electrode layer are provided from the substrate side; a bottom gate type in which a gate electrode layer, a gate insulating layer, and a semiconductor layer are provided from the substrate side; and the like are typically known. Any of the structures may be applied to the present invention.

Figure 17A:
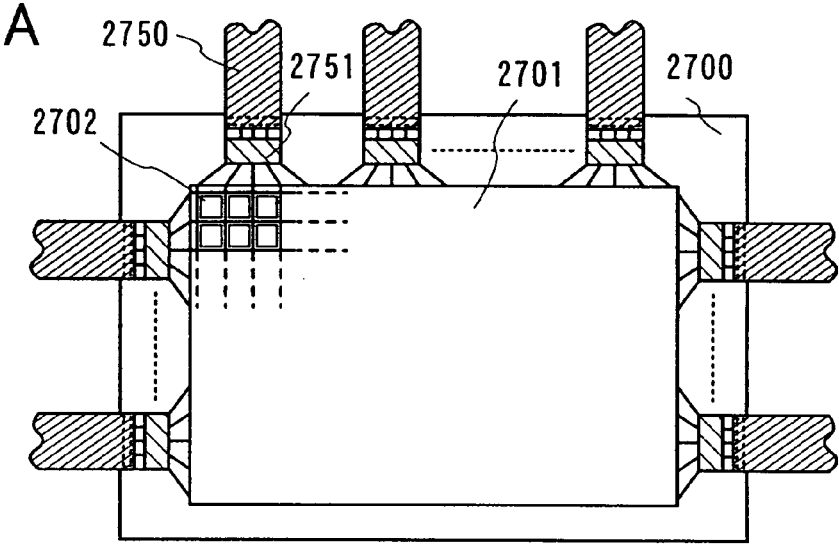
FIGS. 17A and 17B are top views of a display device of the present invention.
Figure 17B:
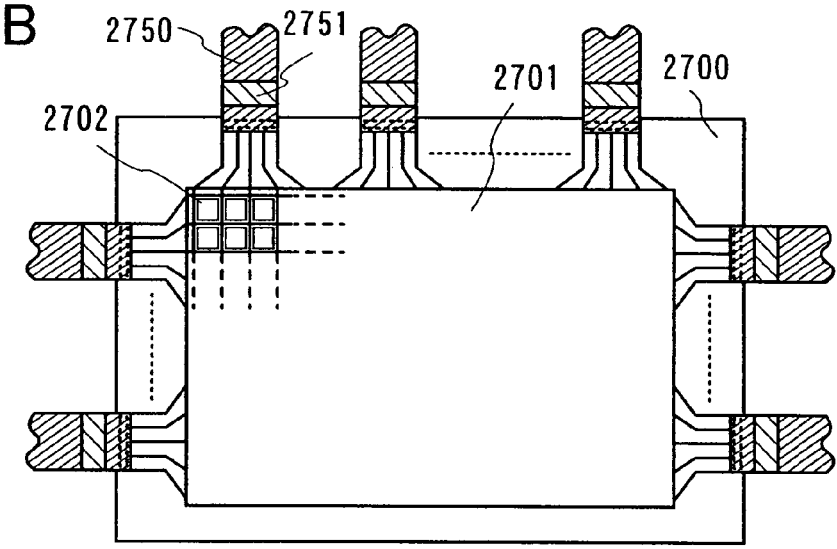

FIG. 16A shows a structure of a display panel in which a signal to be input to the scanning line and the signal line is controlled by an external driver circuit; however, a driver IC 2751 may be mounted on the substrate 2700 by a COG (Chip On Glass) method as shown in FIG. 17A. Further, as another mode, a TAB (Tape Automated Bonding) method as shown in FIG. 17B may also be employed. A driver IC may be formed on a single crystal semiconductor substrate. Moreover, a driver IC the circuit of which is formed using a TFT over a glass substrate, may be employed. In FIGS. 17A and 17B, the driver IC 2751 is connected to an FPC (Flexible Printed Circuit) 2750.

Figure 16B:
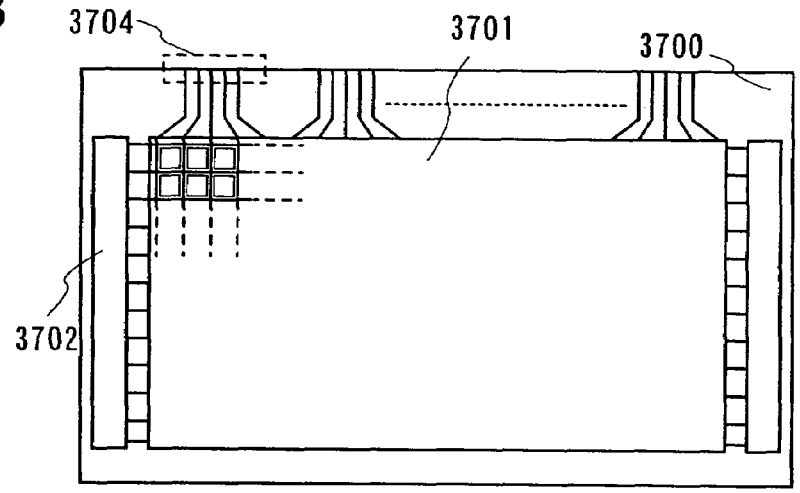
Figure 16C:
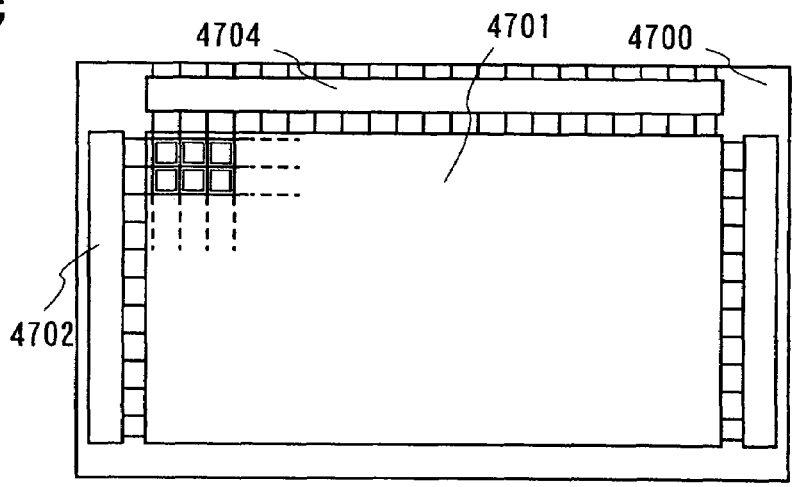

Further, in the case where a TFT provided in a pixel is formed by using a crystalline semiconductor, a scanning line driver circuit 3702 can be formed over a substrate 3700 as shown in FIG. 16B. In FIG. 16B, a pixel portion 3701 is controlled by an external driver circuit, to which a signal line input terminal 3704 is connected, similarly to FIG. 16A. In the case where a TFT provided in a pixel is formed using a polycrystalline (microcrystalline) semiconductor, a single crystal semiconductor, and the like with high mobility, a pixel portion 4701, a scanning line driver circuit 4702, and a signal line driver circuit 4704 can be formed in an integrated manner over a substrate 4700 as shown in FIG. 16C.

Over a substrate 100 having an insulating surface, a base film is formed. As the base film, a base film 101a is formed using a silicon nitride oxide (SiNO) film to be 10 to 200 nm thick, and a base film 101b is stacked thereover using a silicon oxynitride (SiON) film to be 50 to 200 nm thick (preferably, 100 to 150 nm thick) by a sputtering method, a PVD (Physical Vapor Deposition) method, a CVD (Chemical Vapor Deposition) method such as a low pressure CVD (LPCVD) method or a plasma CVD method, or the like. Alternatively, acrylic acid, methacrylic acid, and a derivative thereof, a heat-resistant high molecular material such as polyimide, aromatic polyamide, or polybenzimidazole, or a siloxane resin may be used. Further, the following resin material may also be used: a vinyl resin such as polyvinyl alcohol or polyvinylbutyral, an epoxy resin, a phenol resin, a novolac resin, an acrylic resin, a melamine resin, an urethane resin, or the like. In addition, an organic material such as benzocyclobutene, parylene, fluorinated arylene ether, or polyimide; a composite material containing a water-soluble homopolymer and a water-soluble copolymer; or the like may be used. As a method for forming the base film, a droplet discharging method, a printing method (a method for forming a pattern, such as screen printing or offset printing), a coating method such as a spin coating method, a dipping method, or the like can also be used. In this embodiment mode, the base films 101a and 101b are formed by a plasma CVD method. The substrate 100 may be a glass substrate, a quartz substrate, a silicon substrate, a metal substrate, or a stainless steel substrate having a surface over which an insulating film is formed. Further, a plastic substrate having heat resistance which can resist a processing temperature of this embodiment mode or a flexible substrate such as a film may also be used. As the plastic substrate, a substrate formed of PET (polyethylene terephthalate), PEN (polyethylene naphthalate), or PES (polyether sulfone) may be used, and as the flexible substrate, a substrate formed of a synthetic resin such as acrylic can be used. Since a display device manufactured in this embodiment mode has a structure in which light from a light-emitting element is extracted through the substrate 100, the substrate 100 is required to have a light-transmitting property.

The base film can be formed using silicon oxide, silicon nitride, silicon oxynitride, silicon nitride oxide, or the like and it may have either a single-layer structure or a stacked structure of two or three layers. In this specification, silicon oxynitride refers to a substance having a higher composition ratio of oxygen than that of nitrogen, and can also be referred to as silicon oxide containing nitrogen. Similarly, silicon nitride oxide refers to a substance having a higher composition ratio of nitrogen than that of oxygen, and can also be referred to as silicon nitride containing oxygen. In this embodiment mode, over the substrate, a silicon nitride oxide film is formed with a thickness of 50 nm using $SiH_4$, $NH_3$, $N_2O$, $N_2$, and $H_2$ as a reaction gas, and a silicon oxynitride film is formed with a thickness of 100 nm using $SiH_4$ and $N_2O$ as reaction gases. The thickness of the silicon nitride oxide film may be 140 nm and the thickness of the silicon oxynitride film to be stacked may be 100 nm.

Next, a semiconductor film is formed over the base film. The semiconductor film may be formed with a thickness of 25 to 200 nm (preferably, 30 to 150 nm) by a method (such as a sputtering method, an LPCVD method, or a plasma CVD method). In this embodiment mode, a crystalline semiconductor film formed by crystallizing an amorphous semiconductor film by laser irradiation is preferably used.

As a material for forming the semiconductor film, an amorphous semiconductor (hereinafter also referred to as an "AS") manufactured by a vapor phase growth method or a sputtering method using a semiconductor material gas typified by silane or germane; a polycrystalline semiconductor formed by crystallizing the amorphous semiconductor by utilizing light energy or thermal energy; a semiamorphous (also referred to as microcrystalline or microcrystal) semiconductor (hereinafter also referred to as a "SAS"); or the like can be used.

The SAS is a semiconductor having an intermediate structure between an amorphous structure and a crystalline structure (including a single crystal and a polycrystal) and having a third state that is stable in terms of free energy, and includes a crystalline region having short-range order and lattice distortion. A region of a crystal with a size of 0.5 to 20 nm can be observed in at least a part of a film. Raman spectrum is shifted toward a lower wavenumber side than 520 $cm^{-1}$ in the case where silicon is a main component. The diffraction peaks of (111) and (220), which are believed to be derived from silicon crystal lattice, are observed by the X-ray diffraction. The SAS contains hydrogen or halogen of at least 1 atom % or more for terminating dangling bonds. The SAS is formed by decomposing a gas including silicon with glow discharge decomposition (plasma CVD). $SiH_4$ is used as a typical gas including silicon. Further, $Si_2H_6$, $SiH_2Cl_2$, $SiHCl_3$, $SiCl_4$, $SiF_4$, or the like can also be used as the gas including silicon. Further, $F_2$ or $GeF_4$ may be mixed. This gas including silicon may be diluted with $H_2$, or $H_2$ and one or more rare gas elements selected from He, Ar, Kr, and Ne. The dilution ratio is set to be in a range of 1:2 to 1:1,000. The pressure is set to be approximately in a range of 0.1 to 133 Pa. The power frequency is set to be 1 to 120 MHz, preferably, 13 to 60 MHz. The substrate heating temperature may be set to be less than or equal to 300° C., and SAS can be formed at the substrate heating temperature of 100 to 200° C. As to impurity elements to be contained mainly in forming the film, the concentration of impurities for atmospheric constituents such as oxygen, nitrogen and carbon is preferably set to be less than or equal to $1×10^{20}$ $cm^3$. In particular, the oxygen concentration is set to be less than or equal to $5×10^{19}$ $cm^{-3}$, preferably, less than or equal to $1×10^{19}$ $cm^3$. Further, when a rare gas element such as helium, argon, krypton, or neon is included, the lattice distortion is further increased and the stability is thus enhanced, and thus an excellent SAS is obtained. Further, as the semiconductor film, a SAS layer formed using a hydrogen-based gas may be stacked over a SAS layer formed using a fluorine-based gas.

Typically, as the amorphous semiconductor, there is given hydrogenated amorphous silicon or the like, and as the crystalline semiconductor, there is given polysilicon or the like. Polysilicon (polycrystalline silicon) includes so-called high-temperature polysilicon which contains polysilicon formed at a process temperature greater than or equal to 800° C. as the main component, so-called low-temperature polysilicon which contains polysilicon formed at a process temperature less than or equal to 600° C. as the main component, polysilicon that is crystallized by adding an element which promotes crystallization or the like, and the like. Naturally, as described above, a semiamorphous semiconductor or a semiconductor which includes a crystalline phase in a portion of the semiconductor film can be used.

In the case where a crystalline semiconductor film is used for the semiconductor film, the crystalline semiconductor film may be formed by a known method (a laser crystallization method, a thermal crystallization method, a thermal crystallization method using an element such as nickel which promotes crystallization, or the like). Further, a microcrystalline semiconductor that is SAS may be crystallized by laser irradiation, for enhancing crystallinity. In the case where an element which promotes crystallization is not introduced, before irradiation of the amorphous semiconductor film with a laser light, the amorphous semiconductor film is heated at 500° C. for one hour in a nitrogen atmosphere to discharge hydrogen so that the hydrogen concentration in the amorphous semiconductor film is less than or equal to $1×10^{20}$ atoms/$cm^3$. This is because, if the amorphous semiconductor film contains much hydrogen, the amorphous semiconductor film may be broken by laser light irradiation. Heat treatment for crystallization may be performed with the use of a heating furnace, laser irradiation, irradiation with light emitted from a lamp (also referred to as a lamp annealing), or the like. As a heating method, an RTA method such as a GRTA (Gas Rapid Thermal Anneal) method or an LRTA (Lamp Rapid Thermal Anneal) method may be used.

Any method can be used for introducing a metal element into the amorphous semiconductor film as long as the method is capable of making the metal element exist on the surface of or inside the amorphous semiconductor film. For example, a sputtering method, a CVD method, a plasma treatment method (including a plasma CVD method), an adsorption method, or a method for applying a metal salt solution can be employed. Among them, the method using a solution is simple and easy, and thus, it is advantageous in terms of easy concentration control of the metal element. It is preferable to form an oxide film by ultraviolet irradiation in an oxygen atmosphere, a thermal oxidation method, a treatment with ozone water or hydrogen peroxide including a hydroxyl radical, or the like in order to improve wettability of the surface of the amorphous semiconductor film and to spread the aqueous solution over the entire surface of the amorphous semiconductor film.

A crystal with a large grain size can be obtained by irradiation with laser light of the second to fourth harmonic of a fundamental wave using a solid-state laser capable of continuous oscillation. For example, typically, it is desirable that the second harmonic (532 nm) or the third harmonic (355 nm) of a Nd:YVO$_4$ laser (fundamental wave: 1064 nm) be used. Specifically, laser light with an output greater than or equal to several W is obtained by converting laser light emitted from a continuous-wave YVO$_4$ laser into a harmonic by a nonlinear optical element. Then, it is preferable to shape the laser light into a rectangular or elliptical shape on an irradiation surface by an optical system and irradiate the semiconductor film with the laser light. The power density at this time needs to be approximately 0.001 to 100 MW/cm$^2$ (preferably, 0.1 to 10 MW/cm$^2$). Subsequently, irradiation is performed with a scan rate of approximately 0.5 to 2000 cm/sec (preferably, 10 to 200 cm/sec).

The beam shape of the laser is preferably linear. Accordingly, throughput can be improved. Further, the semiconductor film is preferably irradiated with the laser with an incident angle $\theta$ ($0°<\theta<90°$). This is because laser interference can be prevented.

Laser irradiation can be performed by moving such a laser relative to the semiconductor film. In addition, a marker can be formed to overlap beams with accuracy or to control a laser irradiation start position and a laser irradiation termination position in laser irradiation. The marker may be formed over the substrate at the same time as the amorphous semiconductor film.

As the laser, a continuous-wave or pulsed gas laser, solid-state laser, copper vapor laser, gold vapor laser, or the like can be used. As the gas laser, an excimer laser, an Ar laser, a Kr laser, a He—Cd laser, or the like can be used, and as the solid-state laser, a YAG laser, a YVO$_4$ laser, a YLF laser, a YAlO$_3$ laser, a Y$_2$O$_3$ laser, a glass laser, a ruby laser, an alexandrite laser, a Ti:sapphire laser, or the like can be used.

In addition, laser crystallization may be performed using a pulsed laser light with a repetition rate of greater than or equal to 0.5 MHz and using a frequency band that is much higher than a generally used frequency band, several tens to several hundreds Hz. It is said that the time required for the semiconductor film irradiated with pulsed laser light to solidify completely is several tens nsec to several hundreds nsec. By using the above frequency band, the semiconductor film can be irradiated with pulsed laser light after being melted by the previous laser light and before being solidified. Accordingly, the interface between the solid phase and the liquid phase can be moved continuously in the semiconductor film; therefore, a semiconductor film having crystal grains grown continuously in the scanning direction is formed. Specifically, a cluster of crystal grains of which width in a scanning direction is 10 to 30 μm and width in a direction perpendicular to the scanning direction is approximately 1 to 5 μm can be formed. By forming crystal grains of a single crystal which extend long along the scanning direction, a semiconductor film can be formed in which crystal grain boundaries hardly exist at least in a channel direction of a thin film transistor.

The laser light irradiation may be performed in an inert gas atmosphere such as a noble gas or nitrogen. This can suppress roughness of a semiconductor surface caused by the laser light irradiation and suppress variations in the threshold caused by variations in interface state density.

Crystallization of the amorphous semiconductor film may be performed by a combination of heat treatment and laser light irradiation, or by independently performing heat treatment or laser light irradiation plural times.

In this embodiment mode, a crystalline semiconductor film is formed by forming an amorphous semiconductor film over the base film 101$b$ and crystallizing the amorphous semiconductor film. For the amorphous semiconductor film, amorphous silicon formed from a reaction gas of SiH$_4$ and H$_2$ is used. In this embodiment mode, the base film 101$a$, the base film 101$b$, and the amorphous semiconductor film are formed continuously in the same chamber at the same temperature of 330° C. while keeping a vacuum with reaction gases changed.

After an oxide film formed over the amorphous semiconductor film is removed, an oxide film is formed to be 1 to 5 nm thick by ultraviolet irradiation in an oxygen atmosphere, a thermal oxidization method, treatment with ozone water containing hydroxyl radical or hydrogen peroxide solution, or the like. In this embodiment mode, Ni is used as an element which promotes crystallization. An aqueous solution containing 10 ppm of nickel acetate is applied by a spin coating method.

In this embodiment mode, after heat treatment is performed by an RTA method at 750° C. for three minutes, the oxide film formed over the semiconductor film is removed and laser light irradiation is performed. The amorphous semiconductor film is crystallized by the aforementioned crystallization treatment, whereby the crystalline semiconductor film is formed.

In the case where crystallization is performed with the use of a metal element, a gettering step is performed to reduce or remove the metal element. In this embodiment mode, the metal element is captured by an amorphous semiconductor film as a gettering sink. First, an oxide film is formed over the crystalline semiconductor film by ultraviolet irradiation in an oxygen atmosphere, a thermal oxidation method, treatment with ozone water containing hydroxyl radical or hydrogen peroxide, or the like. The oxide film is preferably made thick by heat treatment. Then, an amorphous semiconductor film is formed to be 50 nm thick by a plasma CVD method (a condition of this embodiment mode: 350 W and 35 Pa).

Thereafter, heat treatment is performed by an RTA method at 744° C. for three minutes to reduce or remove the metal element. Heat treatment may also be performed in a nitrogen atmosphere. Then, the amorphous semiconductor film serving as a gettering sink and the oxide film formed over the amorphous semiconductor film are removed with hydrofluoric acid or the like, whereby a crystalline semiconductor film in which the metal element is reduced or removed can be obtained (see FIG. 2A). In this embodiment mode, the amorphous semiconductor film serving as a gettering sink is removed with the use of TMAH (Tetramethyl Ammonium Hydroxide).

The semiconductor film obtained as described above may be doped with the slight amount of impurity elements (boron or phosphorus) for controlling threshold voltage of a thin film transistor. This doping of the impurity element may also be performed to the amorphous semiconductor film, before the crystallization step. When the semiconductor film in an amorphous state is doped with the impurity element, the impurity can also be activated by subsequent heat treatment for crystallization. Further, defects and the like generated in doping can be improved as well.

A mask layer 157 which selectively covers the semiconductor film 102 is formed. The mask layer 157 covers a region of the semiconductor film 102 in which a channel formation region of a p-channel thin film transistor is formed. The p-channel transistor is a driving thin film transistor in a light-emitting element and is electrically connected to the light-emitting element in a later step. By using the mask layer 157, an impurity element 156 that is an impurity element imparting p-type conductivity is selectively introduced into the semiconductor film 102.

By adding the impurity element 156, a first semiconductor film 158 (also referred to as a first semiconductor region) that is a p-type impurity region and a second semiconductor film 159 (also referred to as a second semiconductor region) are formed in the semiconductor film 102 (see FIG. 2B).

The impurity element 156 can be introduced (added) by an ion implantation method or an ion doping method. The impurity element 156 is an impurity element imparting p-type conductivity, and boron (B), arsenic (As), or the like can be used. The dose amount of the impurity element 156 may be approximately $1\times10^{13}$ atoms/cm$^2$. The concentration of the impurity element imparting p-type conductivity contained in the first semiconductor film may be approximately $1\times10^{17}$ atoms/cm$^3$, and approximately $1\times10^{16}$ atoms/cm$^3$ when the impurity element is activated later.

The mask layer 157 is removed, and then the first semiconductor film 158 and the second semiconductor film 159 are processed into desired shapes using a mask. In this embodiment mode, after the oxide film formed over the first semiconductor film 158 and the second semiconductor film 159 is removed, an oxide film is newly formed. Then, a photomask is manufactured, and by processing treatment using a photolithography method, semiconductor layers 103, 104, 105, and 106 are formed. The semiconductor layers 103, 104, and 105 are formed using the first semiconductor film 158 containing the impurity element imparting p-type conductivity, and accordingly, the semiconductor layers 103, 104, and 105 also contain the impurity element imparting p-type conductivity. On the other hand, the semiconductor layer 106 is formed using the second semiconductor film 159 to which the impurity element imparting p-type conductivity is not added, and accordingly, the impurity element imparting p-type conductivity is also not added to the semiconductor layer 106. Thus, the concentration of the impurity element imparting p-type conductivity contained in the semiconductor layer 106 is lower than the concentration of the impurity element imparting p-type conductivity contained in the semiconductor layers 103, 104, and 105.

An etching processing may employ either plasma etching (dry etching) or wet etching. In the case where a large-area substrate is processed, plasma etching is suitable. As an etching gas, a fluorine based gas such as $CF_4$ or $NF_3$, or a chlorine based gas such as $Cl_2$ or $BCl_3$ is used, to which an inert gas such as He or Ar may be appropriately added. When an etching processing by atmospheric pressure discharge is employed, local electric discharge can also be realized, which does not require a mask layer to be formed over the entire surface of the substrate.

In the present invention, a conductive layer for forming a wiring layer or an electrode layer, a mask layer for forming a predetermined pattern, or the like may be formed by a method capable of selectively forming a pattern, such as a droplet discharging method. In the droplet discharging (ejecting) method (also referred to as an ink-jet method in accordance with the system thereof), a droplet of a composition prepared for a specific purpose is selectively discharged (ejected), and a predetermined pattern (a conductive layer, an insulating layer, or the like) can be formed. At that time, treatment for controlling wettability or adhesion may be performed on a formation region. Alternatively, a method by which a pattern can be transferred or drawn, for example, a printing method (a method for forming a pattern, such as screen printing or offset printing), or the like can also be used.

In this embodiment mode, a resin material such as an epoxy resin, an acrylic resin, a phenol resin, a novolac resin, a melamine resin, or an urethane resin is used as a mask. Alternatively, an organic material such as benzocyclobutene, parylene, fluorinated arylene ether, or polyimide having a light-transmitting property; a compound material formed by polymerization of siloxane-based polymers or the like; a composition material containing a water-soluble homopolymer and a water-soluble copolymer; and the like can also be used. Further alternatively, a commercially available resist material including a photosensitive agent may also be used. For example, a positive resist, a negative resist, or the like can be used. When a droplet discharging method is used with any material, the surface tension and the viscosity of a material are appropriately adjusted through the control of the solvent concentration, addition of a surfactant or the like, and the like.

The oxide film over the semiconductor layer is removed, and a gate insulating layer 107 covering the semiconductor layers 103, 104, 105, and 106 is formed. The gate insulating layer 107 is formed of an insulating film containing silicon in a thickness of 10 to 150 nm by a plasma CVD method, a sputtering method, or the like. The gate insulating layer 107 may be formed using a material such as an oxide material or nitride material of silicon, typified by silicon nitride, silicon oxide, silicon oxynitride, and silicon nitride oxide, and may have a stacked structure or a single-layer structure. In addition, the insulating layer may be a stack of three layers including a silicon nitride film, a silicon oxide film, and a silicon nitride film; a single layer of a silicon oxynitride film; or a stack of two layers. Preferably, a silicon nitride film having dense film quality is used. Further, a thin silicon oxide film may be formed between the semiconductor layer and the gate insulating layer, in a thickness of 1 to 100 nm, preferably 1 to 10 nm, and more preferably 2 to 5 nm. As a method for forming a thin silicon oxide film, the surface of the semiconductor region is oxidized by a GRTA method, an LRTA method, or the like to form a thermal oxide film, thereby forming a silicon oxide film in a thin thickness. Note that a rare gas element such as argon may be contained in a reaction gas and be mixed into an insulating film to be formed in order to form a dense insulating film having little gate leak current at a low film formation temperature. In this embodiment mode, a silicon oxynitride film is formed to be 115 nm thick as the gate insulating layer 107.

Then, a first conductive film 108 having a thickness of 20 to 100 nm and a second conductive film 109 having a thickness of 100 to 400 nm, each of which is to serve as a gate electrode layer, are stacked over the gate insulating layer 107 (see FIG. 2C). The first conductive film 108 and the second conductive film 109 can be formed by a method such as a sputtering method, an evaporation method, a CVD method, or the like. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the element as its main component. A semiconductor film typified by a polycrystalline silicon film doped with an impurity element such as phosphorus or an AgPdCu alloy may also be used as the first conductive film 108 and the second conductive film 109. The conductive film is not limited to the two-layer structure, and for example, may have a three-layer structure where a tungsten film of 50 nm thick as a first conductive film, an aluminum-silicon alloy (Al—Si) film of 500 nm thick as a second conductive film, and a titanium nitride film of 30 nm thick as a third conductive film are sequentially stacked. In a case of the three-layer structure, tungsten nitride may be used instead of tungsten as the first conductive film; an aluminum-titanium alloy (Al—Ti) film may be used instead of an aluminum-silicon (Al—Si) alloy film as the second conductive film; or a titanium film may be used instead of a titanium nitride film as the third conductive film as well. Moreover, a single-layer structure may also be used. In this embodiment mode, tantalum nitride (TaN) of 30 nm thick is formed as the first conductive film 108 and tungsten (W) of 370 nm thick is formed as the second conductive film 109.

Next, masks 110a, 110b, 110d, 110e, and 110f made of resist are formed by a photolithography method, and the first conductive film 108 and the second conductive film 109 are processed into a desired shape to form first gate electrode layers 121, 122, 124, 125, and 126, and conductive layers 111, 112, 114, 115, and 116 (see FIG. 2D). The first gate electrode layers 121, 122, 124, 125, and 126, and the conductive layers 111, 112, 114, 115, and 116 can be etched to have a desired taper shape by appropriately adjusting an etching condition (the amount of electric power applied to a coil-shaped electrode layer, the amount of electric power applied to an electrode layer on the substrate side, an electrode temperature on the substrate side, and the like) by an ICP (Inductively Coupled Plasma) etching method. In addition, an angle and the like of the taper shape can also be controlled by the shapes of the masks 110a, 110b, 110d, 110e, and 110f. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used. In this embodiment mode, the second conductive film 109 is etched using an etching gas containing $CF_4$, $Cl_2$, and $O_2$, and then, the first conductive film 108 is continuously etched using an etching gas containing $CF_4$ and $Cl_2$.

Then, the conductive layers 111, 112, 114, 115, and 116 are processed into a desired shape using the masks 110a, 110b, 110d, 110e, and 110f. At this time, the conductive layers are etched with an etching condition of high selection ratio of the second conductive film 109 which forms the conductive layers with respect to the first conductive film 108 which forms the first gate electrode layers. By this etching, the conductive layers 111, 112, 114, 115, and 116 are etched to form second gate electrode layers 131, 132, 134, 135, and 136. In this embodiment mode, the second gate electrode layers also have a taper shape, and a taper angle thereof is larger than that of the first gate electrode layers 121, 122, 124, 125, and 126. Note that the taper angle is an angle of the side surface with respect to each surface of the first gate electrode layer, the second gate electrode layer, and the conductive layer. Thus, when the taper angle is increased to 90°, the conductive layer has a perpendicular side surface. In this embodiment mode, $Cl_2$, $SF_6$, and $O_2$ are used as an etching gas for forming the second gate electrode layers.

In this embodiment mode, each of the first gate electrode layer and the second gate electrode layer is formed to have a taper shape; thus, both of the two gate electrode layers have taper shapes. However, the present invention is not limited thereto, and only one of the gate electrode layers may have a taper shape while the other has a perpendicular side surface by anisotropic etching. Like this embodiment mode, the taper angles may be different or the same between the stacked gate electrode layers. With a taper shape, coverage of a film to be stacked thereover is improved and a defect is reduced; thus, reliability is enhanced.

Through the above steps, a gate electrode layer 117 formed of the first gate electrode layer 121 and the second gate electrode layer 131 and a gate electrode layer 118 formed of the first gate electrode layer 122 and the second gate electrode layer 132 can be formed in a peripheral driver circuit region 204; and a gate electrode layer 127 formed of the first gate electrode layer 124 and the second gate electrode layer 134, a gate electrode layer 128 formed of the first gate electrode layer 125 and the second gate electrode layer 135, and a gate electrode layer 129 formed of the first gate electrode layer 126 and the second gate electrode layer 136 can be formed in a pixel region 206 (see FIG. 3A). In this embodiment mode, the gate electrode layers are formed by dry etching; however, wet etching may also be employed.

The gate insulating layer 107 may be etched to some extent and reduced in thickness (so-called film decrease) by the etching step in forming the gate electrode layers.

By forming a width of the gate electrode layer to be small, a thin film transistor capable of high speed operation can be formed in forming the gate electrode layers. Two methods for forming a width of the gate electrode layer in a channel direction to be small will be shown below.

A first method is to form a mask for a gate electrode layer and then narrow the mask in a width direction by etching, ashing, or the like to form a mask with a narrower width. By using the mask formed with a narrower width in advance, the gate electrode layer can also be formed in a shape with a narrower width.

A second method is to form a normal mask and then form a gate electrode layer using the mask. Then, the obtained gate electrode layer is narrowed in a width direction by conducting side etching. Thus, a gate electrode layer with a narrower width can be finally formed. Through the above step, a thin film transistor with a short channel length can be formed, which can realize a thin film transistor capable of high speed operation.

An impurity element 151 imparting n-type conductivity is added using the gate electrode layers 117, 118, 127, 128, and 129 as masks to form first n-type impurity regions 140a, 140b, 141a, 141b, 142a, 142b, 142c, 143a, and 143b (see FIG. 3B). In this embodiment mode, doping is performed by using phosphine ($PH_3$) as a doping gas containing an impurity element (in the doping gas, $PH_3$ is diluted with hydrogen ($H_2$), and the ratio of $PH_3$ in the gas is 5%) with a gas flow rate of 80 sccm, a beam current of 54 μA/cm, an acceleration voltage of 50 kV, and a dose amount of $7.0 \times 10^{13}$ ions/cm². Here, the impurity element imparting n-type conductivity is added to the first n-type impurity regions 140a, 140b, 141a, 141b, 142a, 142b, 142c, 143a, and 143b so as to be contained in a concentration of approximately $1 \times 10^{17}$ to $5 \times 10^{18}$/cm³. In this embodiment mode, phosphorus (P) is used as the impurity element imparting n-type conductivity.

In this embodiment mode, regions of the impurity regions, which overlap with the gate electrode layers with the gate insulating layer interposed therebetween, are denoted as Lov regions. In addition, regions of the impurity regions, which do not overlap with the gate electrode layers with the gate insulating layer interposed therebetween, are denoted as Loff regions. In FIGS. 3A to 3C, these regions are shown by hatching and blank spaces in the impurity regions. This does not mean that the blank spaces are not doped with impurity elements, but makes it easy to intuitively understand that the concentration distribution of the impurity element in these regions reflects the mask and the doping condition. Note that this is the same in other drawings of this specification.

Subsequently, masks 153a, 153b, 153c, and 153d which cover the semiconductor layer 103, a part of the semiconductor layer 105, and the semiconductor layer 106 are formed. By using the masks 153a, 153b, 153c, and 153d, and the second gate electrode layer 132 as masks, an impurity element 152 imparting n-type conductivity is added to form second n-type impurity regions 144a and 144b, third n-type impurity regions 145a and 145b, second n-type impurity regions 147a, 147b and 147c, and third n-type impurity regions 148a, 148b, 148c, and 148d. In this embodiment mode, doping is performed by using $PH_3$ as a doping gas containing an impurity element (in the doping gas, $PH_3$ is diluted with hydrogen ($H_2$), and the ratio of $PH_3$ in the gas is 5%) with a gas flow rate of 80 sccm, a beam current of 540 μA/cm, an acceleration voltage of 70 kV, and a dose amount of $5.0 \times 10^{15}$ ions/cm$^2$. Here, doping is performed so that each of the second n-type impurity regions 144a and 144b contains the impurity element imparting n-type conductivity in a concentration of about $5 \times 10^{19}$ to $5 \times 10^{20}$/cm$^3$. The third n-type impurity regions 145a and 145b are formed to contain the impurity element imparting n-type conductivity in almost the same concentration as the third n-type impurity regions 148a, 148b, 148c, and 148d, or a little higher concentration than the concentration. Further, a channel formation region 146 is formed in the semiconductor layer 104, and channel formation regions 149a and 149b are formed in the semiconductor layer 105 (see FIG. 3C).

The second n-type impurity regions 144a, 144b, 147a, 147b, and 147c are high concentration n-type impurity regions which serve as sources and drains. On the other hand, the third n-type impurity regions 145a, 145b, 148a, 148b, 148c, and 148d are low concentration impurity regions which serve as LDD (Lightly Doped Drain) regions. The n-type impurity regions 145a and 145b covered with the first gate electrode layer 122 with the gate insulating layer 107 interposed therebetween are Lov regions which can relieve an electric field around a drain and suppress degradation of a value of ON current due to hot carriers. As a result, a thin film transistor capable of high speed operation can be formed. On the other hand, the third n-type impurity regions 148a, 148b, 148c, and 148d are formed in Loff regions which are not covered with the gate electrode layers 127 and 128, and can relieve an electric field around a drain and suppress degradation due to hot carrier injection as well as reduce an off current. As a result, a semiconductor device with high reliability and low power consumption can be manufactured.

Subsequently, the masks 153a, 153b, 153c, and 153d are removed, and masks 155a and 155b which cover the semiconductor layers 104 and 105 are formed. An impurity element 154 imparting p-type conductivity is added using the masks 155a and 155b, and the gate electrode layers 117 and 129 as masks to form first p-type impurity regions 160a, 160b, 163a, and 163b, and second p-type impurity regions 161a, 161b, 164a, and 164b. In this embodiment mode, boron (B) is used as an impurity element, and doping is performed using diborane ($B_2H_6$) as a doping gas containing an impurity element (in the doping gas, $B_2H_6$ is diluted with hydrogen ($H_2$), and the ratio of $B_2H_6$ in the gas is 15%) with a gas flow rate of 70 sccm, a beam current of 180 μA/cm, an acceleration voltage of 80 kV, and a dose amount of $2.0 \times 10^{15}$ ions/cm$^2$. Here, doping is performed so that the first p-type impurity regions 160a, 160b, 163a, and 163b and the second p-type impurity regions 161a, 161b, 164a, and 164b contain the impurity element imparting p-type conductivity in a concentration of about $1 \times 10^{20}$ to $5 \times 10^{21}$/cm$^3$. In this embodiment mode, the second p-type impurity regions 161a, 161b, 164a, and 164b are formed in a self-alignment manner to contain the impurity element in a lower concentration than that of the first p-type impurity regions 160a, 160b, 163a, and 163b by reflecting the shapes of the gate electrode layers 117 and 129. Further, a channel formation region 162 is formed in the semiconductor layer 103 and a channel formation region 165 is formed in the semiconductor layer 106 (see FIG. 4A).

The first p-type impurity regions 160a, 160b, 163a, and 163b are high concentration p-type impurity regions and serve as sources and drains. On the other hand, the second p-type impurity regions 161a, 161b, 164a, and 164b are low concentration impurity regions which serve as LDD (Lightly Doped Drain) regions. The second p-type impurity regions 161a, 161b, 164a, and 164b covered with the first gate electrode layers 121 and 126 with the gate insulating layer 107 interposed therebetween are Lov regions which can relieve an electric field around a drain and suppress degradation of a value of ON current due to hot carriers.

The masks 155a and 155b are removed by $O_2$ ashing or using a resist stripping solution, and the oxide film is also removed. After that, an insulating film, namely, a so-called sidewall may be formed so as to cover side surfaces of the gate electrode layers. The sidewall can be formed of an insulating film containing silicon by a plasma CVD method or a low pressure CVD (LPCVD) method.

In order to activate the impurity element, heat treatment, strong light irradiation, or laser light irradiation may be performed. At the same time as the activation, plasma damage to the gate insulating layer and plasma damage to an interface between the gate insulating layer and the semiconductor layer can be recovered.

Subsequently, an interlayer insulating layer which covers the gate electrode layers and the gate insulating layer is formed. In this embodiment mode, a stacked structure of insulating films 167 and 168 is employed (see FIG. 4B). A silicon nitride oxide film is formed as the insulating film 167 to be 100 nm thick, and a silicon oxynitride film is formed as the insulating film 168 to be 900 nm thick to form a stacked structure. Further, a stacked structure of three layers may be employed by forming a silicon oxynitride film to be 30 nm thick, a silicon nitride oxide film to be 140 nm thick, and a silicon oxynitride film to be 800 nm thick to cover the gate electrode layers and the gate insulating layer. In this embodiment mode, the insulating films 167 and 168 are continuously formed by a plasma CVD method similarly to the base film. The insulating films 167 and 168 are not limited to the above materials and may be formed of a silicon nitride film, a silicon nitride oxide film, a silicon oxynitride film, or a silicon oxide film by a sputtering method or a plasma CVD method. Alternatively, a single-layer structure or a stacked structure of three or more layers of other insulating film containing silicon may also be employed.

Further, heat treatment is performed in a nitrogen atmosphere at 300 to 550° C. for 1 to 12 hours, and the semiconductor layer is hydrogenated. Preferably, this step is performed at 400 to 500° C. Through this step, dangling bonds in the semiconductor layer are terminated by hydrogen contained in the insulating film 167 that is an interlayer insulating layer. In this embodiment mode, heat treatment is performed at 410° C. for one hour.

In addition, the insulating films 167 and 168 can also be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), and other substance containing an inorganic insulating material. A siloxane resin may also be used. The siloxane resin corresponds to a resin including a Si—O—Si bond. Siloxane has a skeleton structure formed of a bond of silicon (Si) and oxygen (O). As a substituent, an organic group containing at least hydrogen (for example, an alkyl group or aromatic hydrocarbon) or a fluoro group may be used. In addition, as a substituent, both of an organic group containing at least hydrogen and a fluoro group may also be used. Further, an organic insulating material such as polyimide, acrylic, polyamide, polyimide amide, resist, benzocyclobutene, or polysilazane may also be used. A coating film with a favorable planarity formed by a coating method may also be used.

Subsequently, contact holes (openings), which reach the semiconductor layers, are formed in the insulating films 167 and 168, and the gate insulating layer 107 using a mask made of resist. Etching may be performed once or plural times in accordance with a selection ratio of a material to be used. In this embodiment mode, first etching is performed to remove the insulating film 168 with a condition where a selection ratio of the insulating film 168 that is a silicon oxynitride film to the insulating film 167 that is a silicon nitride oxide film and the gate insulating layer 107 is high. Then, the insulating film 167 and the gate insulating layer 107 are removed by second etching to form openings, which reach the first p-type impurity regions 160a, 160b, 163a, and 163b, and the second n-type impurity regions 144a, 144b, 147a, and 147b as source regions or drain regions. In this embodiment mode, the first etching is performed by wet etching whereas the second etching is performed by dry etching. A hydrofluoric acid-based solution such as a mixed solution of ammonium hydrogen fluoride and ammonium fluoride may be used as an etchant of wet etching. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used. Further, an inert gas may be added to an etching gas to be used. As an inert element to be added, one or more of elements selected from He, Ne, Ar, Kr, and Xe can be used.

A conductive film is formed so as to cover the openings, and the conductive film is etched to form source electrode layers or drain electrode layers 169a, 169b, 170a, 170b, 171a, 171b, 172a, and 172b which are electrically connected to portions of respective source regions or drain regions. The source electrode layer or drain electrode layer can be formed by forming a conductive film by a PVD method, a CVD method, an evaporation method, or the like, and then, etching the conductive film into a desired shape. Further, a conductive layer can be selectively formed in a predetermined position by a droplet discharging method, a printing method, an electroplating method, or the like. Moreover, a reflow method or a damascene method may also be used. As a material for the source electrode layer or drain electrode layer, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. A stacked structure of these materials may also be employed. In this embodiment mode, titanium (Ti) is formed to be 60 nm thick, a titanium nitride film is formed to be 40 nm thick, aluminum is formed to be 700 nm thick, and titanium (Ti) is formed to be 200 nm thick so that a stacked structure can be formed, and then, the stacked structure is processed into a desired shape.

Figure 4C:
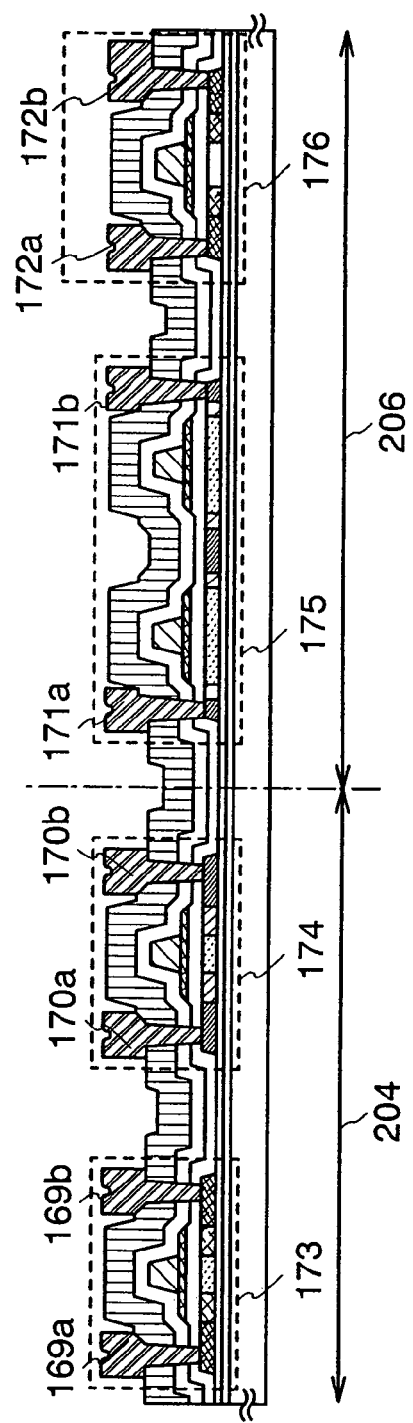

Through the above steps, an active matrix substrate can be manufactured, in which a p-channel thin film transistor 173 having a p-type impurity region in a Lov region and an n-channel thin film transistor 174 having an n-type impurity region in a Lov region are provided in the peripheral driver circuit region 204; and a multi-channel type n-channel thin film transistor 175 having an n-type impurity region in a Loff region and a p-channel thin film transistor 176 having a p-type impurity region in a Lov region are provided in the pixel region 206 (see FIG. 4C). The active matrix substrate can be used for a display device having a self-light-emitting element.

In this embodiment mode, channel doping is selectively performed with respect to the semiconductor layer of the thin film transistor included in the display device. Thus, an impurity element imparting p-type conductivity, which is intended to correct a threshold, is selectively added to channel formation regions of the p-channel thin film transistor 173, the n-channel thin film transistor 174, and the n-channel thin film transistor 175. However, the impurity element imparting p-type conductivity is not added to the channel region of the p-channel thin film transistor 176.

One feature of the present invention is that a value of cutoff current (Icut), which is a value of drain current ID flowing when gate voltage VG is 0 V, is made different between a p-channel thin film transistor provided in a driver circuit and a driving p-channel thin film transistor in a pixel. Accordingly, a threshold of the p-channel thin film transistor required to operate at high speed and provided in the driver circuit is controlled to be higher (to be more on the plus side), and a threshold of the driving p-channel thin film transistor is controlled to be lower (to be more on the minus side). In a case where the p-channel thin film transistor provided in the driver circuit is turned on at Vgs=0, the driving p-channel thin film transistor is set so that the driving p-channel thin film transistor is not turned on at Vgs=0, but is turned on at a voltage lower than that (for example, Vgs=−3.5 V).

In a p-channel thin film transistor, when the concentration of an impurity element imparting p-type conductivity contained in a channel formation region is high, a threshold of the thin film transistor is shifted to be higher (toward the plus side). Accordingly, in this embodiment mode, the concentration of an impurity element imparting p-type conductivity contained in the channel formation region of the p-channel thin film transistor 176 provided in a pixel is made lower than the concentration of the impurity element imparting p-type conductivity contained in a channel region of other thin film transistors manufactured in a display device, such as the p-channel thin film transistor 173, the n-channel thin film transistor 174, or the n-channel thin film transistor 175.

Needless to say, also in the thin film transistor as described above other than the driving p-channel thin film transistor, the element imparting p-type conductivity may not be selectively added to a channel region thereof. For example, an impurity element imparting p-type conductivity may not be selectively added to a channel region of a thin film transistor or the like used for a scanning line driver circuit (also referred to as a gate driver), a protective circuit provided between a pixel portion and a peripheral driver circuit portion or the like.

Meanwhile, it is preferable that an impurity element imparting p-type conductivity be added to a channel region of a thin film transistor used for a signal line driver circuit (also referred to as a source driver) and required to operate at high speed, or a thin film transistor with low anode voltage, and that a threshold voltage thereof be controlled.

When channel doping is performed, a threshold of a thin film transistor is shifted to be higher (toward the plus side), thus a threshold of a p-channel thin film transistor in which channel doping is not performed is lower (on the minus side). Accordingly, a value of cutoff current (Icut), which is a value of drain current ID flowing when gate voltage VG is 0 V, becomes low. In a pixel, in a case where the light-emitting element is made in a non-light emission state and black display is performed, faint light emission caused by current flowing in the light-emitting element connected to a driving p-channel thin film transistor can be prevented. Further, as a value of cutoff current (Icut) is low, low power consumption can be realized.

The higher the temperature of usage environment of a thin film transistor, the more a threshold is shifted toward the direction of normally-ON. That is, a threshold is shifted to be higher (toward the plus direction) in a p-channel thin film transistor (shifted to be lower (toward the minus direction) in an n-channel thin film transistor). Thus, a value of cutoff current (Icut) becomes high and further, a value of current flowing in a light-emitting element becomes high in black display accompanied with a change in threshold. Accordingly, luminance of light emission from a light-emitting element generated in black display becomes high, and thus a problem of a display defect of a pixel becomes more apparent. However, like the present invention, by using a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and selectivity of usage environment such as indoor or outdoor is increased, leading to high utility value.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

A threshold voltage of the p-channel thin film transistor electrically connected to the light-emitting element is preferably less than or equal to −1.1 V, and a value of cutoff current (Icut) is preferably less than or equal to $2 \times 10^{-11}$ A. A value of cutoff current (Icut) is defined as a value of drain current ID when gate voltage VG is 0 V, in drain current ID-gate voltage VG characteristics. The lower a value of cutoff current (Icut), the more low power consumption can be realized. When a threshold and a value of cutoff current are as described above, luminance of the light-emitting element in black display can be less than or equal to 0.1 cd/m$^2$, and a display defect due to faint light emission can be prevented from being observed by human eyes. Further, in the present invention, a value of ON current ($I_{on}$) can be greater than or equal to $1 \times 10^{-6}$ A. Thus, luminance of all white display, which is a light-emitting state of the light-emitting element, can be highly secured, and a contrast between black display and white display can be improved.

A structure of the thin film transistor is not limited to that in this embodiment mode, and the thin film transistor may have a single-gate structure in which one channel formation region is formed, a double-gate structure in which two channel formation regions are formed, or a triple-gate structure in which three channel formation regions are formed. A thin film transistor in the peripheral driver circuit region may have a single-gate structure, a double-gate structure, or a triple-gate structure.

The present invention is not limited to the method for manufacturing the thin film transistor shown in this embodiment mode, and it may also be applied to a top gate type (a planar type), a bottom gate type (a reverse staggered type), or a dual gate type having two gate electrode layers which are arranged above and below a channel region with a gate insulating film interposed therebetween, or other structures.

Next, an insulating film 181 is formed as a second interlayer insulating layer (see FIG. 5A). FIGS. 5A to 5C each show a manufacturing step of the display device, in which a separation region 201 for separation by scribing, an external terminal connection region 202 that is a portion where an FPC is attached, a wiring region 203 that is a lead wiring region for the peripheral region, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed by using a material selected from silicon oxide, silicon nitride, silicon oxynitride, silicon nitride oxide, aluminum nitride (AlN), aluminum oxynitride (AlON), aluminum nitride oxide (AlNO) containing more nitrogen than oxygen, aluminium oxide, diamond-like carbon (DLC), nitrogen-containing carbon (CN) film, PSG (phosphorus glass), BPSG (boron phosphorus glass), an alumina film, polysilazane, and other substances containing an inorganic insulating material. Alternatively, a siloxane resin may be used. Further alternatively, an organic insulating material may be used. The organic material may be either photosensitive or nonphotosensitive, and polyimide, acrylic, polyamide, polyimide amide, resist, benzocyclobutene, or the like can be used.

In this embodiment mode, the interlayer insulating layer provided for planarization is required to have a high heat resistant property, a high insulating property, and high planarity ratio. Thus, the insulating film 181 is preferably formed using a coating method typified by a spin coating method.

In this embodiment mode, as a material for the insulating film 181, a coating film using a siloxane resin is used. The siloxane resin film after baking can resist heat treatment at 300° C. or higher.

The insulating film 181 can be formed using dipping, spray coating, a doctor knife, a roll coater, a curtain coater, a knife coater, a CVD method, an evaporation method, or the like. The insulating film 181 may also be formed by a droplet discharging method. In a case of using a droplet discharging method, a material solution can be saved. In addition, a method by which a pattern can be transferred or drawn similarly to a droplet discharging method, for example, a printing method (a method for forming a pattern, such as screen printing or offset printing) can also be used.

Then, as shown in FIG. 5B, an opening is formed in the insulating film 181 that is the interlayer insulating layer. The insulating film 181 is required to be etched widely in a connection region 205 (shown in FIG. 1A), the peripheral driver circuit region 204, the wiring region 203, the external terminal connection region 202, and the separation region 201. It is to be noted that the connection region 205 is a region shown in a top view of FIG. 1A, where a wiring layer manufactured in the same step as the source electrode layer or drain electrode layer and a second electrode layer to be an upper electrode layer of the light-emitting element are electrically connected to each other. The connection region 205 is omitted and not shown in FIGS. 5A to 5C. Accordingly, it is necessary to provide an opening in the insulating film 181 also in the connection region 205. However, in the pixel region 206, an opening area is much small compared with an opening area in the peripheral driver circuit region 204 and the like, and is minute. Therefore, by carrying out both of a photolithography step for forming the opening in the pixel region and a photolithography step for forming the opening in the connection region and the like, a margin of an etching condition can be wide. As a result, yield can be improved. Further, by a wide margin of the etching condition, the contact hole formed in the pixel region can be formed with high accuracy.

Specifically, a large area opening is formed in the insulating film 181 provided in the connection region 205, the peripheral driver circuit region 204, the wiring region 203, the external terminal connection region 202, and the separation region 201. In order to obtain the opening, a mask is formed to cover the insulating film 181 of the pixel region 206 and a non-opening region of the connection region 205, the peripheral driver circuit region 204, the wiring region 203, and the external terminal connection region 202. Etching can be performed by using a parallel plate RIE apparatus or an ICP etching apparatus. It is to be noted that etching time may be determined so that the wiring layer and the insulating film 168 are over-etched. Under the condition where the wiring layer and the insulating film 168 are over-etched, variation in thickness in the substrate and variation in etching rate can be reduced. In this manner, an opening is formed in each of the connection region 205, the peripheral driver circuit region 204, the wiring region 203, the external terminal connection region 202, and the separation region 201. An opening 183 is formed in the external terminal connection region 202, and the terminal electrode layer 178 is exposed.

Subsequently, a minute opening, that is, a contact hole is formed in the insulating film 181 in the pixel region 206. At this time, a mask is formed so as to cover the insulating film of a non-opening region of the pixel portion 206 and the connection region 205, the peripheral driver circuit region 204, the wiring region 203, and the external terminal connection region 202. The mask is a mask for forming an opening in the pixel region 206 provided with a minute opening in a predetermined position. As such a mask, for example, a resist mask can be used.

Then, the insulating film 181 is etched by using a parallel plate RIE apparatus. It is to be noted that etching time may be determined so that the wiring layer and the insulating film 168 are over-etched. Under the condition where the wiring layer and the insulating film 168 are over-etched, variation in thickness in the substrate and variation in etching rate can be reduced.

Further, an ICP apparatus may also be used as the etching apparatus. Through the above steps, an opening 184 that reaches the source electrode layer or drain electrode layer 172b is formed in the pixel region 206 (see FIG. 5C).

The etching for forming the opening may also be performed plural times at the same position. For example, since the opening of the connection region 203 has a large area, the amount to be etched is large. Such an opening with a large area may also be formed by performing etching plural times. In addition, in a case of forming a deep opening compared with other openings, etching may be performed plural times, similarly.

Moreover, in this embodiment mode, although an example of forming the openings in the insulating film 181 by performing etching plural times is shown, the openings may also be formed by performing one etching step. In this case, etching is performed using an ICP apparatus with an ICP power of 7000 W, a bias power of 1000 W, pressure of 0.8 Pascal (Pa), and 240 sccm of $CF_4$ and 160 sccm of $O_2$ as an etching gas. The bias power is preferably 1000 to 4000 W. Since the openings can be formed by performing one etching step, there is an advantage that a step can be simplified.

Next, a first electrode layer 396 (also referred to as a pixel electrode layer) is formed so as to be in contact with the source electrode layer or drain electrode layer. The first electrode layer 396 serves as an anode or a cathode. The first electrode layer 396 is preferably formed of a film containing as its main component an element selected from Ti, Ni, W, Cr, Pt, Zn, Sn, In, and Mo; an alloy material or a compound material containing the element as its main component such as TiN, $TiSi_xN_y$, $WSi_x$, $WN_x$, $WSi_xN_y$, or NbN; or a stacked film thereof with a total film thickness ranging from 100 to 800 nm.

In this embodiment mode, a light-emitting element is used as a display element, and the first electrode layer 396 has a light-transmitting property because light from the light-emitting element is extracted from the first electrode layer 396 side. The first electrode layer 396 is formed by forming a transparent conductive film to be etched in a desired shape.

In the present invention, the first electrode layer 396 that is a light-transmitting electrode layer may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide is added (ITSO), or the like can also be used.

In addition, even in a case of a non-light-transmitting material such as a metal film, when the thickness is made thin (preferably, approximately 5 to 30 nm) so as to be able to transmit light, light can be emitted through the first electrode layer 396. As a metal thin film that can be used for the first electrode layer 396, a conductive film formed of titanium, tungsten, nickel, gold, platinum, silver, aluminum, magnesium, calcium, lithium, and an alloy thereof, or the like can be used.

The first electrode layer 396 can be formed by an evaporation method, a sputtering method, a CVD method, a printing method, a dispenser method, a droplet discharging method, or the like. In this embodiment mode, the first electrode layer 396 is formed of indium zinc oxide containing tungsten oxide by a sputtering method. The first electrode layer 396 is preferably formed with a total film thickness ranging from 100 to 800 nm.

The surface of the first electrode layer 396 may be polished by a CMP method or by cleaning with a polyvinyl alcohol based porous body to be planarized. After polishing by a CMP method, the surface of the first electrode layer 396 may be subjected to ultraviolet irradiation, oxygen plasma treatment, or the like.

Heat treatment may be performed after forming the first electrode layer 396. By the heat treatment, moisture contained in the first electrode layer 396 is discharged. Thus, degasification or the like is not caused in the first electrode layer 396; therefore, even when a light-emitting material that is easily deteriorated by moisture is formed over the first electrode layer, the light-emitting material is not deteriorated; thus, a highly reliable display device can be manufactured.

Then, an insulating layer 186 (also referred to as a partition, a barrier, or the like) is formed to cover an edge portion of the first electrode layer 396 and the source electrode layer or drain electrode layer. When the insulating layer 186 is formed using the same material and through the same step as the insulating film 181, a manufacturing cost can be reduced. Further, the cost can also be reduced when apparatuses such as a coating film forming apparatus and an etching apparatus are used in common.

The insulating layer 186 can be formed using a material selected from silicon oxide, silicon nitride, silicon oxynitride, aluminum oxide, aluminum nitride, aluminum oxynitride containing more oxygen than nitrogen, aluminum nitride oxide containing more nitrogen than oxygen, diamond-like carbon (DLC), nitrogen-containing carbon, polysilazane, or other substances containing an inorganic insulating material. A material containing siloxane may also be used. Alternatively, an organic insulating material may be used, and as the organic material, a photosensitive or non-photosensitive organic insulating material such as polyimide, acrylic, polyamide, polyimide amide, resist, or benzocyclobutene may also be used. In addition, an oxazole resin can be used, and for example, photo-curable type polybenzoxazole or the like can be used. The insulating layer 186 preferably has a shape in which a radius of curvature is continuously changed, and thus coverage with the electroluminescent layer 188 and the second electrode layer 189 formed thereover is improved.

In the connection region 205 shown in FIG. 1A, the wiring layer formed through the same step and of the same material as the second electrode layer is electrically connected to the wiring layer formed through the same step and of the same material as the source electrode layer or drain electrode layer. For the connection, an opening which exposes the wiring layer formed through the same step and of the same material as the source electrode layer or drain electrode layer is formed. By covering a level difference in the periphery of the opening with the insulating layer 186 to reduce the level difference, coverage with the second electrode layer 189 to be stacked can be improved.

In addition, in order to further improve reliability, it is preferable to perform degasification by vacuum heating before forming the electroluminescent layer 188. For example, before performing evaporation of an organic compound material, it is desirable to perform heat treatment for removing a gas contained in the substrate in a reduced pressure atmosphere or an inert gas atmosphere at temperatures of 200 to 400° C., preferably 250 to 350° C. Moreover, it is preferable to form the electroluminescent layer 188 by a vacuum evaporation method or a droplet discharging method under a reduced pressure without exposing the substrate to an atmosphere. By this heat treatment, moisture contained in or attached to a conductive film to be the first electrode layer or an insulating layer (partition) can be discharged. This heat treatment can be combined with the above-mentioned heating step as long as the substrate can be transferred in a vacuum chamber without breaking the vacuum, and in that case, only the above-mentioned heating step may be required to be performed once after forming an insulating layer (partition). Here, by forming the interlayer insulating film and the insulating layer (partition) using a highly heat resistant substance, a heat treatment step for improving the reliability can be sufficiently performed.

The electroluminescent layer 188 is formed over the first electrode layer 396. Although only one pixel is shown in FIGS. 1A and 1B, electroluminescent layers corresponding to each color of R (red), G (green) and B (blue) are separately formed in this embodiment mode. As the electroluminescent layer 188, a layer that provides functions of a high carrier-injecting property and a high carrier-transporting property by mixing an organic compound and an inorganic compound, which cannot be obtained when only one of an organic compound and an inorganic compound is used, is provided over the first electrode layer 396.

Materials (a low molecular material, a high molecular material, or the like), which show light emission of red (R), green (G), and blue (B), can also be formed by a droplet discharging method.

Subsequently, the second electrode layer 189 formed of a conductive film is provided over the electroluminescent layer 188. As the second electrode layer 189, a material having a low work function (Al, Ag, Li, Ca, or an alloy thereof such as MgAg, MgIn, AlLi, CaF$_2$, or calcium nitride) may be used. In this manner, a light-emitting element 190 formed of the first electrode layer 396, the electroluminescent layer 188, and the second electrode layer 189 are formed.

Figure 8:
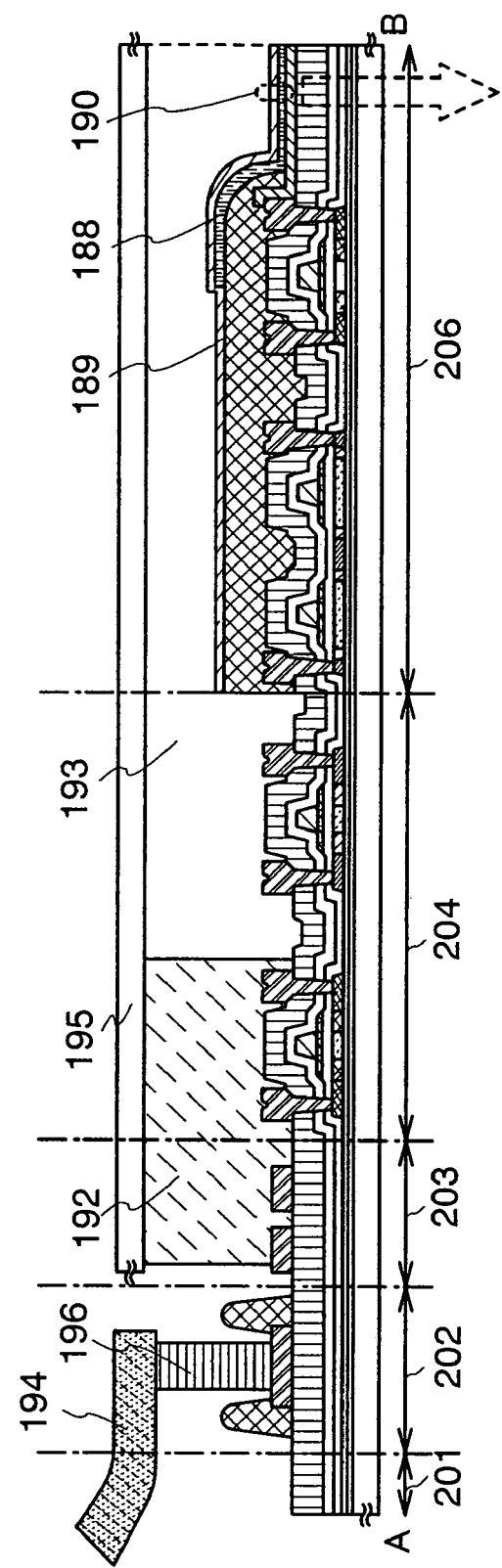
FIG. 8 is a view illustrating a display device of the present invention.
Figure 14:
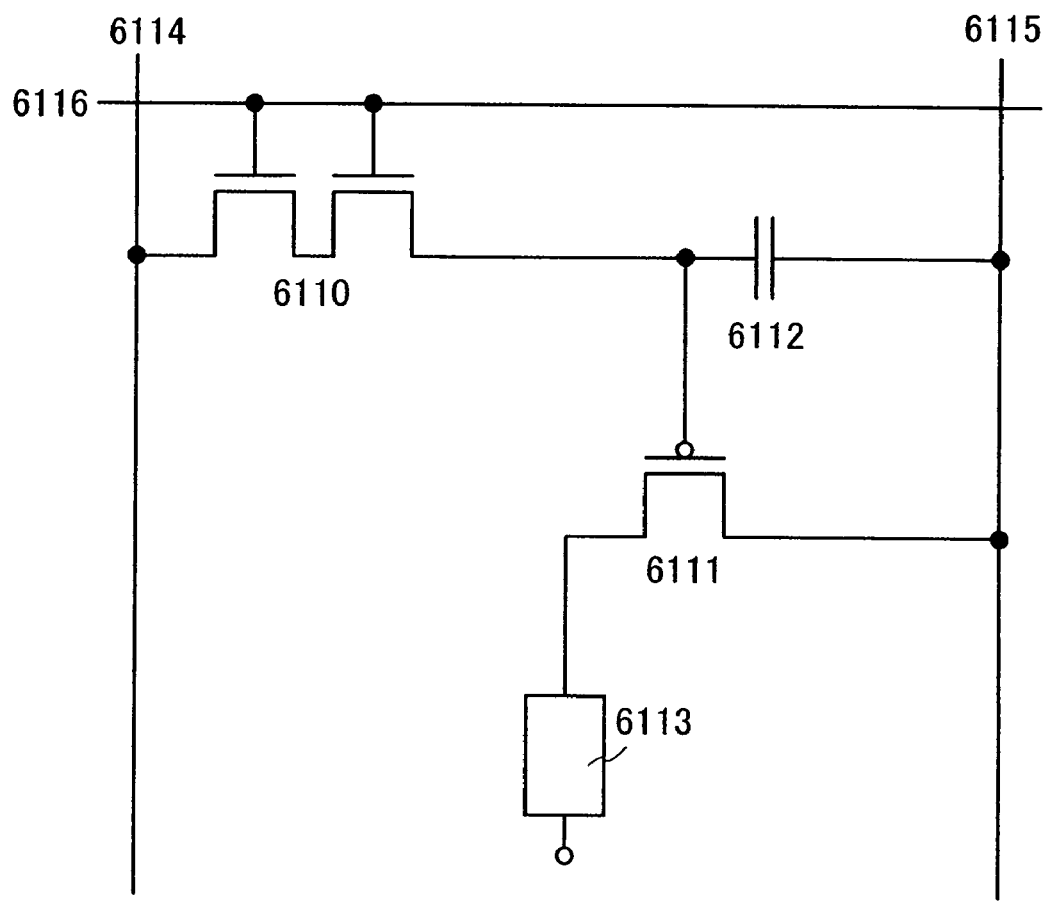
FIG. 14 is an equivalent circuit diagram of a display device of the present invention.

FIG. 14 shows an example of a circuit diagram of a pixel in this embodiment mode. In FIG. 14, a pixel includes transistors 6110 and 6111, a capacitor element 6112, and a light-emitting element 6113. The transistor 6110 corresponds to the multigate type n-channel thin film transistor 175 in FIG. 4C, the transistor 6111 corresponds to the p-channel thin film transistor 176 in FIG. 4C, and the light-emitting element 6113 corresponds to the light-emitting element 190 in FIG. 8.

A gate of the transistor 6110 is connected to a wiring 6116. One of a source and a drain of the transistor 6110 is connected to a wiring 6114, and the other is connected to a gate of the transistor 6111 and one of terminals of the capacitor element 6112. One of the terminals of the capacitor element 6112 is connected to the transistors 6110 and 6111, and the other is connected to the wiring 6115. One of a source and a drain of the transistor 6111 is connected to the wiring 6115, and the other is connected to the light-emitting element 6113. The wiring 6116 serves as a scanning (gate) line, the wiring 6114 serves as a signal (source) line, and the wiring 6115 serves as a power source line. The transistor 6110 is a switching transistor having a switching function, and the transistor 6111 is a driving transistor in which cutoff current is reduced.

The drain (or the source) of the transistor 6111 that is a driving p-channel thin film transistor is connected to the wiring 6115 that is a power source line. An anode potential is applied to the wiring. When the transistor 6110 that is a switching thin film transistor is turned on and the anode potential, the level of which is the same as the wiring 6115, is input as an erasing signal, the anode potential is applied to the gate of the transistor 6111 that is the driving p-channel thin film transistor. A voltage between the gate and the source (Vgs) of the transistor 6111 that is the driving p-channel thin film transistor at this time is as follows: Vgs=0. The driving p-channel thin film transistor is turned off at Vgs=0, and thus black display can be performed without flow of current in the light-emitting element.

When the transistor 6110 that is a switching thin film transistor is turned off, a gate potential of the transistor 6111 that is a driving p-channel thin film transistor falls due to parasitic capacitance or the like of the transistor 6110. Thus, Vgs of the transistor 6111 that is the driving p-channel thin film transistor is shifted to be lower (toward the minus side). By this shift of Vgs, the transistor 6111 that is the driving p-channel thin film transistor is turned on, and when current flows, a light-emitting element emits light faintly and thus a defect of black display is unfortunately observed. In order to prevent this, by using the present invention, a threshold voltage ($V_{th}$) is set to be lower (to be on the minus side) in advance so that the transistor 6111 that is the driving p-channel thin film transistor is turned on at Vgs=−3.5 V in order to reduce cutoff current of the transistor 6111. It is to be noted that the same level of an anode potential as a power source line is used as an erasing signal in order to eliminate a power source.

Meanwhile, since power consumption is lowered, it is preferable that an impurity element imparting p-type conductivity be added to a channel region of a thin film transistor used for a signal line driver circuit (also referred to as a source driver) and required to operate at high speed, or a thin film transistor with low anode voltage, and that a threshold voltage thereof be controlled so as to be shifted to be higher (toward the plus side). Accordingly, in the present invention, each of the p-channel transistors can have any of two types of thresholds in accordance with whether or not channel doping is performed thereto.

In order to prevent visual recognition of a defect of black display, luminance of a light-emitting element in black display may be set to less than or equal to 0.1 cd/m². By using the transistor 6111 that is the driving p-channel thin film transistor using the present invention, a threshold voltage Vth of the transistor 611 can be less than or equal to −1.1 V; a value of cutoff current Icut, which is a value of current at Vgs=0, can be less than or equal to $2 \times 10^{-11}$; and luminance of the light-emitting element in black display can be suppressed to 0.1 cd/m². Accordingly, a display defect can be prevented from being generated due to faint light emission that can be observed in black display by visual recognition; thus, displaying with excellent visibility and high image quality can be performed.

In the present invention, in a case where a p-channel thin film transistor 176 is used as a thin film transistor that is electrically connected to the light-emitting element 190 and drives the light-emitting element 190, an impurity element imparting p-type conductivity intended to correct a threshold is not introduced into a channel region of the p-channel thin film transistor.

When channel doping is performed, a threshold of a thin film transistor is shifted to be higher (toward the plus side), and thus a threshold of a p-channel thin film transistor in which channel doping is not performed and the concentration of the impurity element is made low is lower (on the minus side). Accordingly, a value of cutoff current (Icut), which is a value of drain current ID flowing when gate voltage VG is 0 V, becomes low. In a pixel, in a case where the light-emitting element is made in a non-light emission state and black display is performed in a pixel, faint light emission caused by current flowing in a light-emitting element connected to a driving p-channel thin film transistor can be prevented. Further, the lower a value of cutoff current (Icut), the more low power consumption can be realized.

The structure of a light-emitting element 190 applicable in this embodiment mode is described in detail with reference to FIGS. 18A to 18D. In FIGS. 18A to 18D, a first electrode layer 870 corresponds to the first electrode layer 396 in FIGS. 1A and 1B, an electroluminescent layer 860 corresponds to the electroluminescent layer 188 in FIGS. 1A and 1B, and a second electrode layer 850 corresponds to the second electrode layer 189 in FIGS. 1A and 1B.

FIGS. 18A to 18D each show an example of an element structure of a light-emitting element in which the electroluminescent layer 860 formed by mixing an organic compound and an inorganic compound is interposed between the first electrode layer 870 and the second electrode layer 850. As shown in the figure, the electroluminescent layer 860 includes a first layer 804, a second layer 803, and a third layer 802, and there is a great feature especially in the first layer 804 and the third layer 802.

First, the first layer 804 is a layer having a function of transporting holes to the second layer 803, and includes at least a first organic compound and a first inorganic compound showing an electron-accepting property with respect to the first organic compound. It is important that the first organic compound and the first inorganic compound are not only simply mixed but also the first inorganic compound has an electron-accepting property with respect to the first organic compound. This structure generates many hole-carriers in the first organic compound which has originally almost no inherent carrier, and a highly excellent hole-injecting property and hole-transporting property can be obtained.

Therefore, as for the first layer 804, not only an advantageous effect that is considered to be obtained by mixing an inorganic compound (such as improvement in heat resistance) but also excellent conductivity (in particular, a hole-injecting property and a hole-transporting property in the first layer 804) can also be obtained. This excellent conductivity is an advantageous effect, which cannot be obtained in a conventional hole-transporting layer in which an organic compound and an inorganic compound that do not electronically interact with each other are simply mixed. This advantageous effect can make a drive voltage lower than a conventional one. In addition, since the first layer 804 can be made thick without causing increase in drive voltage, short circuit of the element due to a dust or the like can be suppressed.

Incidentally, as described above, it is preferable to use a hole-transporting organic compound as the first organic compound because hole-carriers are generated in the first organic compound. Examples of the hole-transporting organic compound include phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. However, the present invention is not limited to these examples. In addition, among the compounds described above, an aromatic amine compound typified by TDATA, MTDATA, m-MTDAB, TPD, NPB, DNTPD, and TCTA can easily generate hole-carriers, and are suitable compound groups for the first organic compound.

On the other hand, the first inorganic compound may be any material as long as the material can easily accept electrons from the first organic compound, and various kinds of metal oxides and metal nitrides can be used. Any of transition metal oxides that belong to Groups 4 to 12 of the periodic table is preferable because an electron-accepting property is easily provided. Specifically, titanium oxide, zirconium oxide, vanadium oxide, molybdenum oxide, tungsten oxide, rhenium oxide, ruthenium oxide, zinc oxide, and the like can be given. In addition, among the metal oxides described above, any of transition metal oxides that belong to Groups 4 to 8 of the periodic table mostly has a high electron-accepting property, which is a preferable group. In particular, vanadium oxide, molybdenum oxide, tungsten oxide, and rhenium oxide are preferable because they can be formed by vacuum evaporation and can be easily used.

It is to be noted that the first layer 804 may be formed by stacking a plurality of layers each including a combination of the organic compound and the inorganic compound described above, or may further include another organic compound or inorganic compound.

Next, the third layer 802 will be explained. The third layer 802 is a layer having a function of transporting electrons to the second layer 803, and includes at least a third organic compound and a third inorganic compound showing an electron-donating property with respect to the third organic compound. It is important that the third organic compound and the third inorganic compound are not only simply mixed but also the third inorganic compound has an electron-denoting property with respect to the third organic compound. This structure generates many electron-carriers in the third organic compound which has originally almost no inherent carriers, and a highly excellent electron-injecting and electron-transporting property can be obtained.

Therefore, as for the third layer 802, not only an advantageous effect that is considered to be obtained by mixing an inorganic compound (such as improvement in heat resistance) but also excellent conductivity (in particular, an electron-injecting property and an electron-transporting property in the third layer 802) can also be obtained. This excellent conductivity is an advantageous effect which cannot be obtained in a conventional electron-transporting layer in which an organic compound and an inorganic compound that do not electronically interact with each other are simply mixed. This advantageous effect can make a drive voltage lower than conventional one. In addition, since the third layer 802 can be made thick without causing increase in a drive voltage, short circuit of the element due to a dust or the like can be suppressed.

Incidentally, as described above, it is preferable to use an electron-transporting organic compound as the third organic compound because electron-carriers are generated in the third organic compound. Examples of the electron-transporting organic compound include tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited to these examples. In addition, among the compounds mentioned above, chelate metal complexes having a chelate ligand including an aromatic ring typified by $Alq_3$, $Almq_3$, $BeBq_2$, BAlq, $Zn(BOX)_2$, $Zn(BTZ)_2$, and the like, organic compounds having a phenanthroline skeleton typified by BPhen, BCP, and the like, and organic compounds having an oxadiazole skeleton typified by PBD, OXD-7, and the like can easily generate electron-carriers, and are compound groups suitable for the third organic compound.

On the other hand, the third inorganic compound may be any material as long as the material can easily donate electrons to the third organic compound. Although various kinds of metal oxides and metal nitrides can be used, alkali metal oxide, alkaline-earth metal oxide, rare-earth metal oxide, alkali metal nitride, alkaline-earth metal nitride, and rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be formed by vacuum evaporation and can be easily used.

It is to be noted that the third layer 802 may be formed by stacking a plurality of layers each including a combination of the organic compound and the inorganic compound described above, or may further include another organic compound or inorganic compound.

Then, the second layer 803 will be explained. The second layer 803 is a layer having a function of emitting light, and includes a second organic compound that has a light-emitting property. A second inorganic compound may also be included. The second layer 803 can be formed using various light-emitting organic compounds and inorganic compounds. However, since it is believed to be hard to flow a current through the second layer 803 as compared with the first layer 804 or the third layer 802, the thickness of the second layer 803 is preferably approximately 10 to 100 nm.

There are no particular limitation on the second organic compound as long as it is a light-emitting organic compound. Examples of the second organic compound include, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(joulolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-$N,C^{2'}$]iridium(picolinate) (abbreviation: Flrpic), bis{2-[3',5'-bis(trifluoromethyl)phenyl]pyridinato-$N,C^{2'}$}iridium(picolinate) (abbreviation: $Ir(CF_3 ppy)_2(pic)$), tris(2-phenylpyridinato-$N,C^{2'}$)iridium (abbreviation: $Ir(ppy)_3$), bis(2-phenylpyridinato-$N,C^{2'}$)iridium (acetylacetonate) (abbreviation: $Ir(ppy)_2(acac)$), bis[2-(2'-thienyl)pyridinato-$N,C^{3'}$]iridium(acetylacetonate) (abbreviation: $Ir(thp)_2(acac)$), bis(2-phenylquinolinato-$N,C^{2'}$)iridium(acetylacetonate) (abbreviation: $Ir(pq)_2(acac)$), or bis[2-(2'-benzothienyl)pyridinato-$N,C^{3'}$]iridium(acetylacetonate) (abbreviation: $Ir(btp)_2(acac)$).

Further, a triplet excitation light-emitting material containing a metal complex or the like may be used for the second layer 803 in addition to a singlet excitation light-emitting material. For example, among a pixel emitting red light, a pixel emitting green light, and a pixel emitting blue light, a pixel emitting red light whose luminance is reduced by half in a relatively short time is formed using a triplet excitation light-emitting material and the other pixels are formed using a singlet excitation light-emitting material. A triplet excitation light-emitting material has a feature of favorable emission efficiency and less power consumption to obtain the same luminance. In other words, when a triplet excitation light-emitting material is used for a red pixel, only small amount of current needs to be applied to a light-emitting element; thus, reliability can be improved. A pixel emitting red light and a pixel emitting green light may be formed using a triplet excitation light-emitting material and a pixel emitting blue light may be formed using a singlet excitation light-emitting material to achieve low power consumption as well. Low power consumption can be further achieved by forming a light-emitting element emitting green light that has high visibility for human eyes by using a triplet excitation light-emitting material.

The second layer 803 may include not only the second organic compound as described above, which produces light emission, but also another organic compound that is added thereto. Examples of organic compounds that can be added thereto include TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited to these examples. It is preferable that the organic compound, which is added in addition to the second organic compound, have larger excitation energy than excitation energy of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) in a pixel portion by providing the light-emission side of the pixel with a filter which transmits light of an emission wavelength range of the light. By providing a filter, a circularly polarizing plate or the like that has been conventionally required can be omitted, and further, the loss of light emitted from the light-emitting layer can be eliminated. Further, change in a color tone, which occurs when a pixel portion (display screen) is obliquely seen, can be reduced.

Either a low molecular based organic light-emitting material or a high molecular based organic light-emitting material may be used for a material of the second layer 803. A high molecular based organic light-emitting material is physically stronger as compared with a low molecular based material and is superior in durability of the element. In addition, a high molecular based organic light-emitting material can be formed by coating; therefore, the element can be relatively easily manufactured.

The emission color is determined depending on a material forming the light-emitting layer; therefore, a light-emitting element which exhibits desired light emission can be formed by selecting a material for the light-emitting layer. As a high molecular based electroluminescent material which can be used for forming the light-emitting layer, a polyparaphenylene-vinylene-based material, a polyparaphenylene-based material, a polythiophene-based material, or a polyfluorene-based material can be used.

As the polyparaphenylene-vinylene-based material, a derivative of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene][POPT], or poly[3-(4-octylphenyl)-2,2bithiophene][PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light emitted from the second organic compound is not easily quenched by the inorganic compound, and various kinds of metal oxides and metal nitrides can be used. In particular, metal oxide having a metal that belongs to Group 13 or 14 of the periodic table is preferable because light emitted from the second organic compound is not easily quenched, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed using the above materials emits light by being forwardly biased. A pixel of a display device formed using a light-emitting element can be driven by a simple matrix mode or an active matrix mode. In any case, each pixel emits light by applying a forward bias thereto at a specific timing; however, the pixel is in a non-light-emitting state for a certain period. Reliability of a light-emitting element can be improved by applying a reverse bias in the non-light-emitting time. In a light-emitting element, there is a degradation mode in which emission intensity is decreased under constant driving conditions or a degradation mode in which a non-light-emitting region is enlarged in the pixel and luminance is apparently decreased. However, progression of degradation can be slowed down by alternating current driving where bias is applied forwardly and reversely; thus, reliability of a light-emitting display device can be improved. Additionally, either digital driving or analog driving can be applied.

A color filter (colored layer) may be formed over a sealing substrate. The color filter (colored layer) can be formed by an evaporation method or a droplet discharging method. High-resolution display can be performed with the use of the color filter (colored layer). This is because a broad peak can be modified to be sharp in an emission spectrum of each of R, G, and B by the color filter (colored layer).

Full color display can be performed by forming a material exhibiting light of a single color and combining with a color filter or a color conversion layer. Preferably, the color filter (colored layer) or the color conversion layer may be formed over, for example, a second substrate (a sealing substrate) and attached to a substrate.

Needless to say, display of a single color emission may also be performed. For example, an area color type display device may be manufactured using single color emission. The area color type is suitable for a passive matrix display portion, and can mainly display characters and symbols.

Figure 18A:
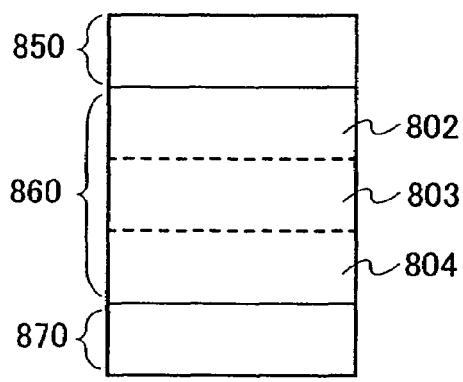
FIGS. 18A to 18D are views each illustrating a structure of a light-emitting element applicable to the present invention.
Figure 18B:
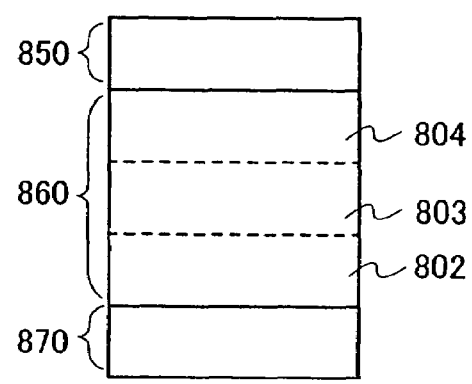

It is necessary that materials of the first electrode layer 870 and the second electrode layer 850 are selected considering the work function. The first electrode layer 870 and the second electrode layer 850 can be either an anode or a cathode depending on the pixel structure. In a case where polarity of a driving thin film transistor is a p-channel type, the first electrode layer 870 preferably serves as an anode and the second electrode layer 850 preferably serves as a cathode as shown in FIG. 18A. In a case where polarity of the driving thin film transistor is an n-channel type, the first electrode layer 870 preferably serves as a cathode and the second electrode layer 850 preferably serves as an anode as shown in FIG. 18B. Materials that can be used for the first electrode layer 870 and the second electrode layer 850 will be described. It is preferable to use a material having a high work function (specifically, a material having a work function greater than or equal to 4.5 eV) for one of the first electrode layer 870 and the second electrode layer 850, which serves as an anode, and a material having a low work function (specifically, a material having a work function less than or equal to 3.5 eV) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 18A and 18B have a structure where light is extracted through the first electrode layer 870; thus, the second electrode layer 850 does not necessarily have a light-transmitting property. The second electrode layer 850 is preferably formed using a film mainly containing an element or an alloy material or a compound material containing the element as its main component, or using a stacked film thereof, in a total film thickness ranging from 100 nm to 800 nm. The element, the alloy material, and the compound material are selected from Ti, TiN, $TiSi_xN_y$, Ni, W, $WSi_x$, $WN_x$, $WSi_xN_y$, NbN, Cr, Pt, Zn, Sn, In, Ta, Al, Cu, Au, Ag, Mg, Ca, Li and Mo.

The second electrode layer 850 can be formed by an evaporation method, a sputtering method, a CVD method, a printing method, a droplet discharging method, or the like.

In addition, when the second electrode layer 850 is formed using a light-transmitting conductive material similarly to the material used for the first electrode layer 870, light can also be extracted from the second electrode layer 850, and a dual emission structure can be obtained, in which light emitted from the light-emitting element is emitted through both the first electrode layer 870 and the second electrode layer 850.

Note that the light-emitting element of the present invention can have variations by changing types of the first electrode layer 870 and the second electrode layer 850.

FIG. 18B shows a case where the third layer 802, the second layer 803, and the first layer 804 are sequentially provided from the first electrode layer 870 side in the electroluminescent layer 860.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound. Such functions as a high carrier-injecting property and carrier-transporting property are not obtainable from only either one of the organic compound or the inorganic compound. In addition, the first layer 804 and the third layer 802 are particularly required to be layers in which an organic compound and an inorganic compound are combined when provided on the first electrode layer 870 side, and may also contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method for evaporating both an organic compound and an inorganic compound by resistance heating. Besides, for co-evaporation, an inorganic compound may be evaporated by an electron beam (EB) while evaporating an organic compound by resistance heating. Moreover, the methods also include a method for sputtering an inorganic compound while evaporating an organic compound by resistance heating to deposit the both at the same time. In addition, the electroluminescent layer may also be formed by a wet method.

In the same manner, for the first electrode layer 870 and the second electrode layer 850, an evaporation method by resistance heating, an EB evaporation method, a sputtering method, a wet method, or the like can be used.

Figure 18C:
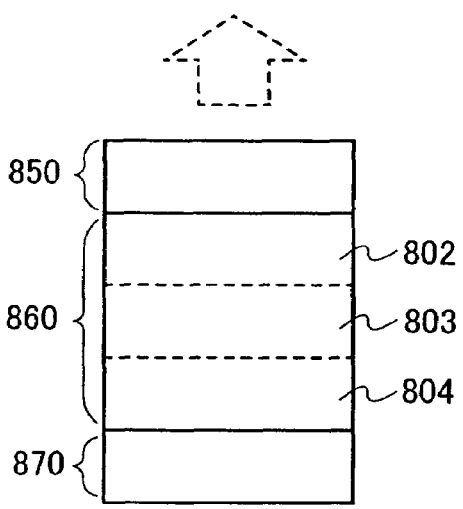
Figure 18D:
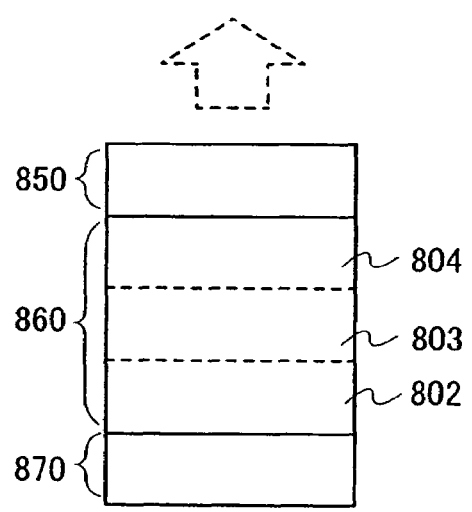

In FIG. 18C, an electrode layer having reflectiveness is used for the first electrode layer 870, and an electrode layer having a light-transmitting property is used for the second electrode layer 850 in the structure of FIG. 18A. Light emitted from the light-emitting element is reflected on the first electrode layer 870, transmitted through the second electrode layer 850, and emitted. In the same manner, in FIG. 18D, an electrode layer having reflectiveness is used for the first electrode layer 870, and an electrode layer having a light-transmitting property is used for the second electrode layer 850 in the structure of FIG. 18B. Light emitted from the light-emitting element is reflected on the first electrode layer 870, transmitted through the second electrode layer 850, and emitted.

In the display device of this embodiment mode shown in FIGS. 1A and 1B, the light emitted from the light-emitting element 190 is emitted from the first electrode layer 396 side and passes through in a direction of an arrow shown in FIG. 1B.

It is effective to provide a passivation film so as to cover the second electrode layer 189. As the passivation film, an insulating film containing silicon nitride, silicon oxide, silicon oxynitride (SiON), silicon nitride oxide (SiNO), aluminum nitride (AlN), aluminum oxynitride (AlON), aluminum nitride oxide containing nitrogen more than oxygen (AlNO), aluminum oxide, diamond-like carbon (DLC), or a nitrogen-containing carbon film (CN) can be used as a single layer or in combination as a stack. Alternatively, a siloxane resin can also be used.

At this time, it is preferable to use a film having favorable coverage as the passivation film, such as a carbon film. In particular, a DLC film is effectively used. A DLC film can be formed at a temperature range of a room temperature to 100° C.; therefore, it can be easily formed over the electroluminescent layer 188 with low heat resistance as well. The DLC film can be formed by a plasma CVD method (typically an RF plasma CVD method, a microwave CVD method, an electron cyclotron resonant (ECR) CVD method, a thermal filament CVD method, or the like), a combustion method, a sputtering method, an ion beam evaporation method, a laser evaporation method, or the like. A reaction gas used for forming the DLC film is a hydrogen gas and a hydrocarbon-based gas (for example, $CH_4$, $C_2H_2$, $C_6H_6$, or the like), which are ionized by glow discharging, and thus generated ions are accelerated to collide with a negatively self-biased cathode, thereby the DLC film is formed. Moreover, the CN film is preferably formed using a $C_2H_4$ gas and a $N_2$ gas as reaction gases. The DLC film has a high blocking effect against oxygen and can suppress the oxidization of the electroluminescent layer 188.

Therefore, a problem can be prevented in that the electroluminescent layer 188 is oxidized during a subsequent sealing step.

In this manner, the substrate 100 over which the light-emitting element 190 is formed and a sealing substrate 195 are fixed to each other by a sealing material 192, thereby the light-emitting element is sealed (see FIGS. 1A and 1B). In the display device of the present invention, the sealing material 192 and the insulating layer 186 are formed apart from each other so as not to have a contact. When the sealing material and the insulating layer 186 are formed apart from each other in this manner, moisture does not easily enter even when using an insulating material formed of an organic material having a high moisture absorbing property for the insulating layer 186. Thus, degradation of a light-emitting element can be prevented and reliability of a display device is improved. As the sealing material 192, it is preferable to use visible light curable, ultraviolet curable, or heat curable resin representatively. For example, an epoxy resin such as a bisphenol A type liquid resin, a bisphenol A type solid resin, a bromine-containing epoxy resin, a bisphenol F type resin, a bisphenol AD type resin, a phenol resin, a cresol resin, a novolac resin, a cyclic aliphatic epoxy resin, an epi-bis epoxy resin, a glycidyl ester based resin, a glycidyl amine based resin, a heterocyclic epoxy resin, or a modified epoxy resin can be used. It is to be noted that a region surrounded by the sealing material may be filled with a filler 193. Alternatively, the region may be filled and sealed with nitrogen or the like by sealing under a nitrogen atmosphere. Since a bottom emission type is employed in this embodiment mode, the filler 193 is not required to have a light-transmitting property. However, in the case of a structure in which light is extracted through the filler 193, the filler 193 is required to have a light-transmitting property. Typically, visible light curable, ultraviolet curable, or heat curable epoxy resin is preferably used. Through the aforementioned steps, a display device having a display function using a light-emitting element in this embodiment mode is completed. The filler can be dropped in a liquid state so as to be filled in the display device.

Figure 15:
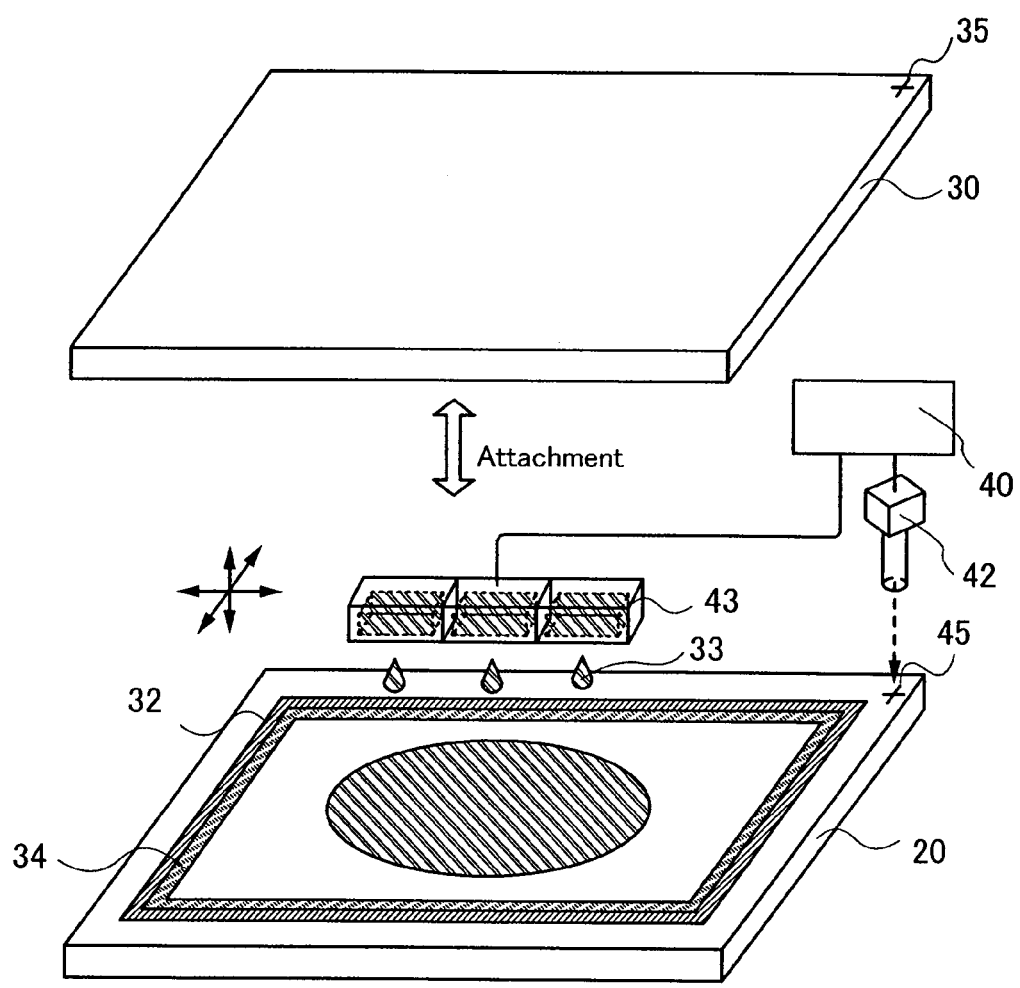
FIG. 15 is a view illustrating a drop fill method applicable to the present invention.

A drop fill method using a dispenser method is described with reference to FIG. 15. The drop fill method shown in FIG. 15 includes a controlling device 40, an image pick-up unit 42, a head 43, a filler 33, markers 35 and 45, a barrier layer 34, a sealing material 32, a TFT substrate 30, and a counter substrate 20. A closed loop is formed by the sealing material 32, and then the filler 33 is dropped therein from the head 43 once or plural times. A filler material having high viscosity is continuously discharged and attached to a formation region without being cut off. On the other hand, a filler material having low viscosity is intermittently discharged and dropped as shown in FIG. 15. At that time, in order to prevent reaction of the sealing material 32 and the filler 33, the barrier layer 34 may be provided. Subsequently, the substrates are attached in vacuum and cured by ultraviolet; thereby filled with the filler. By using a substance having a moisture absorbing property such as a drying agent as the filler, a further moisture absorbing effect is obtained and degradation of elements can be prevented.

In order to prevent degradation of elements due to moisture, a drying agent is provided in the EL display panel. In this embodiment mode, the drying agent is provided in a depression portion formed in the sealing substrate so as to surround the pixel region, therefore, it does not disturb thin design. Further, as a large moisture absorbing area is provided by forming a drying agent in a region corresponding to the gate wiring layer, a high moisture absorbing effect can be obtained. In addition, since a drying agent is formed over the gate wiring layer which does not directly emit light, reduction in light extracting efficiency can be prevented.

It is to be noted in this embodiment mode that the light-emitting element is sealed by a glass substrate. A sealing method is performed in order to protect the light-emitting element from moisture, and any of a method for mechanically sealing with a cover material, a method for filling and sealing with a heat curable resin or an ultraviolet curable resin, a method for filling with a thin film having a high barrier property such as metal oxide, nitride, or the like is used. As the cover material, glass, ceramics, plastics, or metal can be used, which is required to have a light-transmitting property when light is emitted to the cover material side. The cover material and the substrate over which the aforementioned light-emitting element is formed are attached to each other using a sealing material such as a heat curable resin or an ultraviolet curable resin. Then, the resin is cured by thermal treatment or ultraviolet irradiation treatment to form an enclosed space. It is also effective to provide a moisture absorbing material typified by barium oxide in the enclosed space. The moisture absorbing material may be provided on a sealing material, over or in the periphery of the partition which does not disturb light from the light-emitting element. Further, it is possible to fill the space between the cover material and the substrate over which the light-emitting element is formed with a heat curable resin or an ultraviolet curable resin. In this case, it is effective to add a moisture absorbing material typified by barium oxide in the heat curable resin or ultraviolet curable resin.

Figure 10:
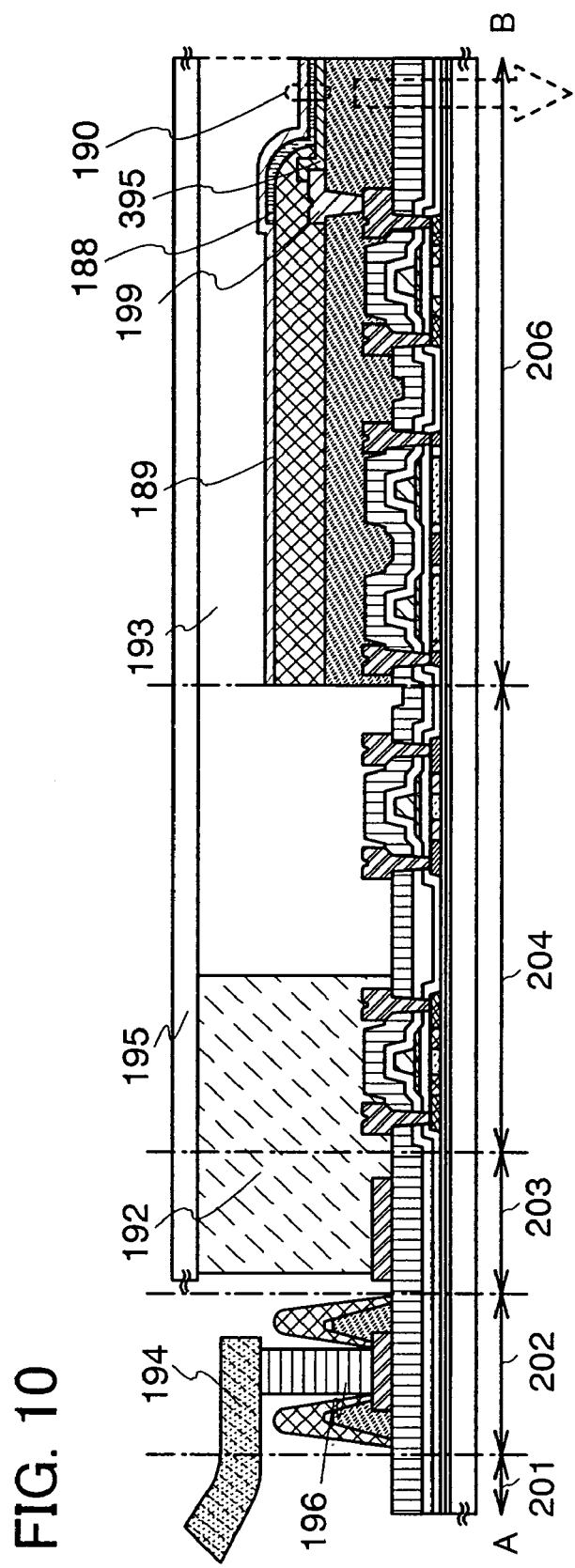
FIG. 10 is a view illustrating a display device of the present invention.

FIG. 10 shows an example in which the source electrode layer or drain electrode layer is connected to the first electrode layer through a wiring layer instead of electrical connection by direct contact between the source electrode layer or drain electrode layer and the first electrode layer. In the display device shown in FIG. 10, the source electrode layer or drain electrode layer of the thin film transistor which drives the light-emitting element and a first electrode layer 395 are electrically connected to each other through a wiring layer 199. Moreover, in FIG. 10, part of the first electrode layer 395 is connected to the wiring layer 199 to be stacked thereover; however, the first electrode layer 395 may be formed in advance and then the wiring layer 199 may be formed so as to be on and in contact with the first electrode layer 395.

In this embodiment mode, an FPC 194 is connected to the terminal electrode layer 178 by an anisotropic conductive layer 196 at the external terminal connection region 202 so as to have electrical connection with outside. Moreover, as shown in FIG. 1A that is a top view of the display device, the display device manufactured in this embodiment mode includes a peripheral driver circuit region 207 and a peripheral driver circuit region 208 each having a scanning line driver circuit in addition to the peripheral driver circuit region 204 and a peripheral driver circuit region 209 each having a signal line driver circuit.

In this embodiment mode, the aforementioned circuits are used; however, the present invention is not limited to this and an IC chip may be mounted as a peripheral driver circuit by a COG method or a TAB method. Moreover, a gate line driver circuit and a source line driver circuit may be provided in any number.

Moreover, a driving method to display an image is not particularly limited in a display device of the present invention. For example, a dot sequential driving method, a line sequential driving method, an area sequential driving method, or the like is preferably used. Representatively, a line sequential driving method is used, and a time division grayscale driving method or an area grayscale driving method may be used appropriately. Further, a video signal input to the source line of the display device may be an analog signal or a digital signal. A driver circuit or the like is to be designed appropriately in accordance with the video signal.

Furthermore, in a display device using a digital video signal, a video signal input to a pixel includes a video signal at a constant voltage (CV) and a video signal at a constant current (CC). The video signal at a constant voltage (CV) is further classified into a video signal with a constant voltage applied to a light-emitting element (CVCV), and a video signal with a constant current applied to a light-emitting element (CVCC). In addition, the video signal at a constant current (CC) is classified into a video signal with a constant voltage applied to a light-emitting element (CCCV), and a video signal with a constant current applied to a light-emitting element (CCCC).

By using the present invention, a highly reliable display device having excellent visibility and a display function of high image quality can be provided. Further, such a display device can be manufactured with high reliability, without requiring a complicated step.

Embodiment Mode 2

In this embodiment mode, a highly reliable display device having excellent visibility and a display function of high image quality at high contrast and a method for manufacturing the display device are described in detail with reference to FIGS. 7A and 7B, FIG. 8, and FIG. 9. This embodiment mode shows an example in which a second interlayer insulating layer is not formed in the display device manufactured in Embodiment Mode 1. Therefore, identical portions or portions having the same function are denoted by the same reference numerals and descriptions thereof are omitted.

As shown in Embodiment Mode 1, a p-channel thin film transistor 173, an n-channel thin film transistor 174, an n-channel thin film transistor 175, and a p-channel thin film transistor 176 are formed over a substrate 100, and an insulating film 167 and an insulating film 168 are formed. In each thin film transistor, a source electrode layer or drain electrode layer connected to a source region or drain region of a semiconductor layer is formed. A first electrode layer 185 is formed to be in contact with a source electrode layer or drain electrode layer 172*b* in the p-channel thin film transistor 176 provided in a pixel region 206 (see FIG. 7A).

The first electrode layer 185 may serve as a pixel electrode and may be formed using a material and through a step that are similar to the material and the step of the first electrode layer 396 in Embodiment Mode 1. Specifically, a transparent conductive film formed using a conductive material having a light-transmitting property may be used for the first electrode layer 185 that is a light-transmitting electrode layer, and indium oxide containing tungsten oxide, indium zinc oxide containing tungsten oxide, indium oxide containing titanium oxide, indium tin oxide containing titanium oxide, or the like can be used. Further, silicon oxide may be added to indium oxide containing tungsten oxide, indium zinc oxide containing tungsten oxide, indium oxide containing titanium oxide, or indium tin oxide containing titanium oxide.

An insulating layer 186 is formed so as to cover an end portion of the first electrode layer 185 and the thin film transistors (see FIG. 7B). Acrylic is used for the insulating layer 186 in this embodiment mode. An electroluminescent layer 188 is formed over the first electrode layer 185, a second electrode layer 189 is stacked thereover, and a light-emitting element 190 is formed. The terminal electrode layer 178 is attached to an FPC 194 through an anisotropic conductive layer 196 in an external terminal connection region 202. The substrate 100 is attached to a sealing substrate 195 with a sealing material 192, and the inside of the display device is filled with a filler 193 (see FIG. 8). In the display device of the present invention, the sealing material 192 and the insulating layer 186 are formed apart so as not to be in contact with each other. When the sealing material 192 and the insulating layer 186 are formed apart as described above, moisture does not easily enter, degradation of the light-emitting element can be prevented, and reliability of the display device is improved, even in a case where an insulating material using an organic material having a high moisture absorbing property is used for the insulating layer 186.

Figure 9:
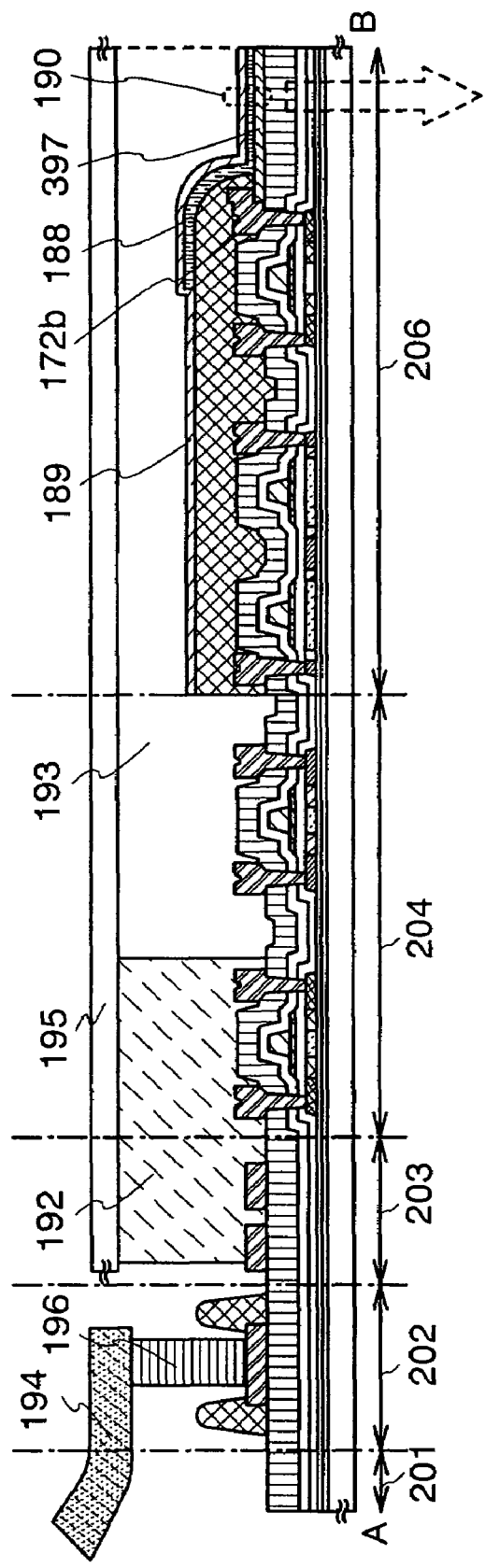
FIG. 9 is a view illustrating a display device of the present invention.

In a display device shown in FIG. 9, a first electrode layer 397 is selectively formed over the insulating film 168 before forming the source electrode layer or drain electrode layer 172*b* connected to the p-channel thin film transistor 176. In this case, the source electrode layer or drain electrode layer 172*b* and the first electrode layer 397 are connected to each other so that the source electrode layer or drain electrode layer 172*b* is stacked over the first electrode layer 397 in this embodiment mode. When the first electrode layer 397 is formed before the source electrode layer or drain electrode layer 172*b*, the first electrode layer 397 can be formed over a flat formation region, and coverage is favorable. Moreover, there is an advantage that the first electrode layer 397 can be formed with favorable planarity because polishing treatment such as CMP can be sufficiently performed.

In this embodiment mode, channel doping is selectively performed with respect to the semiconductor layer of the thin film transistor included in the display device. Thus, an impurity element imparting p-type conductivity, which is intended to correct a threshold, is selectively added to the channel formation regions of the p-channel thin film transistor 173, the n-channel thin film transistor 174, and the n-channel thin film transistor 175. However, the impurity element imparting p-type conductivity is not added to the channel region of the p-channel thin film transistor 176.

Accordingly, in this embodiment mode, the concentration of an impurity element imparting p-type conductivity contained in the channel formation region of the p-channel thin film transistor 176 provided in a pixel is made lower than the concentration of the impurity element imparting p-type conductivity contained in a channel region of other thin film transistors manufactured in a display device, such as the p-channel thin film transistor 173, the n-channel thin film transistor 174, or the n-channel thin film transistor 175.

When channel doping is performed, a threshold of a thin film transistor is shifted to be higher (toward the plus side), and thus a threshold of a p-channel thin film transistor in which channel doping is not performed and the concentration of the impurity element is made low is lower (on the minus side). Accordingly, a value of cutoff current (Icut), which is a value of drain current ID flowing when gate voltage VG is 0 V, becomes low. In a pixel, in a case where the light-emitting element is made in a non-light emission state and black display is performed in a pixel, faint light emission caused by current flowing in a light-emitting element connected to a driving p-channel thin film transistor can be prevented. Further, the lower a value of cutoff current (Icut), the more low power consumption can be realized.

The higher the temperature of usage environment of a thin film transistor, the more a threshold is shifted toward the direction of normally-ON. That is, a threshold is shifted to be higher (toward the plus direction) in a p-channel thin film transistor (shifted to be lower (toward the minus direction) in an n-channel thin film transistor). Thus, a value of cutoff current (Icut) becomes high and further, a value of current flowing in a light-emitting element becomes high in black display accompanied with a change in threshold. Accordingly, luminance of light emission from a light-emitting element generated in black display becomes high, and thus a problem of a display defect of a pixel becomes more apparent. However, like the present invention, by using a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and selectivity of usage environment such as indoor or outdoor is increased, leading to high utility value.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

By using the present invention, a highly reliable display device having excellent visibility and a display function of high image quality can be provided. Further, such a display device can be manufactured with high reliability, without requiring a complicated step.

Embodiment Mode 3

A display device having a light-emitting element can be formed by applying the present invention. Light emitted form the light-emitting element performs any of bottom emission, top emission, and dual emission. In this embodiment mode, an example of a highly reliable display device having excellent visibility and a display function of high image quality at high contrast, which performs top emission or dual emission, is described with reference to FIG. 11 and FIG. 12.

Figure 12:
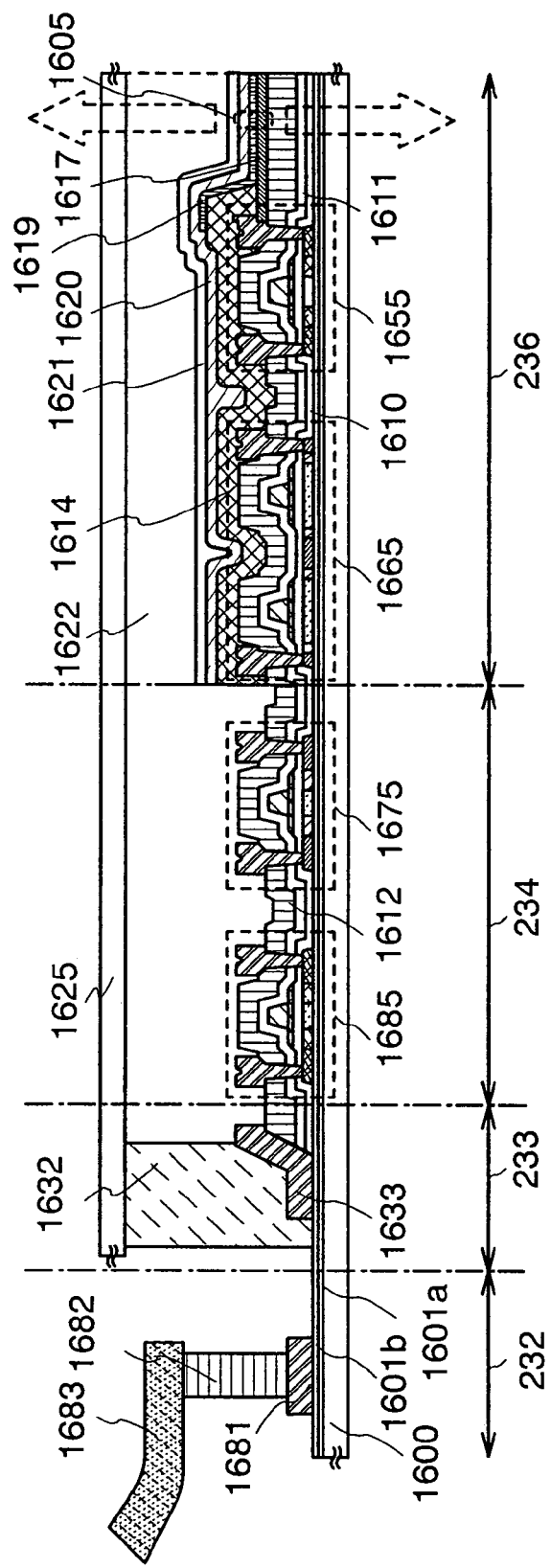
FIG. 12 is a view illustrating a display device of the present invention.

A display device shown in FIG. 12 includes an element substrate 1600, thin film transistors 1655, 1665, 1675, and 1685, a first electrode layer 1617, a light-emitting layer 1619, a second electrode layer 1620, a filler 1622, a sealing material 1632, insulating films 1601a and 1601b, a gate insulating layer 1610, insulating films 1611 and 1612, an insulating layer 1614, a sealing substrate 1625, a wiring layer 1633, a terminal electrode layer 1681, an anisotropic conductive layer 1682, and an FPC 1683. The display device has an external terminal connection region 232, a sealing region 233, a peripheral driver circuit region 234, and a pixel region 236. The filler 1622 is in a state of a liquid composition and can be formed by a drop method. The element substrate 1600 in which the filler is formed by a drop method and the sealing substrate 1625 are attached to each other, and thus a light-emitting display device is sealed.

The display device of FIG. 12 is a dual emission type, in which light is emitted from both the element substrate 1600 side and the sealing substrate 1625 side in directions indicated by arrows. Therefore, a light-transmitting electrode layer is used for both the first electrode layer 1617 and the second electrode layer 1620.

In this embodiment mode, the first electrode layer 1617 and the second electrode layer 1620 that are light-transmitting electrode layers may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

In addition, even in the case of a non-light-transmitting material such as a metal film, when the thickness is made thin (preferably, about 5 to 30 nm) so as to be able to transmit light, light can be emitted from the first electrode layer 1617 and the second electrode layer 1620. As a metal thin film that can be used for the first electrode layer 1617 and the second electrode layer 1620, a conductive film formed of titanium, tungsten, nickel, gold, platinum, silver, aluminum, magnesium, calcium, lithium, or an alloy thereof, or the like can be used.

As described above, in the display device of FIG. 12, light emitted from a light-emitting element 1605 passes through both the first electrode layer 1617 and the second electrode layer 1620, whereby light is emitted from both sides.

Figure 11:
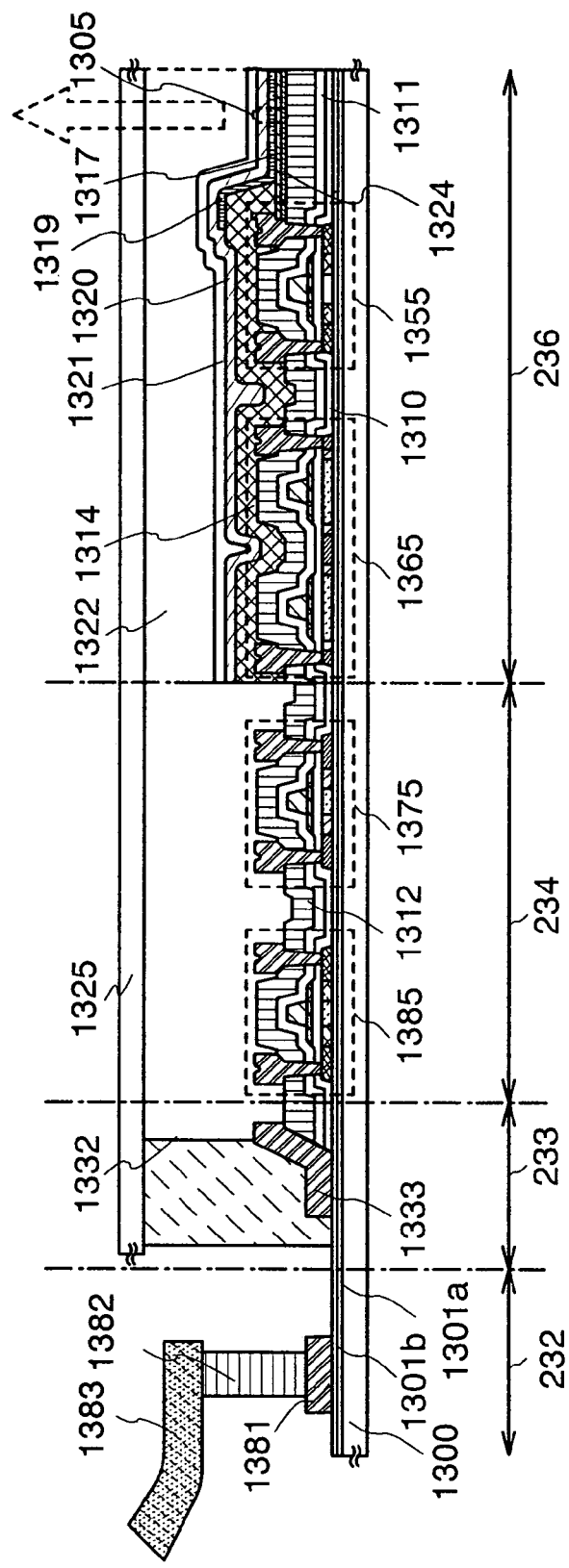
FIG. 11 is a view illustrating a display device of the present invention.

A display device of FIG. 11 has a top emission structure in which light is emitted in a direction indicated by an arrow. FIG. 11 shows a display device, which includes an element substrate 1300, thin film transistors 1355, 1365, 1375, and 1385, a wiring layer 1324, a first electrode layer 1317, a light-emitting layer 1319, a second electrode layer 1320, a protective film 1321, a filler 1322, a sealing material 1332, insulating films 1301a and 1301b, a gate insulating layer 1310, insulating films 1311 and 1312, an insulating layer 1314, a sealing substrate 1325, a wiring layer 1333, a terminal electrode layer 1381, an anisotropic conductive layer 1382, and an FPC 1383.

In each of the display devices shown in FIGS. 12 and 11, the insulating layer stacked over the terminal electrode layer is removed by etching. With a structure where an insulating layer with moisture permeability is not provided in the periphery of a terminal electrode layer, reliability is further improved. The display device shown in FIG. 11 includes an external terminal connection region 232, a sealing region 233, a peripheral driver circuit region 234, and a pixel region 236. The display device of FIG. 11 has a structure in which the wiring layer 1324 that is a metal layer having reflectiveness is formed below the first electrode layer 1317 in the above-described dual emission display device shown in FIG. 12. The first electrode layer 1317 that is a transparent conductive film is formed over the wiring layer 1324. As the wiring layer 1324, a conductive film formed of titanium, tungsten, nickel, gold, platinum, silver, copper, tantalum, molybdenum, aluminum, magnesium, calcium, lithium, or alloy thereof, or the like may be used as long as the material has reflectiveness. Preferably, a substance having high reflectiveness in a visible light region is used, and a TiN film is used in this embodiment mode. In addition, the first electrode layer 1317 may be formed of a conductive film, and in that case, the wiring layer 1324 having reflectiveness may not be provided.

The first electrode layer 1317 and the second electrode layer 1320 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

In addition, even in the case of a non-light-transmitting material such as a metal film, when the thickness is made thin (preferably, approximately 5 to 30 nm) so as to be able to transmit light, light can be emitted through the second electrode layer 1320. As a metal thin film that can be used for the second electrode layer 1320, a conductive film formed of titanium, tungsten, nickel, gold, platinum, silver, aluminum, magnesium, calcium, lithium, or an alloy thereof, or the like can be used.

A pixel of a display device that can be formed using a light-emitting element can be driven by a simple matrix mode or an active matrix mode. In addition, either digital driving or analog driving can be employed.

A color filter (colored layer) may be formed over the sealing substrate. The color filter (colored layer) can be formed by an evaporation method or a droplet discharging method. With the use of the color filter (colored layer), high-definition display can be performed. This is because a broad peak can be modified to be sharp in the emission spectrum of each of R, Q and B by the color filter (colored layer).

Full color display can be performed by formation of a material emitting light of a single color and combination of the material with a color filter or a color conversion layer. The color filter (colored layer) or the color conversion layer may be formed over, for example, the sealing substrate, and the sealing substrate may be attached to the element substrate.

It is needless to say that display of single color emission may also be performed. For example, an area color type display device may be manufactured by using single color emission. The area color type is suitable for a passive matrix display portion, and can mainly display characters and symbols.

In this embodiment mode, channel doping is performed with respect to the semiconductor layer of the thin film transistor included in the display device. Thus, an impurity element imparting p-type conductivity, which is intended to correct a threshold, is selectively added to the channel formation regions of the thin film transistors 1385 and 1685 that are p-channel thin film transistors, the thin film transistors 1375 and 1675 that are n-channel thin film transistors, and the thin film transistors 1365 and 1665 that are n-channel thin film transistors. However, the impurity element imparting p-type conductivity is not added to the channel region of the thin film transistors 1355 and 1655 that are p-channel thin film transistors.

Accordingly, in this embodiment mode, the concentration of an impurity element imparting p-type conductivity contained in the channel formation regions of the thin film transistors 1355 and 1655 that are the driving p-channel thin film transistors provided in a pixel is made lower than the concentration of the impurity element imparting p-type conductivity contained in channel regions of other thin film transistors such as the thin film transistors 1385 and 1685 that are p-channel thin film transistors, the thin film transistors 1375 and 1675 that are n-channel thin film transistors, and the thin film transistors 1365 and 1665 that are n-channel thin film transistors.

Needless to say, also in the thin film transistor as described above other than the driving p-channel thin film transistor, the element imparting p-type conductivity may not be selectively added to a channel region thereof. For example, an impurity element imparting p-type conductivity may not be selectively added to a channel region of a thin film transistor or the like used for a scanning line driver circuit (also referred to as a gate driver), a protective circuit provided between a pixel portion and a peripheral driver circuit portion or the like.

Meanwhile, it is preferable that an impurity element imparting p-type conductivity be added to a channel region of a thin film transistor used for a signal line driver circuit (also referred to as a source driver) and required to operate at high speed, or a thin film transistor with low anode voltage, and that a threshold voltage thereof be controlled.

When channel doping is performed, a threshold of a thin film transistor is shifted to be higher (toward the plus side), and thus a threshold of a p-channel thin film transistor in which channel doping is not performed and the concentration of the impurity element is made low is lower (on the minus side). Accordingly, a value of cutoff current (Icut), which is a value of drain current ID flowing when gate voltage VG is 0 V, becomes low. In a pixel, in a case where the light-emitting element is made in a non-light emission state and black display is performed in a pixel, faint light emission caused by current flowing in a light-emitting element connected to a driving p-channel thin film transistor can be prevented. Further, the lower a value of cutoff current (Icut), the more low power consumption can be realized.

The higher the temperature of usage environment of a thin film transistor, the more a threshold is shifted toward the direction of normally-ON. That is, a threshold is shifted to be higher (toward the plus direction) in a p-channel thin film transistor (shifted to be lower (toward the minus direction) in an n-channel thin film transistor). Thus, a value of cutoff current (Icut) becomes high and further, a value of current flowing in a light-emitting element becomes high in black display accompanied with a change in threshold. Accordingly, luminance of light emission from a light-emitting element generated in black display becomes high, and thus a problem of a display defect of a pixel becomes more apparent. However, like the present invention, by using a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and selectivity of usage environment such as indoor or outdoor is increased, leading to high utility value.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

By using the present invention, a highly reliable display device having excellent visibility and a display function of high image quality can be provided. Further, such a display device can be manufactured with high reliability, without requiring a complicated step.

This embodiment mode can be freely combined with Embodiment Mode 1 or 2 described above.

Embodiment Mode 4

In this embodiment mode, a highly reliable display device having excellent visibility and a display function of high image quality at high contrast and a method for manufacturing the display device are described in detail with reference to FIGS. 13A to 13C. This embodiment mode shows an example in which a structure of a gate electrode layer of a thin film transistor is different from the display device manufactured in Embodiment Mode 1. Therefore, identical portions or portions having the same function are denoted by the same reference numerals and descriptions thereof are omitted.

Figure 13A:
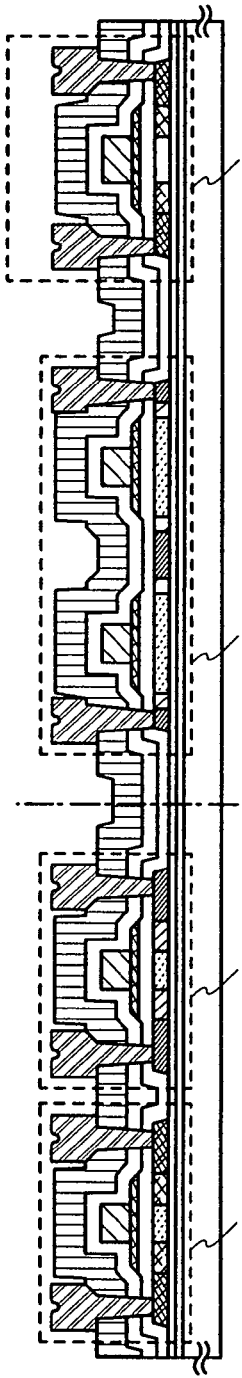
FIGS. 13A to 13C are views each illustrating a method for manufacturing a display device of the present invention.
Figure 13B:
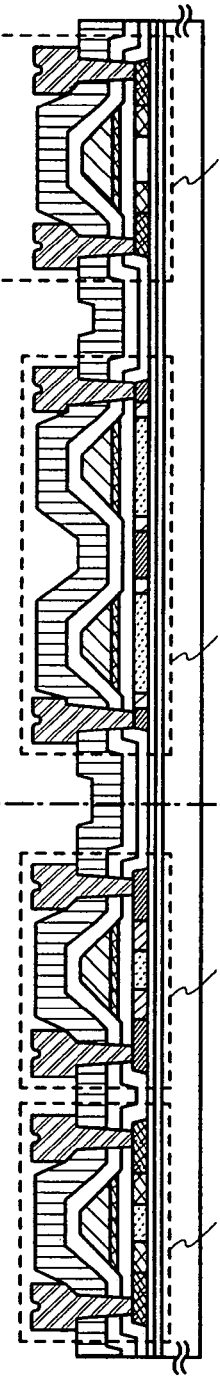
Figure 13C:
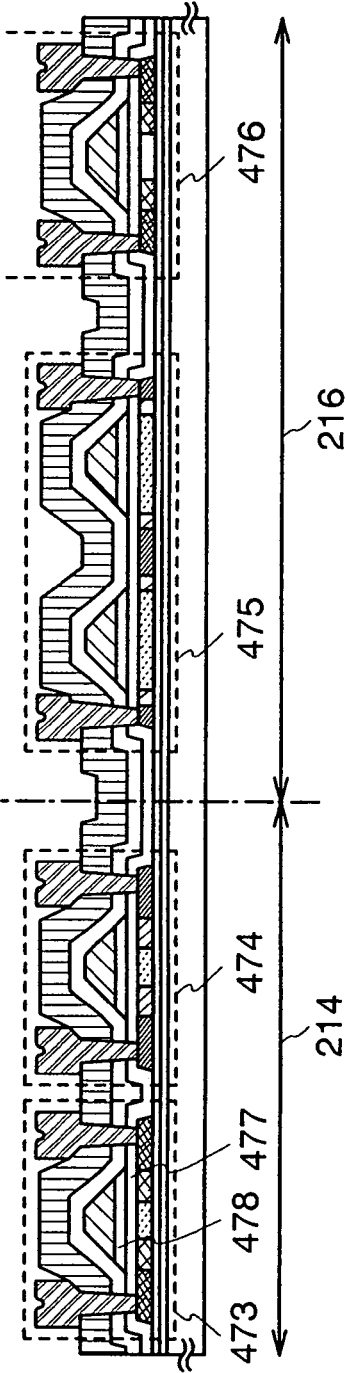

FIGS. 13A to 13C show display devices in a manufacturing step, which correspond to the display device of FIG. 4C shown in Embodiment Mode 1.

In FIG. 13A, thin film transistors 273 and 274 are provided in a peripheral driver circuit region 214, and thin film transistors 275 and 276 are provided in a pixel region 216. A gate electrode layer of the thin film transistor in FIG. 13A is formed using a stack of two conductive films, and the upper gate electrode layer is processed to have a width narrower than that of the lower gate electrode layer. The lower gate electrode layer has a taper shape, and the upper gate electrode layer has a shape in which an angle of a side surface is almost perpendicular. As described here, the gate electrode layer may have a taper shape, or a shape without a taper portion, in which an angle of a side surface is almost perpendicular.

In FIG. 13B, thin film transistors 373 and 374 are provided in the peripheral driver circuit region 214, and thin film transistors 375 and 376 are provided in the pixel region 216. A gate electrode layer of the thin film transistor in FIG. 13B is also formed using a stack of two conductive films, and the upper gate electrode layer and the lower gate electrode layer have a continuous taper shape.

In FIG. 13C, thin film transistors 473 and 474 are provided in the peripheral driver circuit region 214, and thin film transistors 475 and 476 are provided in the pixel region 216. A gate electrode layer of the thin film transistor in FIG. 13C has a single-layer structure and a taper shape. The gate electrode layer may also have a single-layer structure like this.

In the display device shown in FIG. 13C, the gate insulating layer includes a gate insulating layer 477 and a gate insulating layer 478 that is selectively provided over the gate insulating layer. In such a manner, the gate insulating layer 478 may be selectively provided below the gate electrode layer, and an end portion thereof may have a taper shape. In FIG. 13C, both of the end portion of the gate insulating layer 478 and an end portion of the gate electrode layer formed thereover have a taper shape and are formed continuously; however, they may also be formed discontinuously so as to have level difference. In this embodiment mode, the gate insulating layer 477 is formed using a silicon oxynitride film and the gate insulating layer 478 is formed using a silicon nitride film.

As described above, the gate electrode layer can have various structures in accordance with a structure and a shape thereof. Therefore, a display device to be manufactured has also various structures. When an impurity region in a semiconductor layer is formed in a self-alignment manner using the gate electrode layer as a mask, a structure or concentration distribution of the impurity region is changed depending on the structure of the gate electrode layer. By designing in consideration with the above matters, a thin film transistor having a desired function can be manufactured.

This embodiment mode can be freely combined with Embodiment Modes 1 to 3 described above.

Embodiment Mode 5

With the use of a display device formed by the present invention, a television device can be completed. An example of a highly reliable television device having excellent visibility and a display function of high image quality at high contrast is described.

Figure 23:
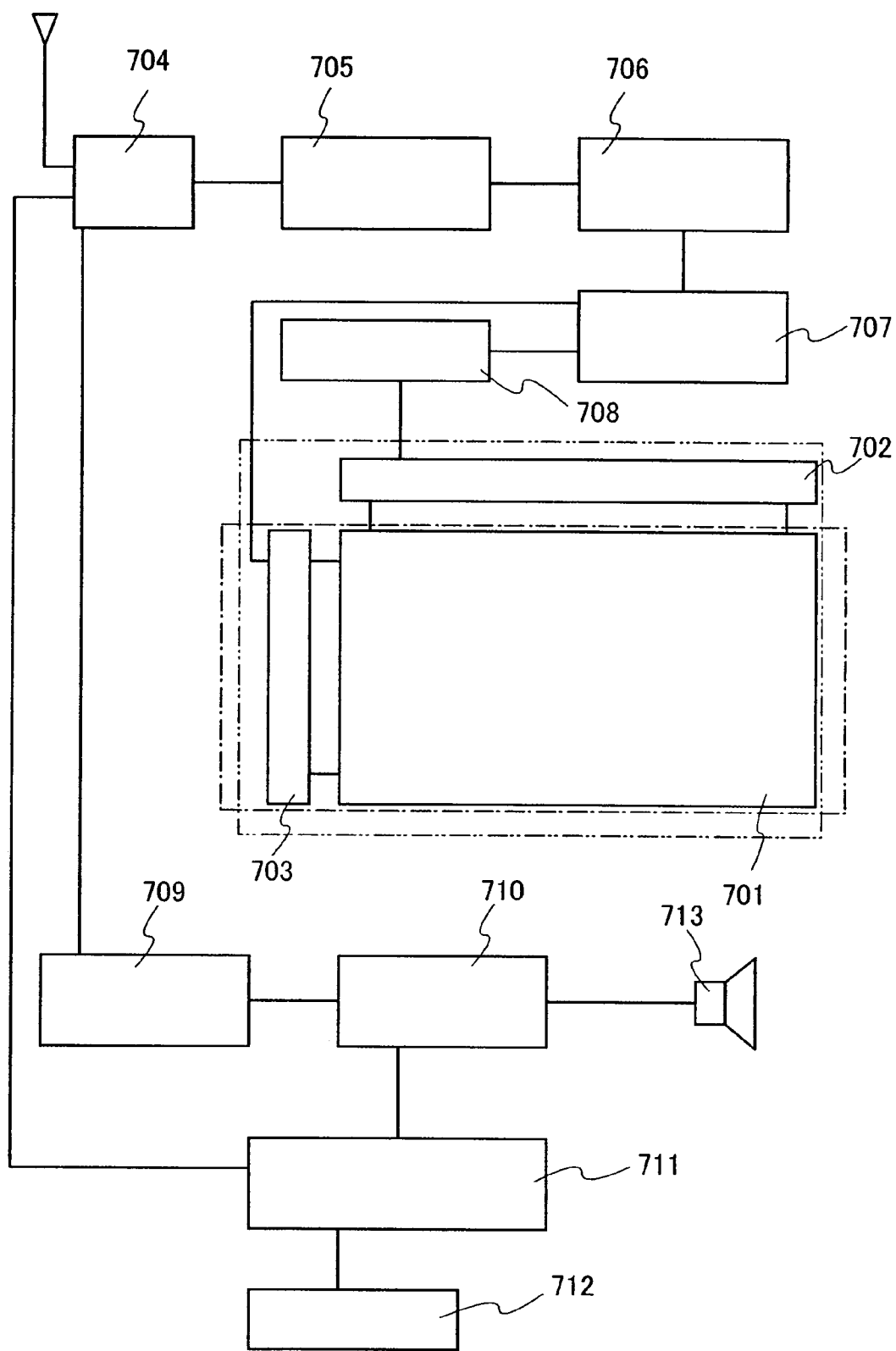
FIG. 23 is a block diagram showing a main structure of an electronic device to which the present invention is applied.

FIG. 23 is a block diagram showing a main structure of a television device (in this embodiment mode, an EL television device). As for a display panel, any mode of the following may be employed: in the structure shown in FIG. 16A, a case where only a pixel portion 701 is formed and a scanning line side driver circuit 703 and a signal line side driver circuit 702 are mounted by TAB as shown in FIG. 17B; in the structure shown in FIG. 17A, a case where only the pixel portion 701 is formed and the scanning line side driver circuit 703 and the signal line side driver circuit 702 are mounted by COG as shown in FIG. 17A; a case where a TFT is formed as shown in FIG. 16B, the pixel portion 701 and the scanning line side driver circuit 703 are formed in an integrated manner over a substrate, and the signal line side driver circuit 702 is independently mounted as a driver IC; and a case where the pixel portion 701, the signal line side driver circuit 702, and the scanning line side driver circuit 703 are formed in an integrated manner over a substrate as shown in FIG. 16C; and the like.

In addition, as another structure of an external circuit, a video signal amplifier circuit 705 which amplifies a video signal among signals received by a tuner 704, a video signal processing circuit 706 which converts the signals output from the video signal amplifier circuit 705 into chrominance signals corresponding to each color of red, green, and blue, a control circuit 707 which converts the video signal into an input specification of a driver IC, or the like are provided on the input side of the video signal. The control circuit 707 outputs signals to both the scanning line side and the signal line side. In the case of digital driving, a signal dividing circuit 708 may be provided on the signal line side and an input digital signal may be divided into m pieces to be supplied.

An audio signal among signals received by the tuner 704 is sent to an audio signal amplifier circuit 709 and is supplied to a speaker 713 through an audio signal processing circuit 710. A control circuit 711 receives control information of a receiving station (reception frequency) or sound volume from an input portion 712 and transmits signals to the tuner 704 or the audio signal processing circuit 710.

Figure 20A:
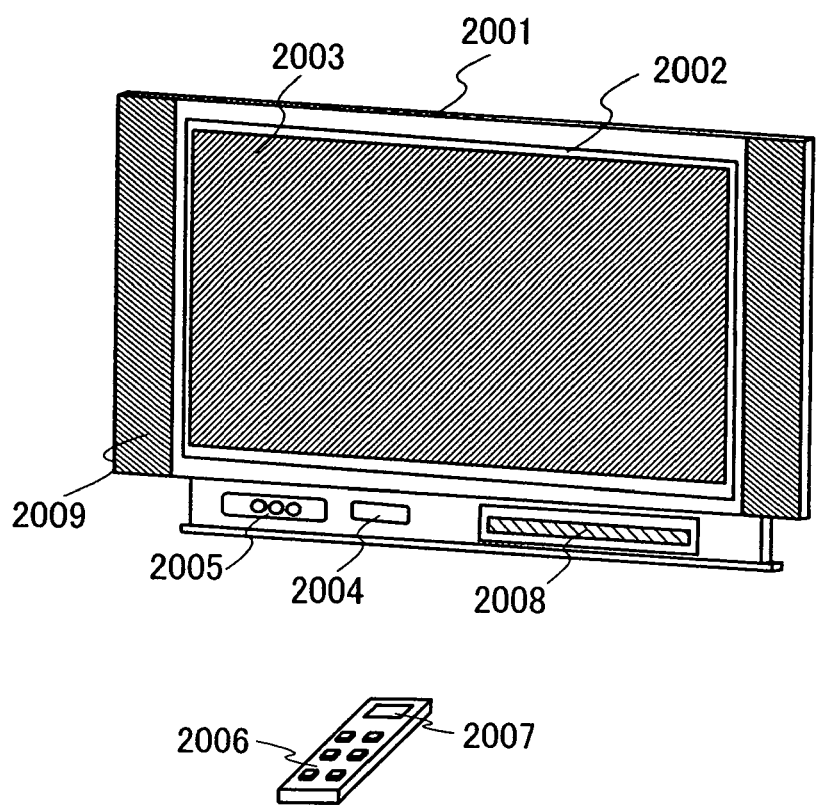
FIGS. 20A and 20B are views each showing an electronic device to which the present invention is applied.
Figure 20B:
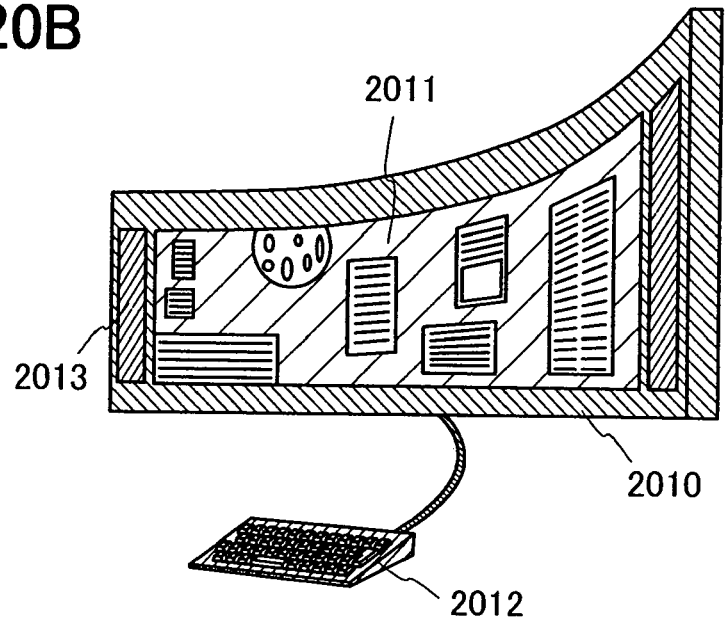

A television device can be completed by incorporating such a display module into a chassis as shown in FIGS. 20A and 20B. A display panel as shown in FIGS. 1A and 1B also provided with an FPC is generally also referred to as an EL display module. Therefore, when the EL display module as shown in FIGS. 1A and 1B is used, an EL television device can be completed. A main screen 2003 is formed using the display module, and a speaker portion 2009, an operation switch, and the like are provided as its accessory equipment. Thus, a television device can be completed by the present invention.

Further, reflected light of light entering from outside may be shielded using a phase difference plate or a polarizing plate. In the case of a top emission display device, an insulating layer to be a partition wall may be colored and used as a black matrix. The partition wall can also be formed by a droplet discharging method or the like. Carbon black or the like may be mixed into a black resin of a pigment material or a resin material such as polyimide, and a stack thereof may also be used. By a droplet discharging method, different materials may be discharged to the same region plural times to form the partition wall. A quarter wave plate and a half wave plate may be used as the phase difference plates so that design may be performed so as to be able to control light. As the structure, the light-emitting element, the sealing substrate (sealant), the phase difference plates (a quarter wave plate and a half wave plate), and the polarizing plate are sequentially stacked over a TFT element substrate, in which light emitted from the light-emitting element is transmitted therethrough and emitted outside from the polarizing plate side. The phase difference plates and the polarizing plate may be provided on a side where light is emitted or may be provided on both sides in the case of a dual emission display device in which light is emitted from both the surfaces. In addition, an anti-reflective film may be provided on the outer side of the polarizing plate. Accordingly, a higher-definition and more accurate image can be displayed.

As shown in FIG. 20A, a display panel 2002 utilizing a display element is incorporated into a chassis 2001, and general TV broadcast can be received by a receiver 2005. In addition, by connecting to a communication network by wired or wireless connections via a modem 2004 with the receiver 2005, one-way (from a sender to a receiver) or two-way (between a sender and a receiver or between receivers) information communication can be carried out. The television device can be operated using a switch built in the chassis or a remote control unit 2006 that is separately provided. A display portion 2007 for displaying output information may also be provided in this remote control unit 2006.

Further, the television device may include a sub screen 2008 formed using a second display panel to display channels, volume, or the like, in addition to the main screen 2003. In this structure, the main screen 2003 may be formed using an EL display panel having wide viewing angle, and the sub screen may be formed using a liquid crystal display panel capable of displaying images with lower power consumption. In order to reduce the power consumption preferentially, the main screen 2003 may be formed using a liquid crystal display panel, and the sub screen may be formed using an EL display panel such that the sub screen can flash on and off. Needless to say, both of the main screen and the sub screen can be formed using an EL display panel to which the present invention is applied. By using the present invention, a highly reliable display device can be formed even if a large-sized substrate is used and a number of TFTs and electronic parts are used.

FIG. 20B shows a television device having a large-sized display portion with a size of, for example, 20 to 80 inches. The television device includes a chassis 2010, a keyboard portion 2012 that is an operation portion, a display portion 2011, a speaker portion 2013, and the like. The present invention is applied to manufacturing of the display portion 2011. Since a substance which can be curved is used for a display portion in FIG. 20B, a television device having a curved display portion is formed. In such a manner, a shape of the display portion can be designed freely; therefore, a television device with a desired shape can be manufactured.

By using the present invention, a highly reliable display device having excellent visibility and a display function of high image quality can be manufactured with high reliability, without requiring a complicated step. Thus, a highly reliable and high-performance television device can be manufactured with high productivity.

Needless to say, the present invention can be applied not only to a television device, but also to various use applications; e.g., a large-sized display medium such as an information display board at a railway station, an airport, or the like, or an advertisement display board on a street, as well as a monitor of a personal computer.

Embodiment Mode 6

This embodiment mode is described with reference to FIGS. 21A and 21B. This embodiment mode show an example of a module using a panel including the display device manufactured in Embodiment Modes 1 to 4. In this embodiment mode, an example of a module including a highly reliable display device having excellent visibility and a display function of high image quality at high contrast is described.

Figure 21A:
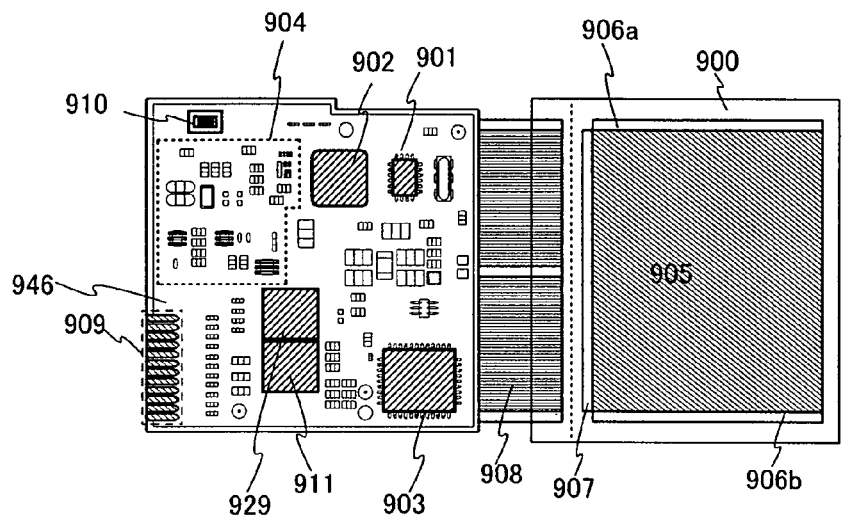
FIGS. 21A and 21B are views each showing an electronic device to which the present invention is applied.

A module of an information terminal shown in FIG. 21A includes a printed wiring board 946 over which a controller 901, a central processing unit (CPU) 902, a memory 911, a power source circuit 903, an audio processing circuit 929, a transmission/reception circuit 904, and other elements such as a resistor, a buffer, and a capacitor element are mounted. In addition, a panel 900 is connected to the printed wiring board 946 through a flexible wiring circuit (FPC) 908.

The panel 900 is provided with a pixel portion 905 having a light-emitting element in each pixel, a first scanning line driver circuit 906a and a second scanning line driver circuit 906b which select a pixel included in the pixel portion 905, and a signal line driver circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

It is to be noted that, in this embodiment mode, the printed wiring board 946 is connected to the panel 900 through the FPC 908; however, the present invention is not limited to this structure. The controller 901, the audio processing circuit 929, the memory 911, the CPU 902, or the power source circuit 903 may be directly mounted on the panel 900 by a COG (Chip on Glass) method. Moreover, various elements such as a capacitor element and a buffer provided over the printed wiring board 946 prevent a noise in power source voltage or a signal and a rounded rise of a signal.

Figure 21B:
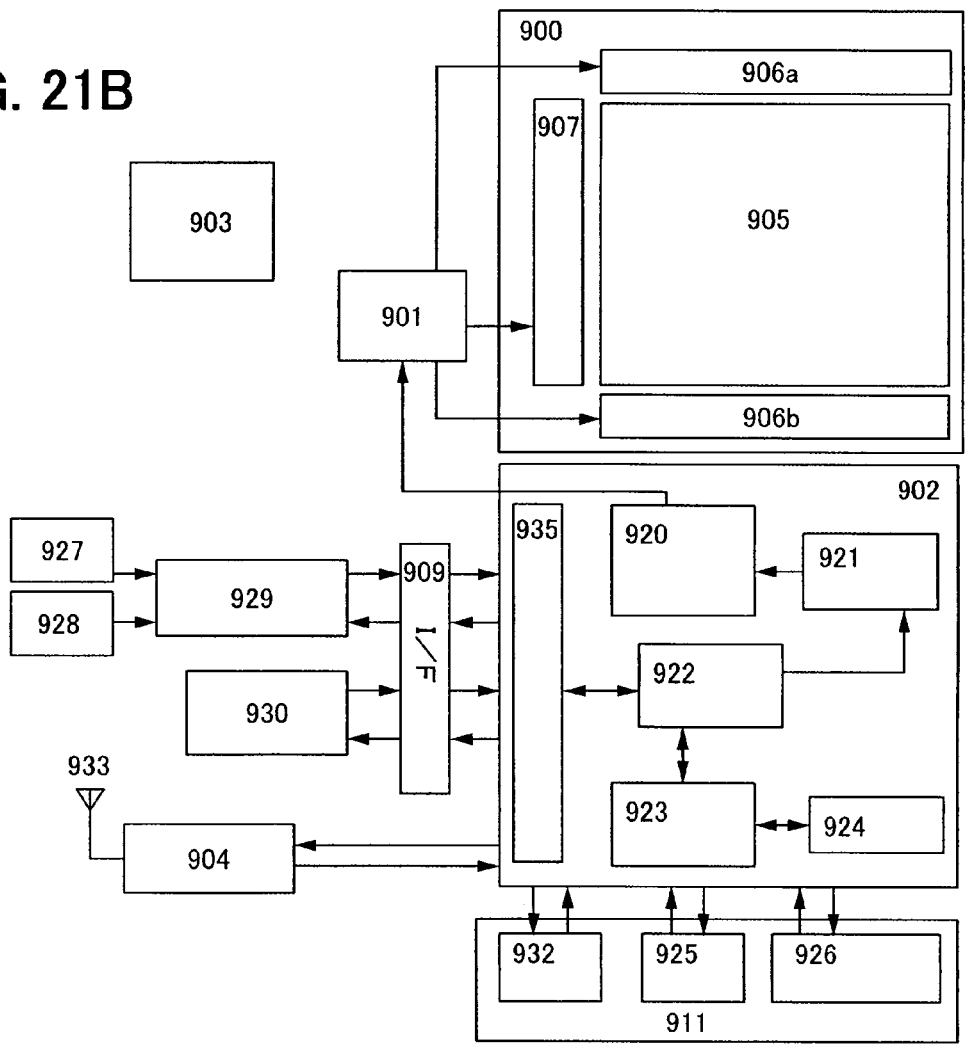

FIG. 21B is a block diagram of the module shown in FIG. 21A. A module includes a VRAM 932, a DRAM 925, a flash memory 926, and the like as the memory 911. The VRAM 932 stores image data displayed on the panel, the DRAM 925 stores image data or audio data, and the flash memory stores various programs.

The power source circuit 903 generates power source voltage applied to the panel 900, the controller 901, the CPU 902, the audio processing circuit 929, the memory 911, and the transmission/reception circuit 904. Moreover, depending on the specifications of the panel, a current source is provided in the power source circuit 903 in some cases.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are input to the arithmetic circuit 923, the decoder 921, and the like after once being held in the register 922. The arithmetic circuit 923 operates based on the input signal and specifies an address to send various instructions. On the other hand, a signal input to the decoder 921 is decoded and input to the control signal generating circuit 920. The control signal generating circuit 920 generates a signal including various instructions based on the input signal and sends it to the address specified by the arithmetic circuit 923, which are specifically the memory 911, the transmission/reception circuit 904, the audio processing circuit 929, the controller 901, and the like.

The memory 911, the transmission/reception circuit 904, the audio processing circuit 929, and the controller 901 operate in accordance with respective received instructions. The operations will be briefly explained below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, alternating voltage (AC Cont), and a switching signal L/R and supplies them to the panel 900 based on the power source voltage input from the power source circuit 903 and various signals input from the CPU 902.

In the transmission/reception circuit 904, a signal transmitted and received as an electric wave by the antenna 933 is processed. Specifically, high frequency circuits such as an isolator, a band path filter, a VCO (Voltage Controlled Oscillator), an LPF (Low Pass Filter), coupler, and balan are included. Among the signals transmitted and received by the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode is applicable to any circuit other than high frequency circuits such as an isolator, a band path filter, a VCO (Voltage Controlled Oscillator), an LPF (Low Pass Filter), coupler, and balan.

Embodiment Mode 7

Figure 22:
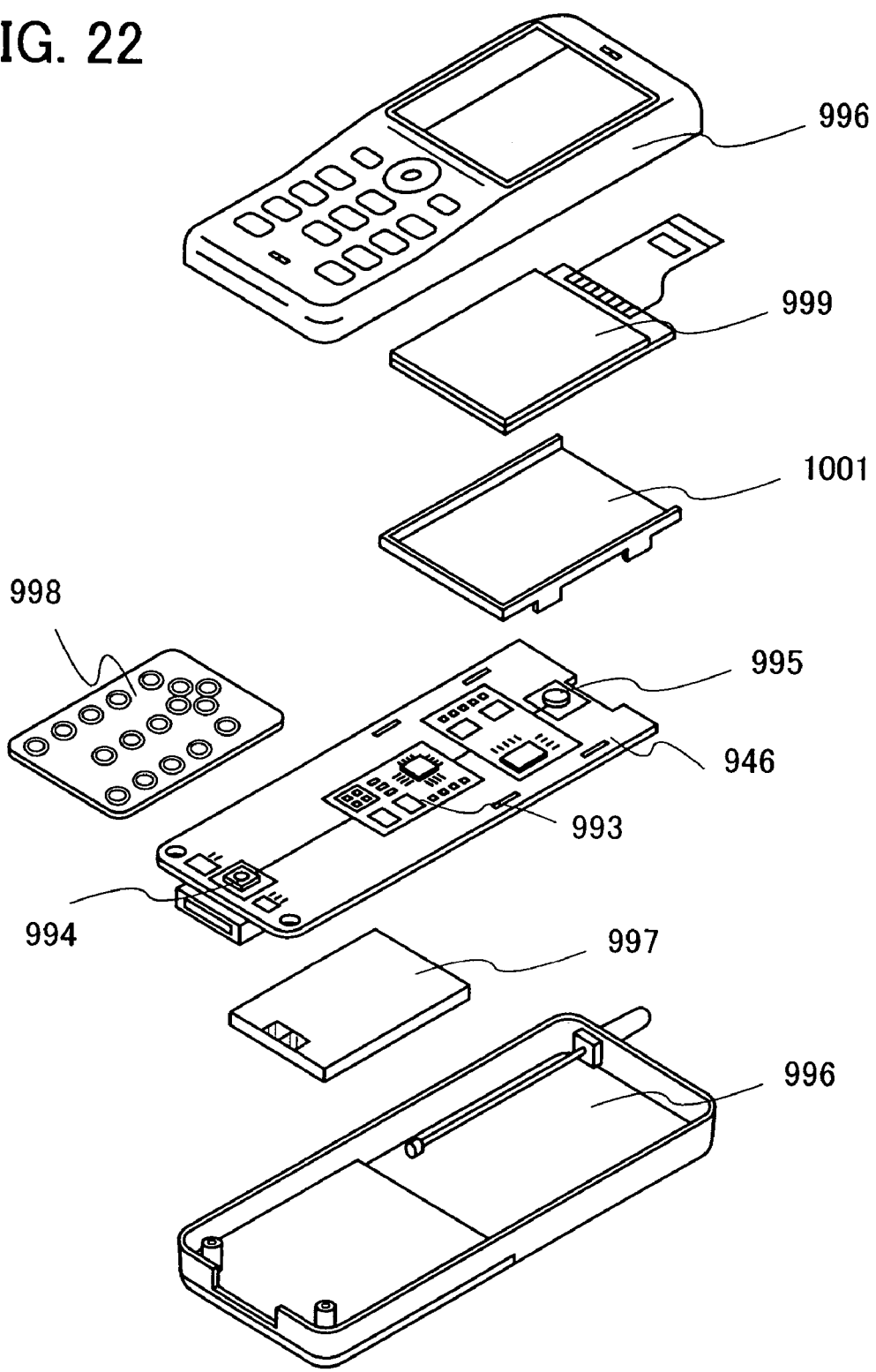
FIG. 22 is a view showing an electronic device to which the present invention is applied.

This embodiment mode will be explained with reference to FIGS. 21A and 21B and 22. FIG. 22 shows one mode of a compact phone (mobile phone) including the module manufactured in Embodiment Mode 6, which operates wirelessly and is portable. A panel 900 is detachably incorporated into a housing 1001 so as to be easily combined with a module 999. The shape and the size of the housing 1001 can be appropriately changed in accordance with an electronic device into which the module is incorporated.

The housing 1001 in which the panel 900 is fixed is fitted to a printed wiring board 946 and set up as a module. A controller, a CPU, a memory, a power source circuit, and other elements such as a resistor, a buffer, and a capacitor element are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through an FPC 908.

The module 999, an input unit (means) 998, and a battery 997 are stored in a housing 996. The pixel portion of the panel 900 is arranged so that it can be seen through a window formed in the housing 996.

The housing 996 shown in FIG. 22 is shown as an example of an exterior shape of a phone. However, an electronic device of this embodiment mode can be changed into various modes in accordance with functions and intended purpose. In the following embodiment mode, examples of the modes will be explained.

Embodiment Mode 8

By applying the present invention, various display devices can be manufactured. In other words, the present invention is applicable to various electronic devices in which the display devices are incorporated into display portions. In this embodiment mode, an example of an electronic device including a highly reliable display device having excellent visibility and a display function of high image quality at high contrast is described.

As an electronic device of the present invention, a television device (also referred to simply as a television or a television receiver), a camera such as a digital camera or a digital video camera, a mobile phone set (also referred to simply as a mobile phone or a cell-phone), a portable information terminal such as a PDA, a portable game machine, a monitor for a computer, a computer, an audio reproducing device such as a car audio system, an image reproducing device provided with a recording medium such as a home game machine (typically, a digital versatile disc (DVD)), and the like can be given. The specific examples will be explained with reference to FIGS. 19A to 19E.

Figure 19A:
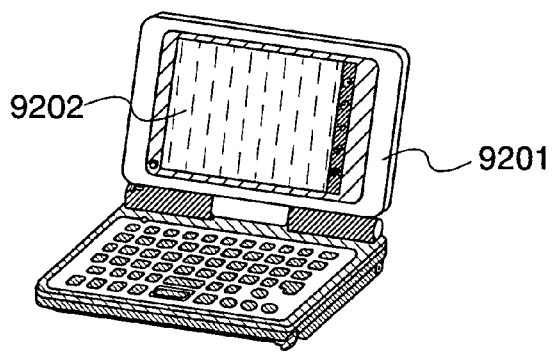
FIGS. 19A to 19E are views each showing an electronic device to which the present invention is applied.

A portable information terminal device shown in FIG. 19A includes a main body 9201, a display portion 9202, and the like. The display device of the present invention is applicable to the display portion 9202. Accordingly, a high-performance portable information terminal device which can display a high-quality image with excellent visibility can be provided.

Figure 19B:
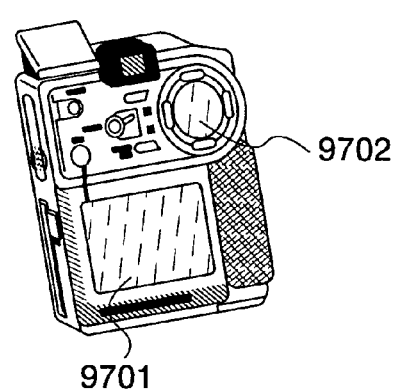

A digital video camera shown in FIG. 19B includes display portions 9701 and 9702, and the like. The display device of the present invention is applicable to the display portion 9701. Accordingly, a high-performance digital video camera which can display a high-quality image with excellent visibility can be provided.

Figure 19C:
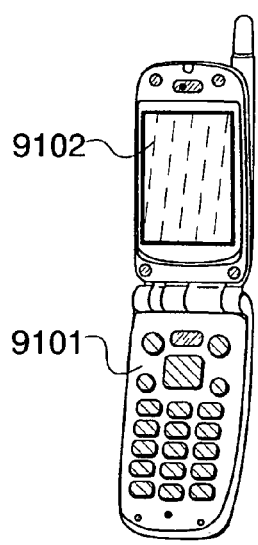

A mobile phone shown in FIG. 19C includes a main body 9101, a display portion 9102, and the like. The display device of the present invention is applicable to the display portion 9102. Accordingly, a high-performance mobile phone which can display a high-quality image with excellent visibility can be provided.

Figure 19D:
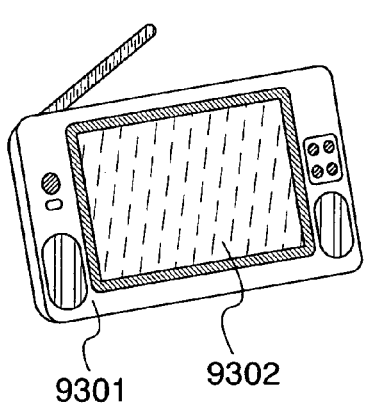

A portable television device shown in FIG. 19D includes a main body 9301, a display portion 9302, and the like. The display device of the present invention is applicable to the display portion 9302. Accordingly, a high-performance portable television device which can display a high-quality image with excellent visibility can be provided. The display device of the present invention is applicable to various types of televisions including a small-sized television incorporated into a portable terminal such as a mobile phone set, a medium-sized television that is portable, and a large-sized television (e.g., 40 inches in size or more).

Figure 19E:
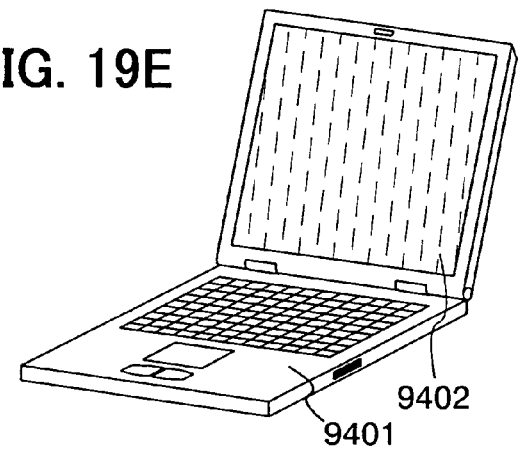

A portable computer shown in FIG. 19E includes a main body 9401, a display portion 9402, and the like. The display device of the present invention is applicable to the display portion 9402. Accordingly, a high-performance portable computer which can display a high-quality image with excellent visibility can be provided.

In this manner, by the display device of the present invention, a high-performance electronic device which can display a high-quality image with excellent visibility can be provided.

Embodiment Mode 9

In this embodiment mode, another example of a highly reliable display device having excellent visibility and a display function of high image quality at high contrast, having a light-emitting element, is described. In this embodiment mode, another structure applicable to the light-emitting element in the display device of the present invention is described with reference to FIGS. 24A to 24C and FIGS. 25A to 25C.

Light-emitting elements utilizing electroluminescence are classified according to whether their light-emitting material is an organic compound or an inorganic compound. In general, the former are referred to as organic EL elements, while the latter are referred to as inorganic EL elements.

An inorganic EL element is classified as either a dispersion type inorganic EL element or a thin-film type inorganic EL element, depending on its element structure. These elements differ in that the former have an electroluminescent layer in which particles of a light-emitting material are dispersed in a binder, whereas the latter have an electroluminescent layer formed of a thin film of a light-emitting material. However, the former and the latter have in common in that they need electrons accelerated by a high electric field. Mechanisms for obtained light emission are donor-acceptor recombination light emission, which utilizes a donor level and an acceptor level, and localized light emission, which utilizes inner-shell electron transition of a metal ion. In general, in many cases, donor-acceptor recombination light emission is employed in dispersion type inorganic EL elements and localized light emission is employed in thin-film type inorganic EL elements.

A light-emitting material that can be used in the present invention includes a matrix material and an impurity element that serves as a light emission center. Light emission of various colors can be obtained by changing the impurity element included. The light-emitting material can be manufactured using various methods, such as a solid phase method or a liquid phase method (a coprecipitation method). Further, a liquid phase method, such as a spray pyrolysis method, a double decomposition method, a method which employs a pyrolytic reaction of a precursor, a reverse micelle method, a method in which one or more of the above methods are combined with high-temperature baking, a freeze-drying method, or the like can be used.

A solid phase method is a method in which a base material and an impurity element or a compound containing an impurity element are weighed, mixed in a mortar, and reacted by being heated and baked in an electric furnace, so that the impurity element is included in the base material. The baking temperature is preferably 700 to 1500° C. This is because a solid-phase reaction does not proceed when the temperature is too low, and the base material decomposes when the temperature is too high. The materials may be baked in powdered form; however, it is preferable to bake the materials in pellet form. A solid phase method needs a comparatively high temperature but is a simple method, and thus has high productivity and is suitable for mass production.

A liquid phase method (a coprecipitation method) is a method in which a base material or a compound containing a base material, and an impurity element or a compound containing an impurity element are reacted in a solution, dried, and then baked. The particles of the light-emitting material are distributed uniformly, and the reaction can progress even if the particles are small and a baking temperature is low.

As the base material to be used for the light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Alternatively, zinc selenide (ZnSe), zinc telluride (ZnTe), or the like; or a ternary mixed crystal such as calcium gallium sulfide ($CaGa_2S_4$), strontium gallium sulfide ($SrGa_2S_4$), or barium gallium sulfide ($BaGa_2S_4$) may be used.

As a light emission center for localized light emission, manganese (Mn), copper (Cu), samarium (Sm), terbium (Tb), erbium (Er), thulium (Tm), europium (Eu), cerium (Ce), praseodymium (Pr), or the like can be used. Further, a halogen element such as fluorine (F) or chlorine (Cl) may be added. The halogen element can serve as a charge compensation.

On the other hand, as a light emission center for donor-acceptor recombination light emission, a light-emitting material containing a first impurity element for forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In a case where the light-emitting material for donor-acceptor recombination light emission is synthesized using a solid phase method, a base material, the first impurity element or a compound containing the first impurity element, and the second impurity element or a compound containing the second impurity element are weighed, mixed in a mortar, and heated and baked in an electric furnace. As the base material, the foregoing base materials can be used. As the first impurity element or the compound containing the first impurity element, fluorine (F), chlorine (Cl), aluminum sulfide ($Al_2S_3$) or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because a solid-phase reaction does not proceed when the temperature is too low, and the base material decomposes when the temperature is too high. Baking may be conducted with the materials in powdered form; however, it is preferable to conduct baking with the materials in pellet form.

As the impurity element for the solid phase reaction, a compound containing the first impurity element and the second impurity element may also be used. In that case, the impurity elements are easily diffused and the solid phase reaction proceeds readily. Therefore, a uniform light-emitting material can be obtained. In addition, a high purity light-emitting material can be obtained, since an unnecessary impurity element is not included therein. As the compound containing the first impurity element and the second impurity element, for example, copper chloride (CuCl), silver chloride (AgCl), or the like can be used.

Note that the concentration of these impurity elements may be 0.01 to 10 atomic %, and is preferably in a range of 0.05 to 5 atomic %, with respect to the base material.

In a case of a thin-film type inorganic EL element, an electroluminescent layer is a layer containing the foregoing light-emitting material, and can be formed using a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like can be used.

Figure 24A:
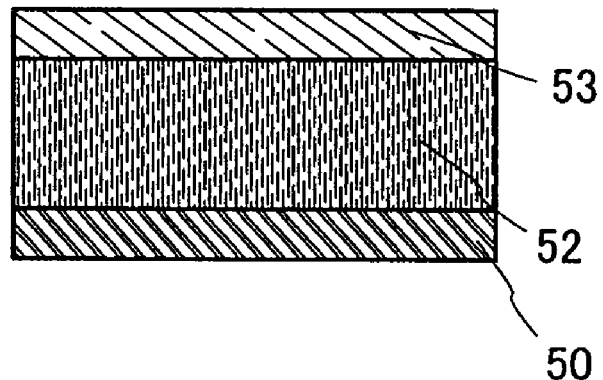
FIGS. 24A to 24C are views each illustrating a structure of a light-emitting element applicable to the present invention.
Figure 24B:
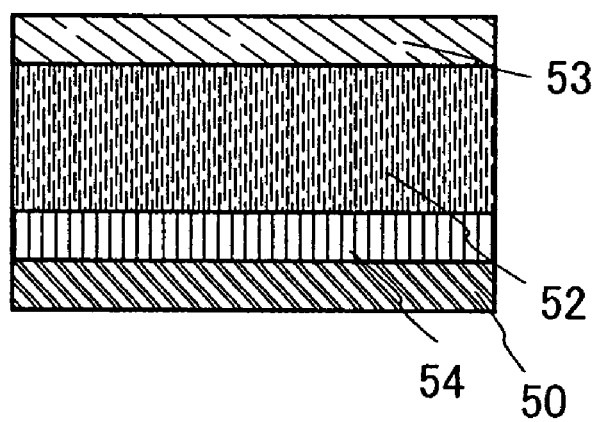
Figure 24C:
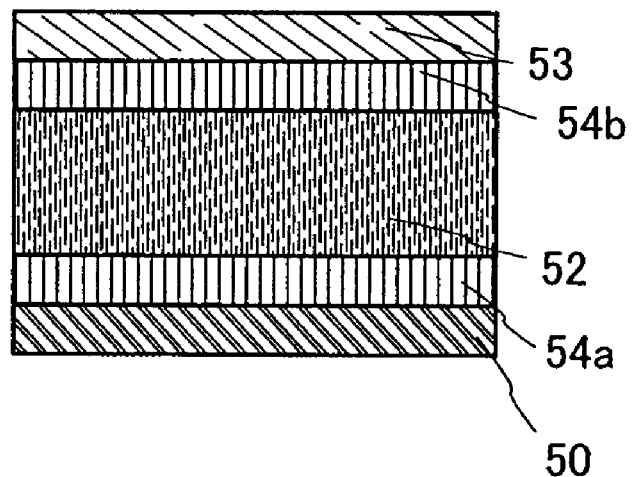

FIGS. 24A to 24C each show an example of a thin-film type inorganic EL element which can be used as the light-emitting element. In FIGS. 24A to 24C, the light-emitting element includes a first electrode layer 50, an electroluminescent layer 52, and a second electrode layer 53.

FIGS. 24B and 24C each show a structure in which an insulating layer is provided between the electrode layer and the electroluminescent layer in the light-emitting element shown in FIG. 24A. The light-emitting element shown in FIG. 24B includes an insulating layer 54 between the first electrode layer 50 and the electroluminescent layer 52. The light-emitting element shown in FIG. 24C includes an insulating layer 54a between the first electrode layer 50 and the electroluminescent layer 52, and an insulating layer 54b between the second electrode layer 53 and the electroluminescent layer 52. Thus, the insulating layer may be provided between the electroluminescent layer and one of the electrode layers interposing the electroluminescent layer, or may be provided between the electroluminescent layer and each of the electrode layers interposing the electroluminescent layer. In addition, the insulating layer may be a single layer or a stack including a plurality of layers.

Note that although the insulating layer 54 is provided in contact with the first electrode layer 50 in FIG. 24B, the insulating layer 54 may be provided in contact with the second electrode layer 53 by reversing the positions of the insulating layer and the electroluminescent layer.

In a case of a dispersion type inorganic EL, a film-shaped electroluminescent layer is formed by dispersing particles of a light-emitting material in a binder. In the case that a desired size of particle cannot be sufficiently obtained by a method for manufacturing the light-emitting material, the light-emitting materials may be processed into particles by being crushed in a mortar or the like. The binder is a substance for fixing dispersed particles of a light-emitting material in place and maintaining the shape of an electroluminescent layer. The light-emitting material is dispersed evenly through the electroluminescent layer and fixed by the binder.

In a case of a dispersion type inorganic EL, a method for forming the electroluminescent layer can be a droplet discharging method by which the electroluminescent layer can be selectively formed, a printing method (screen printing, offset printing, or the like), a coating method such as a spin coat method or the like, a dipping method, a dispenser method, or the like. There is no particular limitation on a thickness of a film, but preferably it is in a range of 10 to 1000 nm. In addition, in the electroluminescent layer containing the light-emitting material and the binder, the weight percent of the light-emitting material is preferably greater than or equal to 50 wt % and less than or equal to 80 wt %.

Figure 25A:
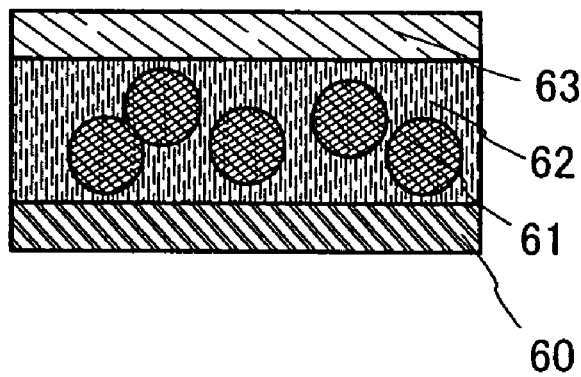
FIGS. 25A to 25C are views each illustrating a structure of a light-emitting element applicable to the present invention.
Figure 25B:
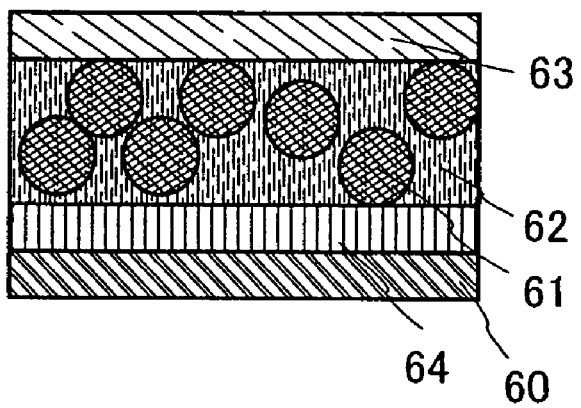
Figure 25C:
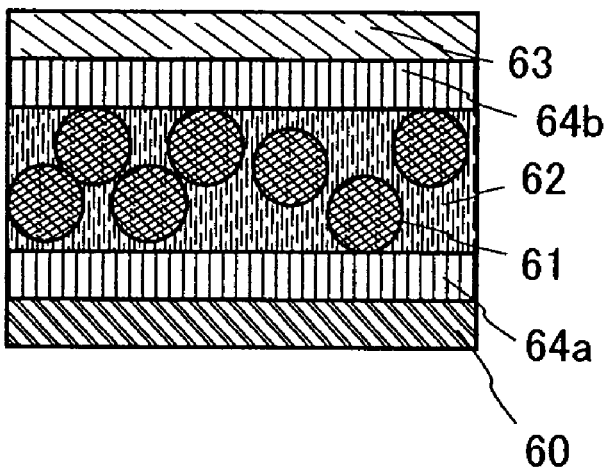

FIGS. 25A to 25C each show an example of a dispersion type inorganic EL element which can be used as the light-emitting element. A light-emitting element shown in FIG. 25A has a stacked structure including a first electrode layer 60, an electroluminescent layer 62, and a second electrode layer 63. The electroluminescent layer 62 contains a light-emitting material 61 held by a binder.

As a binder that can be used in this embodiment mode, an insulating material can be used. The binder may be an organic material or an inorganic material, or a mixed material containing an organic material and an inorganic material. As an organic insulating material, a polymer having comparatively high dielectric constant such as a cyanoethyl cellulose based resin or the like, or a resin such as polyethylene, polypropylene, a polystyrene based resin, a silicone resin, an epoxy resin, vinylidene fluoride, or the like can be used. Alternatively, a heat-resistant high molecular material such as aromatic polyamide or polybenzimidazole, or a siloxane resin may be used. Note that a siloxane resin corresponds to a resin including a Si—O—Si bond. Siloxane has a skeleton structure having a bond of silicon (Si) and oxygen (O), and as a substituent, an organic group having at least hydrogen (such as an alkyl group or an aromatic hydrocarbon) is used. Alternatively, a fluoro group may be used as a substituent or both a fluoro group and an organic group containing at least hydrogen may be used. Further, a resin material such as a vinyl resin such as polyvinyl alcohol or polyvinylbutyral, a phenol resin, a novolac resin, an acrylic resin, a melamine resin, an urethane resin, an oxazole resin (e.g., polybenzoxazole), may be used. Fine particles having a high dielectric constant, such as particles of barium titanate ($BaTiO_3$) or strontium titanate ($SrTiO_3$) can also be mixed with these resins moderately to adjust the dielectric constant.

The inorganic insulating material contained in the binder can be formed using silicon oxide ($SiO_x$), silicon nitride ($SiN_x$), silicon containing oxygen and nitrogen, aluminum nitride (AlN), aluminum or aluminum oxide ($Al_2O_3$) containing oxygen and nitrogen, titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or another material containing an inorganic material. When an inorganic material having a high dielectric constant is included in the organic material (by addition or the like), the dielectric constant of the electroluminescent layer formed using the light-emitting material and the binder can be more effectively controlled, and can be made even higher.

In a manufacturing process, the light-emitting materials are dispersed in a solution containing the binder. As a solvent for a solution containing the binder which can be used in this embodiment mode, a solvent in which a binder material can be dissolved and which can form a solution having a viscosity suitable for a method for forming the electroluminescent layer (various wet processes) with a desired thickness may be appropriately selected. An organic solvent or the like can be used. In a case of using a siloxane resin as a binder, for example, propylene glycol monomethyl ether, propylene glycol monomethyl ether acetate (also referred to as PGMEA), 3-methoxy-3-methyl-1-butanol (also referred to as MMB), or the like can be used.

Light-emitting elements shown in FIGS. 25B and 25C each have a structure in which an insulating layer is provided between the electrode layer and the electroluminescent layer in the light-emitting element shown in FIG. 25A. The light-emitting element shown in FIG. 25B includes an insulating layer 64 between the first electrode layer 60 and the electroluminescent layer 62. The light-emitting element shown in FIG. 25C includes an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers interposing the electroluminescent layer, or may be provided between the electroluminescent layer and each of the electrode layers interposing the electroluminescent layer. In addition, the insulating layer may be a single layer or a stack including a plurality of layers.

Note that although the insulating layer 64 is provided in contact with the first electrode layer 60 in FIG. 25B, the insulating layer 64 may be provided in contact with the second electrode layer 63 by reversing the positions of the insulating layer and the electroluminescent layer.

There is no particular limitation on the insulating layer 54 in FIGS. 24A to 24C and the insulating layer 64 in FIGS. 25A to 25C, but they preferably have high withstand voltage and are dense films. Further, the insulating layer preferably has high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like can be used. Alternatively, a mixed film of those materials or a stacked film including two or more of those materials can be used. An insulating film of those materials can be formed by sputtering, evaporation, CVD, or the like. Alternatively, the insulating layer may be formed by dispersing particles of these insulating materials in a binder. A binder material may be formed using a material similar to that of a binder contained in an electroluminescent layer and formed by a method similar thereto. There is no particular limitation on the film thickness, but preferably it is in a range of 10 to 1000 nm.

The light-emitting element of this embodiment mode can emit light when voltage is applied between the pair of electrode layers interposing the electroluminescent layer. The light-emitting element of this embodiment mode can operate with any of direct current driving and alternate current driving.

This embodiment mode can be freely combined with the embodiment modes described above.

By using the present invention, a highly reliable display device having excellent visibility and a display function of high image quality can be provided. Further, such a display device can be manufactured with high reliability, without requiring a complicated step.

Embodiment 1

In this embodiment, a p-channel thin film transistor in which cutoff current is reduced, which is shown in the present invention, is manufactured, and a result of measuring the characteristic thereof is shown.

As a comparative example, a p-channel thin film transistor in which a channel region thereof is doped with an impurity element imparting p-type conductivity (hereinafter, referred to as a comparative example) was manufactured. The concentration of the p-type impurity element contained in the channel region of the comparative example is $1 \times 10^{17}/cm^3$. Meanwhile, as the embodiment, a p-channel thin film transistor in which a channel region thereof is not doped with an impurity element imparting p-type conductivity (hereinafter, referred to as an embodiment 1) was manufactured. In the comparative example and embodiment 1, a value of gate voltage VG with respect to a value of drain current ID at −1 V and −16V of a value of drain voltage VD was measured.

Figure 26:
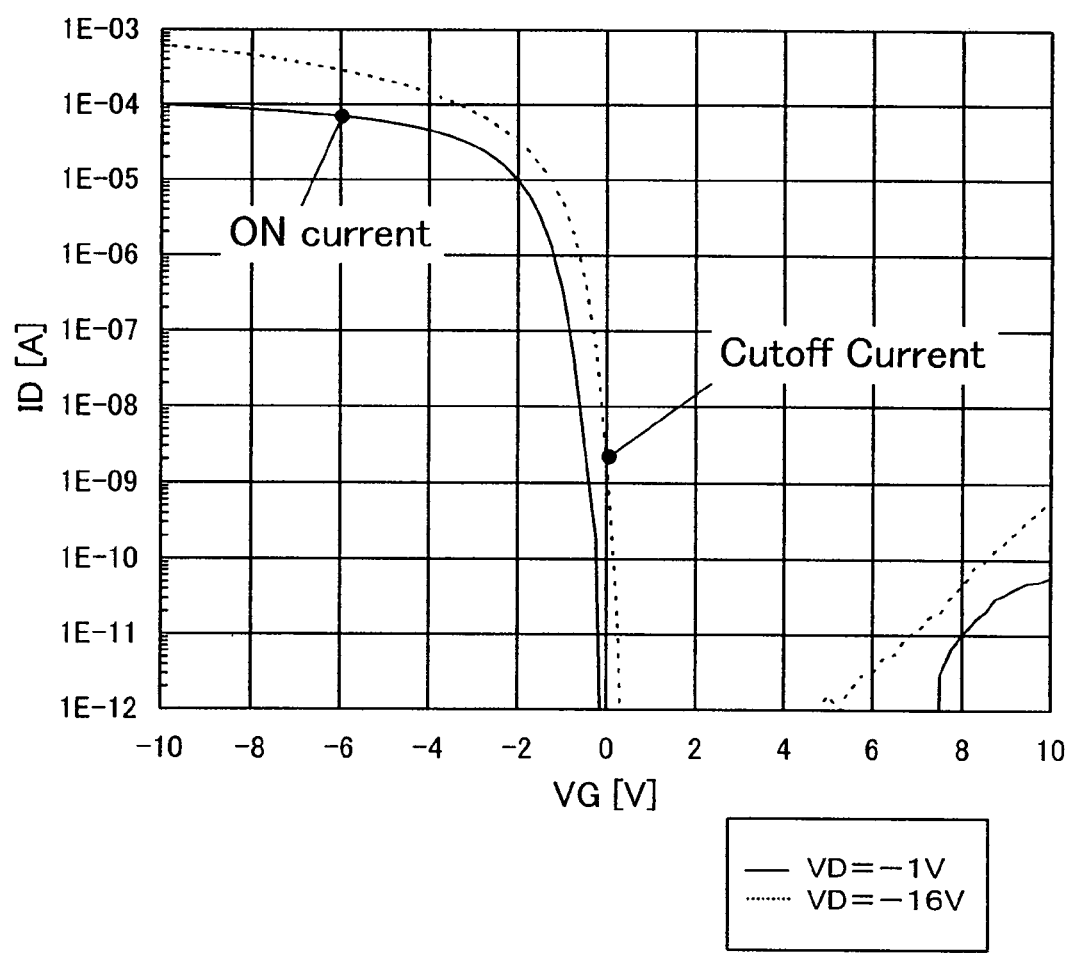
FIG. 26 is a graph showing characteristics of a thin film transistor of a comparative example.
Figure 27:
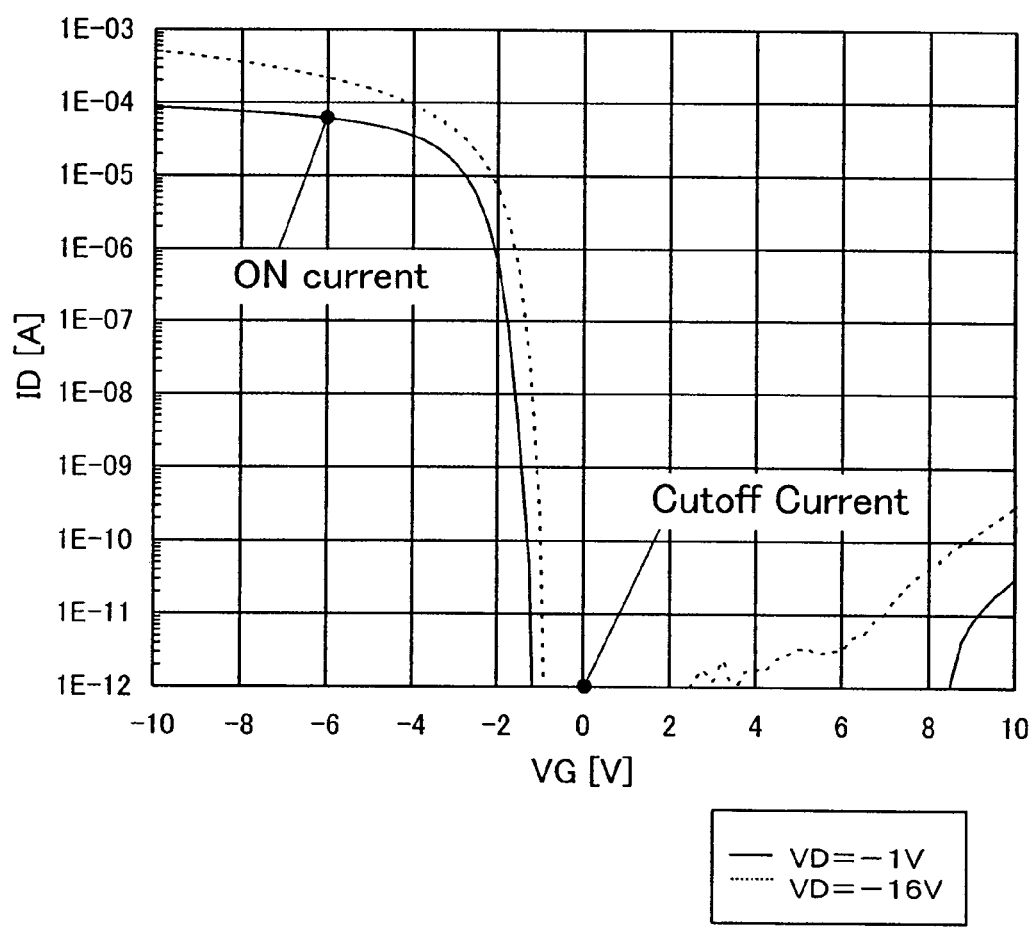
FIG. 27 is a graph showing characteristics of a thin film transistor of an embodiment 1.
Figure 28:
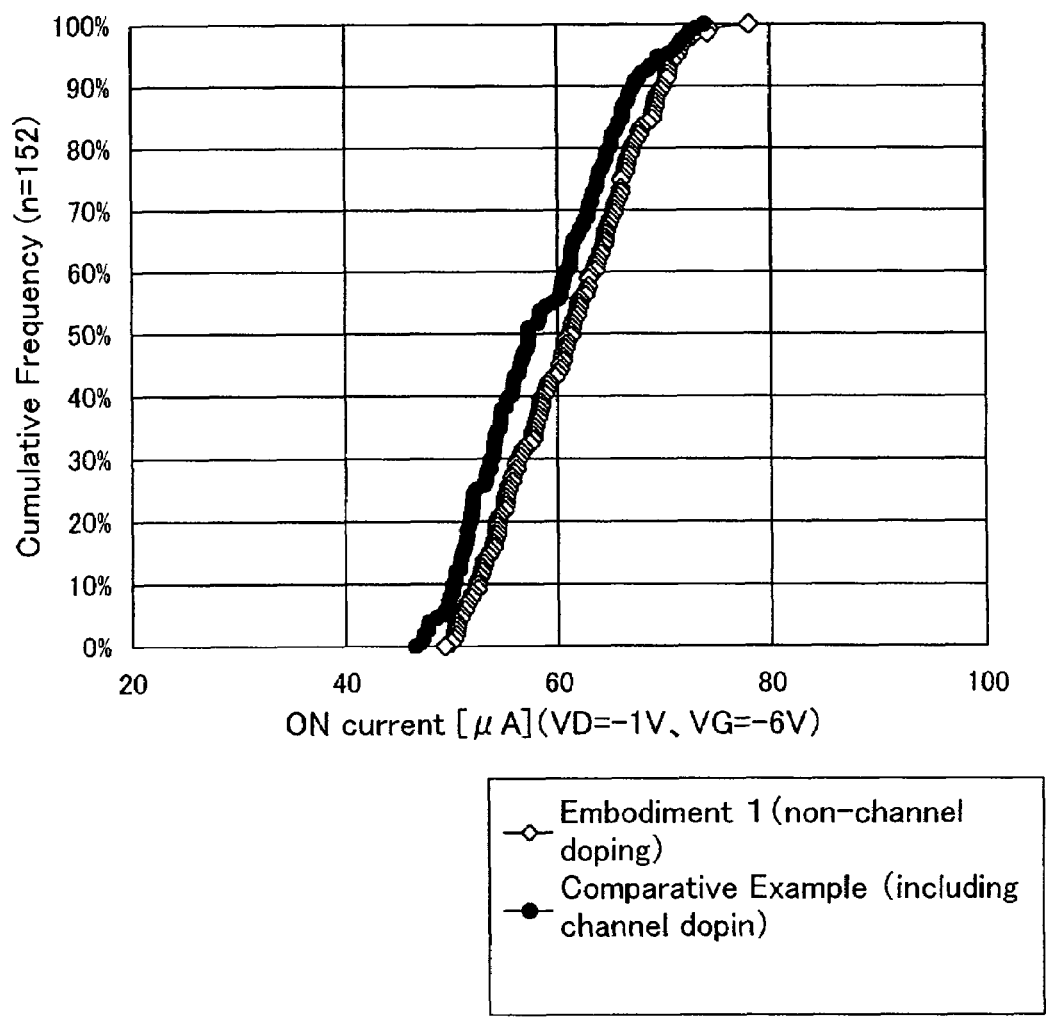
FIG. 28 is a graph showing characteristics of thin film transistors of a comparative example and an embodiment 1.
Figure 29:
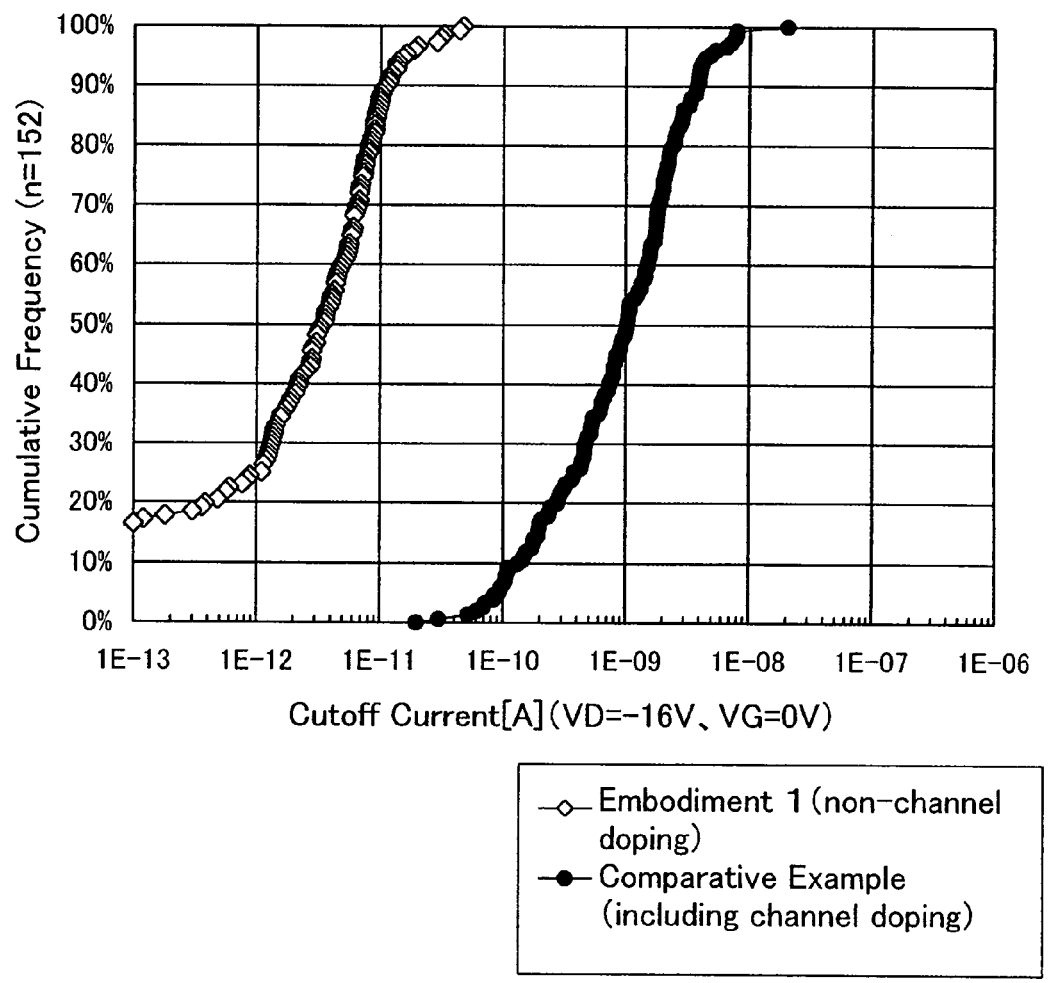
FIG. 29 is a graph showing characteristics of thin film transistors of a comparative example and an embodiment 1.

FIG. 26 shows ID-VG characteristics of the comparative example, and FIG. 27 shows ID-VG characteristics of the embodiment 1. The measurement was performed at 152 points in each of the comparative example and embodiment 1, and FIG. 28 shows the result of a value of ON current (VD=−1 V, VG=−6V) and FIG. 29 shows the result of a value of cutoff current (VD=−16 V, VG=0V), each shown by cumulative frequency of the comparative example and the embodiment 1. In each of FIGS. 26 and 27, an ID-VG characteristic represented by a dotted line shows a measurement condition of VD=−16 V, while an ID-VG characteristic represented by a solid line show a measurement condition of VD=−1 V. In each of FIGS. 28 and 29, dots of a black circular shape show the comparative example (channel doping is performed); while dots of a white diamond shape show the embodiment 1 (channel doping is not performed).

Between the comparative example shown in FIG. 26 and the embodiment 1 shown in FIG. 27, though there was no difference in a value of ON current, there was a difference in a value of cutoff current (Icut). As shown in FIG. 26, a value of cutoff current, which was a value of a drain current ID at gate voltage VG=0, was greater than or equal to $1 \times 10^{-9}$ A in the comparative example. However, as shown in FIG. 27, a value of cutoff current was less than or equal to $1 \times 10^{-12}$ A in the embodiment 1. On the other hand, a value of ON current was in the vicinity of approximately $1 \times 10^{-4}$ A in both of the comparative example 1 and the embodiment 1.

Accordingly, it was confirmed that a value of cutoff current was lowered in the embodiment 1 that is a thin film transistor in which an impurity element imparting p-type conductivity was not added to a channel formation region, compared with the comparative example that is a thin film transistor in which an impurity element imparting p-type conductivity was added to a channel formation region, though the comparative example and the embodiment 1 showed the same degree of a value of ON current showing an ON characteristic. Also in FIG. 28, values of ON currents are similar to each other at almost all cumulative frequency in the comparative example and the embodiment 1. On the other hand, also in FIG. 29, a value of cutoff current in the embodiment is shifted toward a lower value at all cumulative frequency compared with the comparative example.

From these results, a threshold of the p-channel thin film transistor, on which channel doping is not performed and the concentration of the impurity element is made low, is lower (is on the minus side more so) than that of the p-channel thin film transistor on which channel doping is performed. Accordingly, it was confirmed that a value of cutoff current (Icut), which is a value of a drain current ID flowing when gate voltage VG is 0 V, became low. Thus, in a case where the light-emitting element is made in a non-light emission state and black display is performed, faint light emission caused by current flowing in a light-emitting element connected to a driving p-channel thin film transistor can be prevented.

Further, in the driving p-channel thin film transistor in which channel doping is not performed in order to make the concentration of the impurity element low, crystallinity of the semiconductor film in the channel region is not lowered because doping is not performed. Accordingly, a value of ON current ($I_{on}$) of the thin film transistor is not lowered, and there is no influence on an ON characteristic of the thin film transistor. From the above, by using the driving p-channel thin film transistor of a light-emitting element in which cutoff current is more reduced than in a p-channel thin film transistor of a driver circuit, contrast of a pixel is improved and a display device with excellent visibility can be obtained.

By using the present invention, a highly reliable display device having excellent visibility and a display function of high image quality can be provided. Further, such a display device can be manufactured with high reliability, without requiring a complicated step.

This application is based on Japanese Patent Application serial No. 2006-179165 filed in Japan Patent Office on Jun. 29, 2006, the entire contents of which are hereby incorporated by reference.

What is claimed is:

1. A display device comprising:
   a pixel comprising a p-channel thin film transistor, an n-channel thin film transistor, and a light-emitting element,
   wherein one of a source and a drain of the p-channel thin film transistor is electrically connected to the light-emitting element, and
   wherein a concentration of an impurity element imparting p-type conductivity included in a channel region of the p-channel thin film transistor is lower than a concentration of an impurity element imparting p-type conductivity included in a channel region of the n-channel thin film transistor.

2. The display device according to claim 1, wherein the impurity element imparting p-type conductivity is boron.

3. An electronic device having the display device according to claim 1,
   wherein the electronic device is selected from the group consisting of a portable information terminal device, a digital video camera, a mobile phone, a portable television device, a portable computer, and a television device.

4. The display device according to claim 1,
   wherein a threshold voltage of the p-channel thin film transistor is less than or equal to −1.1 V.

5. A display device comprising:
   a pixel comprising a p-channel thin film transistor, an n-channel thin film transistor, a capacitor element, and a light-emitting element,
   wherein one of a source and a drain of the p-channel thin film transistor is electrically connected to the light-emitting element, and
   wherein a concentration of an impurity element imparting p-type conductivity included in a channel region of the p-channel thin film transistor is lower than a concentration of an impurity element imparting p-type conductivity included in a channel region of the n-channel thin film transistor and the capacitor element.

6. The display device according to claim 5, wherein a threshold voltage of the p-channel thin film transistor is less than or equal to −1.1 V.

7. The display device according to claim 5, wherein the impurity element imparting p-type conductivity is boron.

8. An electronic device having the display device according to claim 5,
   wherein the electronic device is selected from the group consisting of a portable information terminal device, a digital video camera, a mobile phone, a portable television device, a portable computer, and a television device.

* * * * *